(12) United States Patent
Quddus et al.

(10) Patent No.: US 10,608,122 B2
(45) Date of Patent: Mar. 31, 2020

(54) SCHOTTKY DEVICE AND METHOD OF MANUFACTURE

(71) Applicant: SEMICONDUCTOR COMPONENTS INDUSTRIES, LLC, Phoenix, AZ (US)

(72) Inventors: Mohammed Tanvir Quddus, Chandler, AZ (US); Mihir Mudholkar, Tempe, AZ (US); Jefferson W. Hall, Chandler, AZ (US)

(73) Assignee: SEMICONDUTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/919,475

(22) Filed: Mar. 13, 2018

(65) Prior Publication Data
US 2019/0288125 A1  Sep. 19, 2019

(51) Int. Cl.
*H01L 29/72* (2006.01)
*H01L 27/02* (2006.01)
*H01L 27/07* (2006.01)
*H01L 27/095* (2006.01)
*H01L 29/66* (2006.01)
(Continued)

(52) U.S. Cl.
CPC ...... *H01L 29/8725* (2013.01); *H01L 27/0255* (2013.01); *H01L 27/0727* (2013.01); *H01L 27/095* (2013.01); *H01L 29/0619* (2013.01); *H01L 29/0692* (2013.01); *H01L 29/47* (2013.01); *H01L 29/66143* (2013.01)

(58) Field of Classification Search
CPC ............... H01L 29/872; H01L 29/8725; H01L 29/66143
See application file for complete search history.

(56) References Cited

U.S. PATENT DOCUMENTS 4,982,260 A * 1/1991 Chang ................... H01L 29/861
257/476
5,365,102 A  11/1994 Mehrotra et al.
(Continued)

OTHER PUBLICATIONS

Wesley Chih-Wei Hsu, Florin Udrea, Pai-Li Lin, Yih-Yin Lin, Max Chen, Innovative Designs Enable 300-V TMBS with Ultra-low On-state Voltage and Fast Switching Speed, Proceedings of the 23rd International Symposium on Power Semiconductor Devices & IC's, May 23-26, 2011, pp. 80-83, IEEE, San Diego, CA.

(Continued)

*Primary Examiner* — Victoria K. Hall
(74) *Attorney, Agent, or Firm* — Rennie William Dover

(57) ABSTRACT

A Schottky device includes a plurality of mesa structures where one or more of the mesa structures includes a doped region having a multi-concentration dopant profile. In accordance with an embodiment, the Schottky device is formed from a semiconductor material of a first conductivity type. Trenches having sidewalls and floors are formed in the semiconductor material to form a plurality of mesa structures. A doped region having a multi-concentration impurity profile is formed in at least one trench, where the impurity materials of the doped region having the multi-concentration impurity profile are of a second conductivity type. A Schottky contact is formed to at least one of the mesa structures having the doped region with the multi-concentration impurity profile.

20 Claims, 44 Drawing Sheets

(51) Int. Cl.
   *H01L 29/872* (2006.01)
   *H01L 29/06* (2006.01)
   *H01L 29/47* (2006.01)

(56) References Cited

U.S. PATENT DOCUMENTS

| | | | |
|---|---|---|---|
| 5,612,567 A | 3/1997 | Baliga | |
| 6,049,108 A | 4/2000 | Williams et al. | |
| 6,078,090 A | 6/2000 | Williams et al. | |
| 6,184,563 B1 | 2/2001 | Yu | |
| 6,501,146 B1* | 12/2002 | Harada | H01L 29/66136 |
| | | | 257/475 |
| 6,537,921 B2 | 3/2003 | Metzler | |
| 6,633,071 B1 | 10/2003 | Furio | |
| 7,045,397 B1 | 5/2006 | Yu et al. | |
| 8,766,317 B2 | 7/2014 | Takaishi | |
| 9,496,332 B1* | 11/2016 | Matsushita | H01L 29/0834 |
| 9,716,151 B2* | 7/2017 | Quddus | H01L 29/36 |
| 10,177,232 B2* | 1/2019 | Quddus | H01L 29/36 |
| 10,439,075 B1* | 10/2019 | Quddus | H01L 29/8725 |
| 2003/0047776 A1 | 3/2003 | Hueting et al. | |
| 2007/0145429 A1 | 6/2007 | Francis et al. | |
| 2009/0309181 A1 | 12/2009 | Hsieh | |
| 2010/0059815 A1* | 3/2010 | Grivna | H01L 21/76232 |
| | | | 257/330 |
| 2010/0059849 A1* | 3/2010 | Quddus | H01L 21/28537 |
| | | | 257/476 |
| 2012/0018836 A1* | 1/2012 | Nagai | H01L 29/0619 |
| | | | 257/471 |
| 2012/0098082 A1 | 4/2012 | Hsu et al. | |
| 2012/0168893 A1* | 7/2012 | Liu | H01L 29/66143 |
| | | | 257/471 |
| 2012/0193676 A1 | 8/2012 | Bobde et al. | |
| 2012/0241897 A1 | 9/2012 | Qu et al. | |
| 2012/0256192 A1* | 10/2012 | Zhang | H01L 29/0619 |
| | | | 257/77 |
| 2012/0313212 A1* | 12/2012 | Sugawara | H01L 29/0615 |
| | | | 257/471 |
| 2013/0032809 A1* | 2/2013 | Allen | H01L 29/47 |
| | | | 257/73 |
| 2013/0062620 A1* | 3/2013 | Henning | H01L 29/872 |
| | | | 257/77 |
| 2013/0062723 A1* | 3/2013 | Henning | H01L 29/8611 |
| | | | 257/484 |
| 2013/0207222 A1 | 8/2013 | Qu et al. | |
| 2013/0320487 A1* | 12/2013 | Mauder | H01L 29/861 |
| | | | 257/509 |
| 2014/0048847 A1* | 2/2014 | Yamashita | H01L 29/407 |
| | | | 257/140 |
| 2014/0077287 A1* | 3/2014 | Xu | H01L 29/66356 |
| | | | 257/328 |
| 2014/0084337 A1 | 3/2014 | Matsudai et al. | |
| 2014/0138705 A1* | 5/2014 | Zhang | H01L 29/6606 |
| | | | 257/77 |
| 2014/0217465 A1* | 8/2014 | Soeno | H01L 29/407 |
| | | | 257/140 |
| 2014/0231867 A1* | 8/2014 | Yamashita | H01L 29/872 |
| | | | 257/140 |
| 2014/0239435 A1 | 8/2014 | Qu et al. | |
| 2014/0353678 A1* | 12/2014 | Kawakami | H01L 21/266 |
| | | | 257/76 |
| 2015/0084153 A1* | 3/2015 | Quddus | H01L 29/36 |
| | | | 257/475 |
| 2015/0236172 A1* | 8/2015 | Quddus | H01L 29/66143 |
| | | | 257/471 |
| 2015/0243501 A1* | 8/2015 | Thomason | H01L 21/2855 |
| | | | 438/581 |
| 2015/0325567 A1* | 11/2015 | Grivna | H01L 29/402 |
| | | | 257/328 |
| 2015/0333190 A1* | 11/2015 | Aketa | H01L 29/872 |
| | | | 257/77 |
| 2016/0093748 A1* | 3/2016 | Mieczkowski | H01L 29/0619 |
| | | | 257/77 |
| 2016/0148932 A1* | 5/2016 | Fujita | H01L 27/0921 |
| | | | 257/372 |
| 2016/0181391 A1 | 6/2016 | Bobde et al. | |
| 2016/0254357 A1* | 9/2016 | Aketa | H01L 24/85 |
| | | | 257/77 |
| 2016/0260844 A1* | 9/2016 | Quddus | H01L 29/36 |
| 2016/0260845 A1* | 9/2016 | Quddus | H01L 29/36 |
| 2016/0268252 A1* | 9/2016 | Saito | H01L 29/872 |
| 2017/0200787 A1* | 7/2017 | Shimizu | H01L 29/0619 |
| 2018/0076290 A1* | 3/2018 | Takayanagi | H01L 29/1608 |
| 2018/0294364 A1* | 10/2018 | Pak | H01L 29/872 |
| 2019/0237548 A1* | 8/2019 | Koyama | H01L 21/02529 |

OTHER PUBLICATIONS

Pierret Robert F. and Neudeck, Gerold W., The PN Junction Diode, Modular Series on Solid State Devices, vol. II, Chapter 7/Metal-Seminconductor Contacts, 1989, pp. 127-146.

Sze, S.M. Physics of Semiconductor Devices, Second Edition, 1981, pp. 304-307.

Sze, S.M. and Ng. Kwok K. Physics of Semiconductor Devices, Third Edition, 2007, pp. 162-166, 178-181, and 187-195.

* cited by examiner

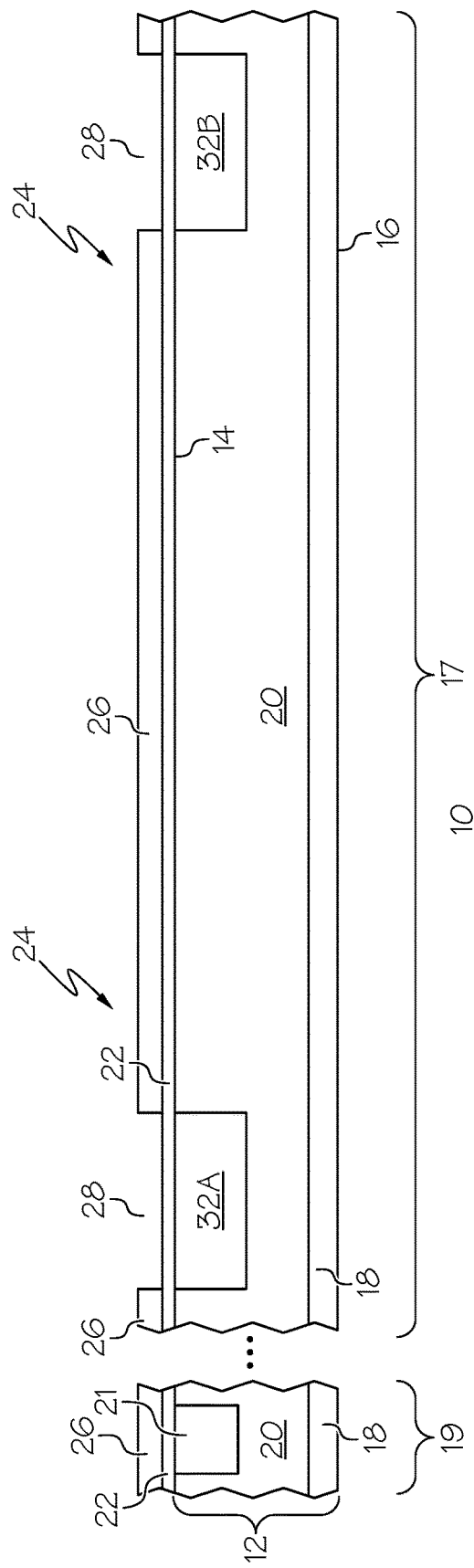
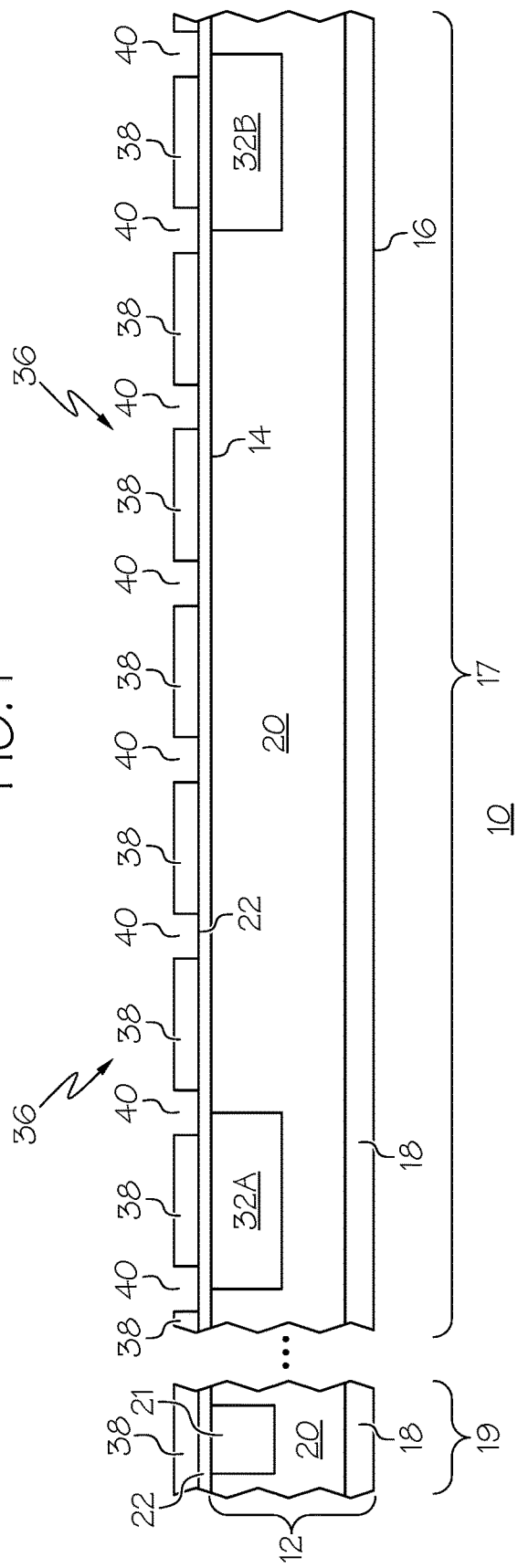

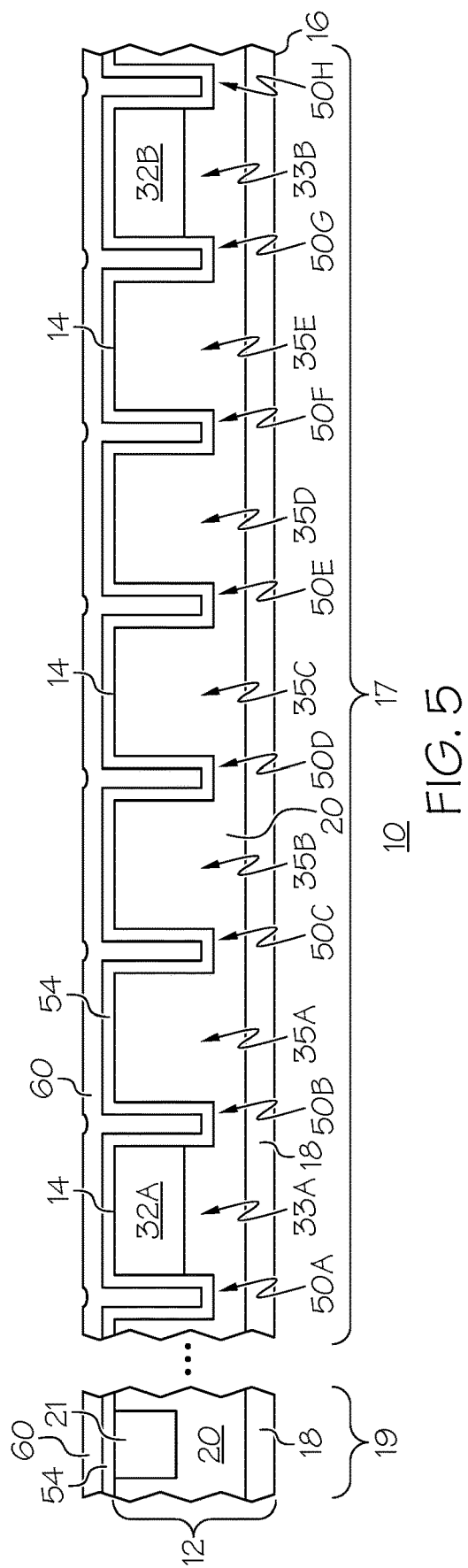
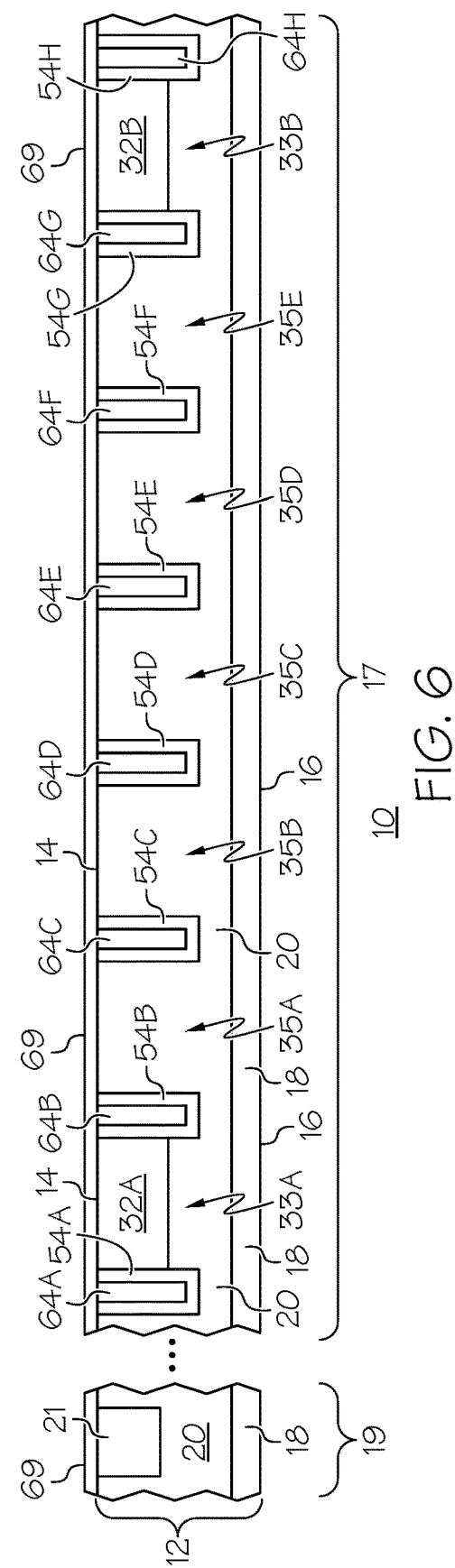

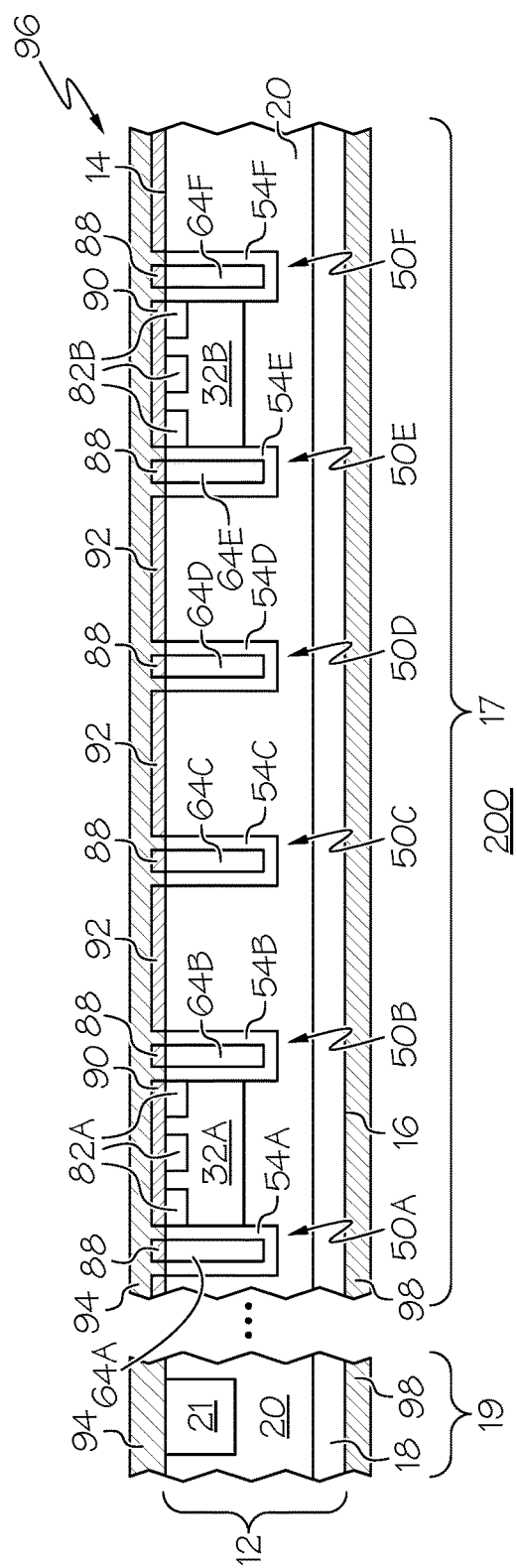
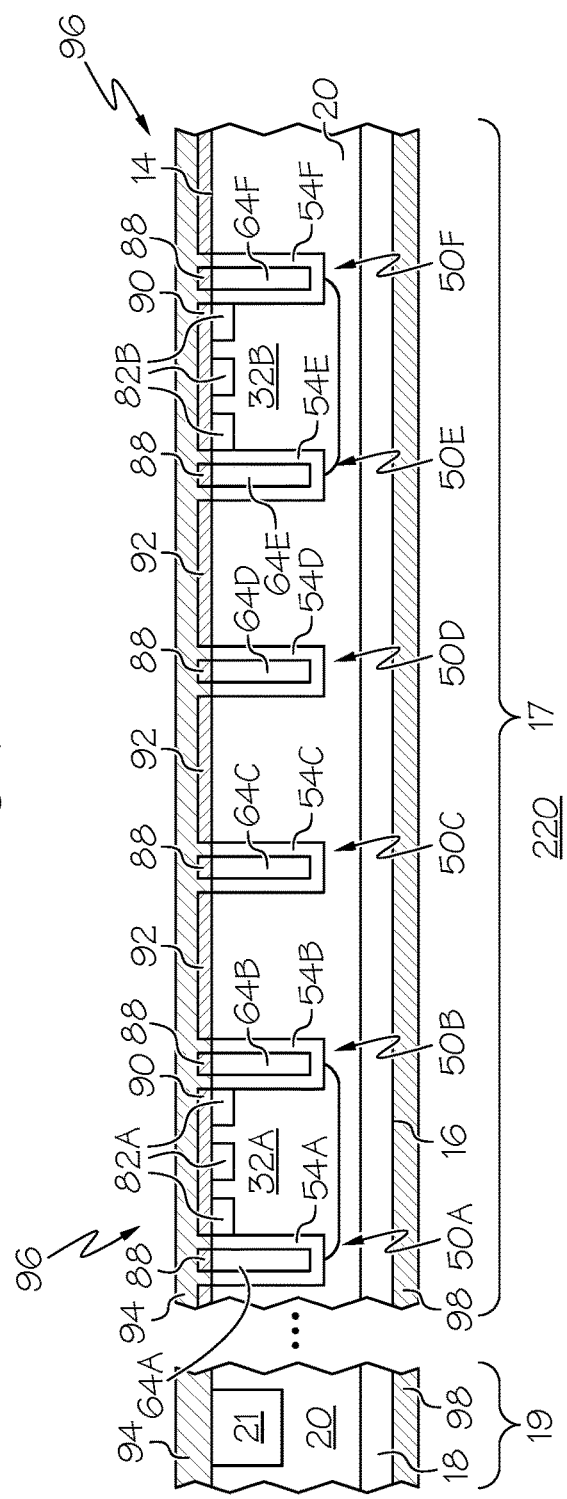
FIG. 24
FIG. 25

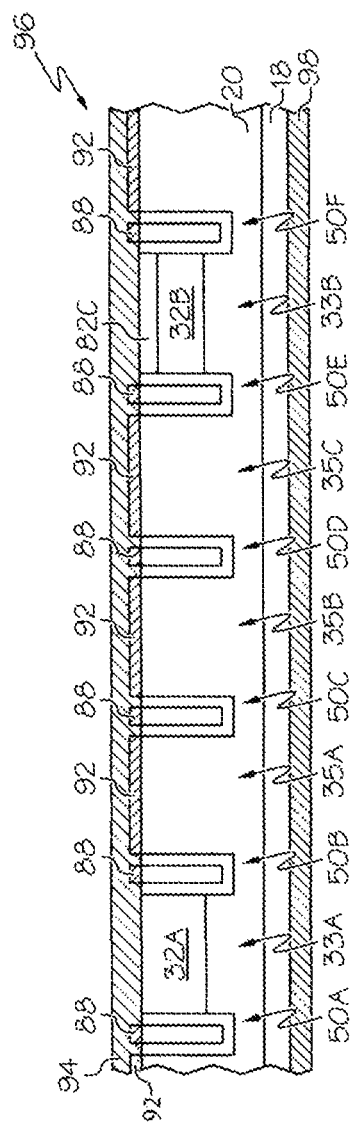
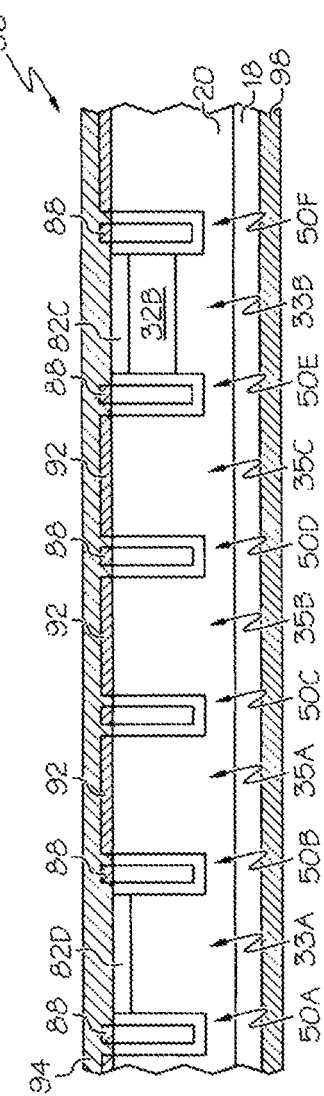

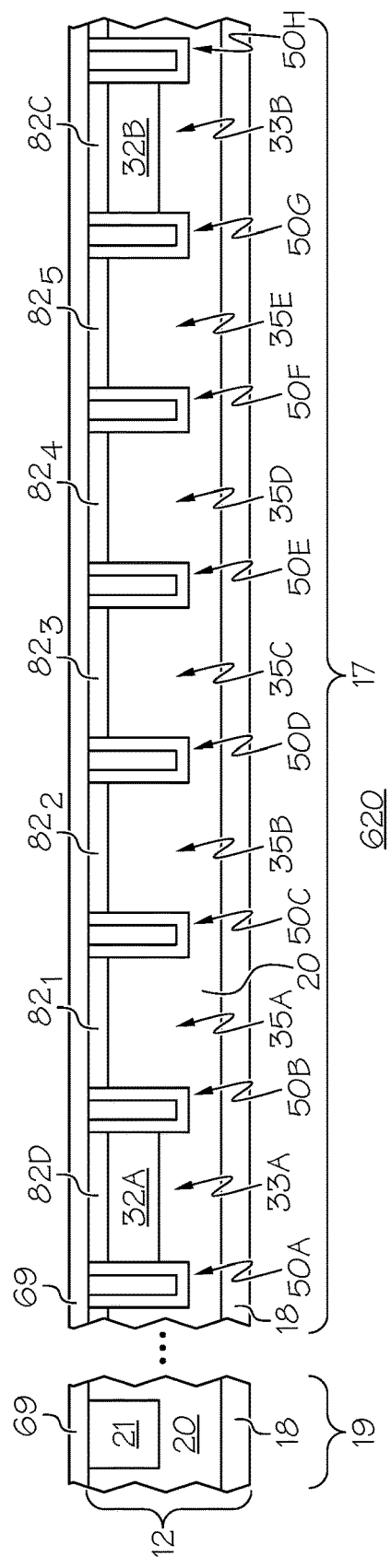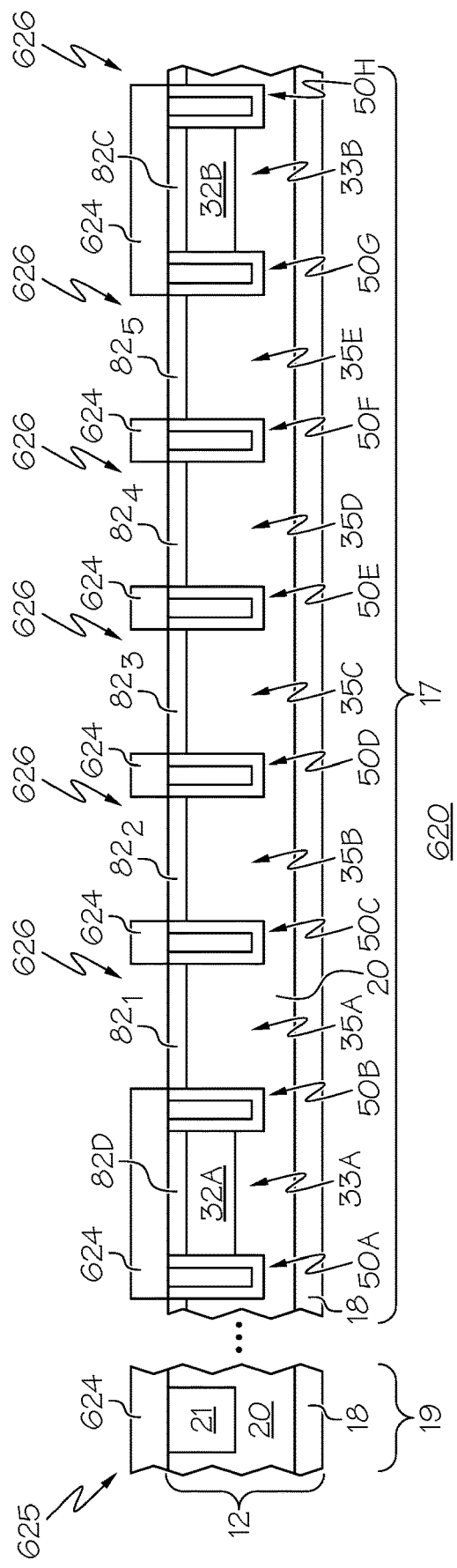
FIG. 51
FIG. 52

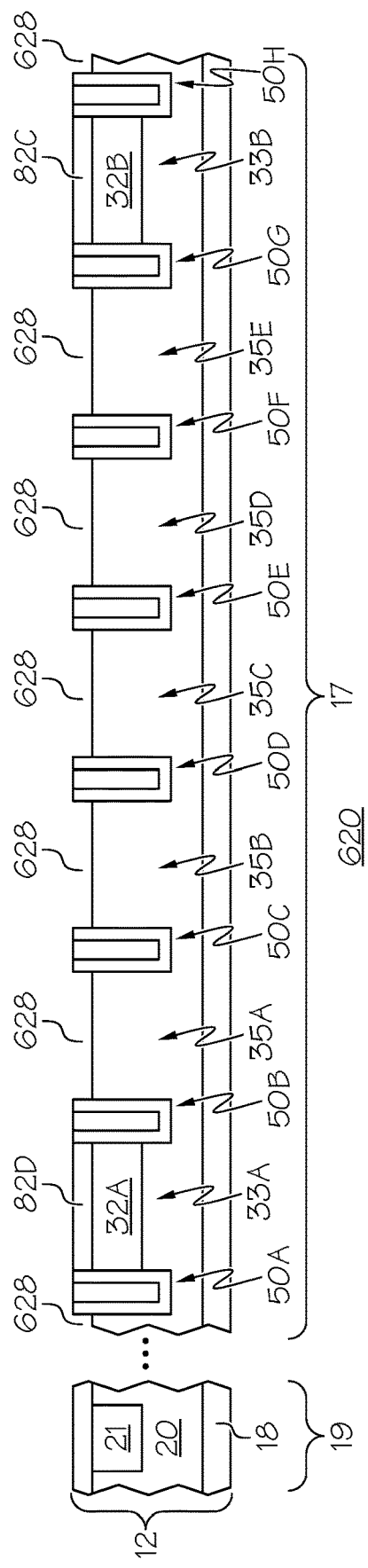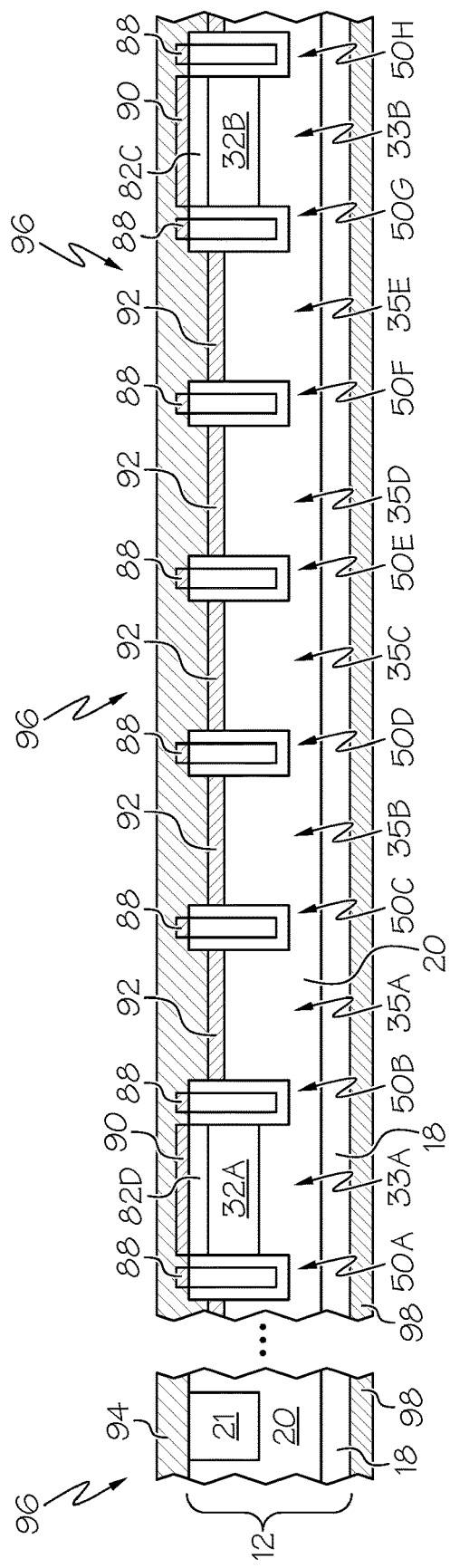

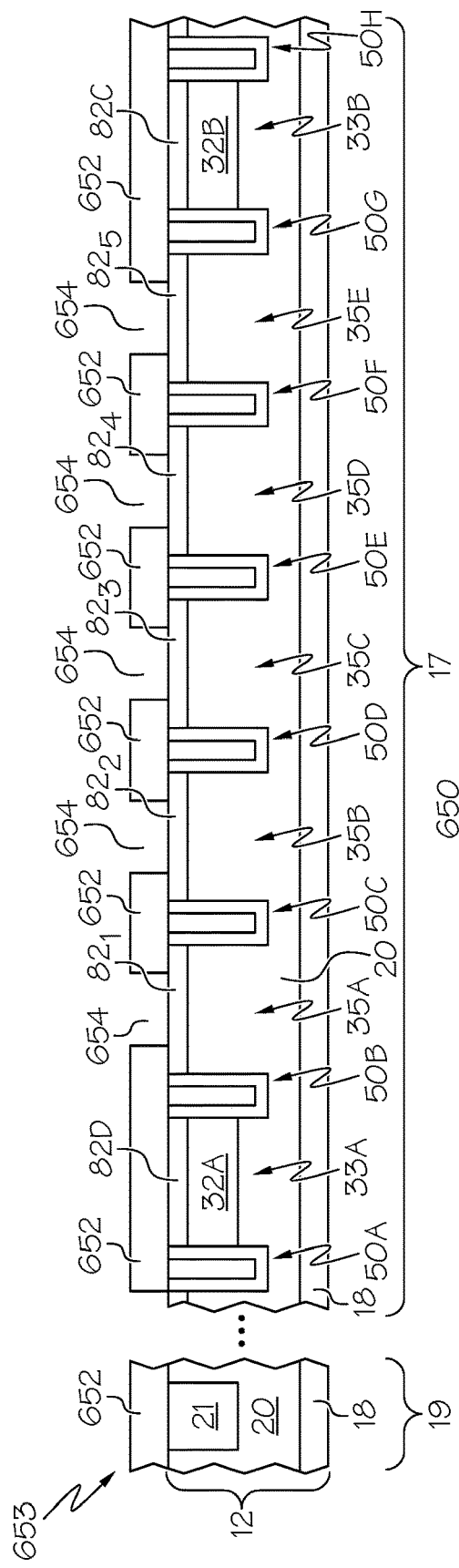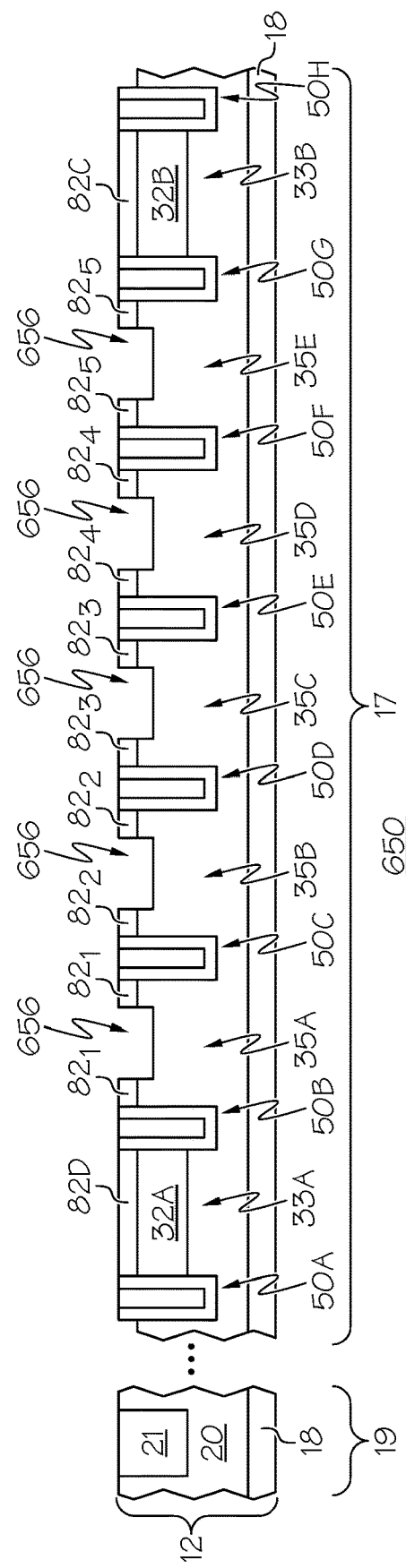

SCHOTTKY DEVICE AND METHOD OF MANUFACTURE

TECHNICAL FIELD

The present invention relates, in general, to semiconductor components and, more particularly, to semiconductor components that include Schottky devices.

BACKGROUND

Semiconductor components such as a Schottky device are well suited for use in high frequency applications because they have short reverse recovery times and low forward voltages, i.e., low losses. Techniques for increasing the breakdown voltage of a Schottky device have resulted in an increase in its forward voltage and a decrease in its switching speed. Since the forward voltage drop of a Schottky device increases significantly in devices configured to support an increased breakdown voltage, Schottky devices may be limited to applications of less than 300 volts. Power rectifiers that improve the forward voltage drop, reverse leakage current, and switching speed of Schottky contact regions have been described in U.S. Pat. No. 4,982,260 issued to HSueh-Rong Chang on Jan. 1, 1991. Trench-gated Schottky devices for protecting gate oxide from high electric fields and hot carrier generation have been described in U.S. Pat. No. 6,078,090 issued to Richard K. Williams on Jun. 20, 2000. A drawback with these techniques is that they increase the amount of silicon used to manufacture the Schottky devices, which increases cost. Other drawbacks with Schottky devices are that they have low reverse blocking capabilities, high current leakage characteristics, and high forward voltage drops.

Accordingly, it would be advantageous to have Schottky devices that offer fast switching and soft recovery characteristics with a high voltage blocking capability, a low leakage current, and a low forward voltage drop. It would be of further advantage for the method of manufacturing the Schottky devices to be cost efficient, time efficient, and compatible with Schottky device manufacturing processes.

BRIEF DESCRIPTION OF THE DRAWINGS

The present invention will be better understood from a reading of the following detailed description, taken in conjunction with the accompanying drawing figures, in which like reference characters designate like elements and in which:

FIG. 2 is a cross-sectional view of the semiconductor component of FIG. 1 at a later stage of manufacture;

FIG. 5 is a cross-sectional view of the semiconductor component of FIG. 4 at a later stage of manufacture;

FIG. 6 is a cross-sectional view of the semiconductor component of FIG. 5 at a later stage of manufacture;

FIG. 18 is a cross-sectional view of a semiconductor component during manufacture in accordance with another embodiment of the present invention;

FIG. 24 is a cross-sectional view of a semiconductor component during manufacture in accordance with another embodiment of the present invention;

FIG. 25 is a cross-sectional view of a semiconductor component during manufacture in accordance with another embodiment of the present invention;

FIG. 42 is a cross-sectional view taken along section line 40-40 of FIG. 39 that illustrates another embodiment of the semiconductor component of FIG. 39;

FIG. 43 is a cross-sectional view taken along section line 40-40 of FIG. 39 that illustrates another embodiment of the semiconductor component of FIG. 39;

FIG. 51 is a cross-sectional view of a semiconductor component during manufacture in accordance with another embodiment of the present invention;

FIG. 52 is a cross-sectional view of the semiconductor component of FIG. 51 at a later stage of manufacture;

FIG. 53 is a cross-sectional view of the semiconductor component of FIG. 52 at a later stage of manufacture;

FIG. 54 is a cross-sectional view of the semiconductor component of FIG. 53 at a later stage of manufacture;

FIG. 55 is a cross-sectional view of a semiconductor component during manufacture in accordance with another embodiment of the present invention;

FIG. 56 is a cross-sectional view of the semiconductor component of FIG. 55 at a later stage of manufacture.

Figure 3:
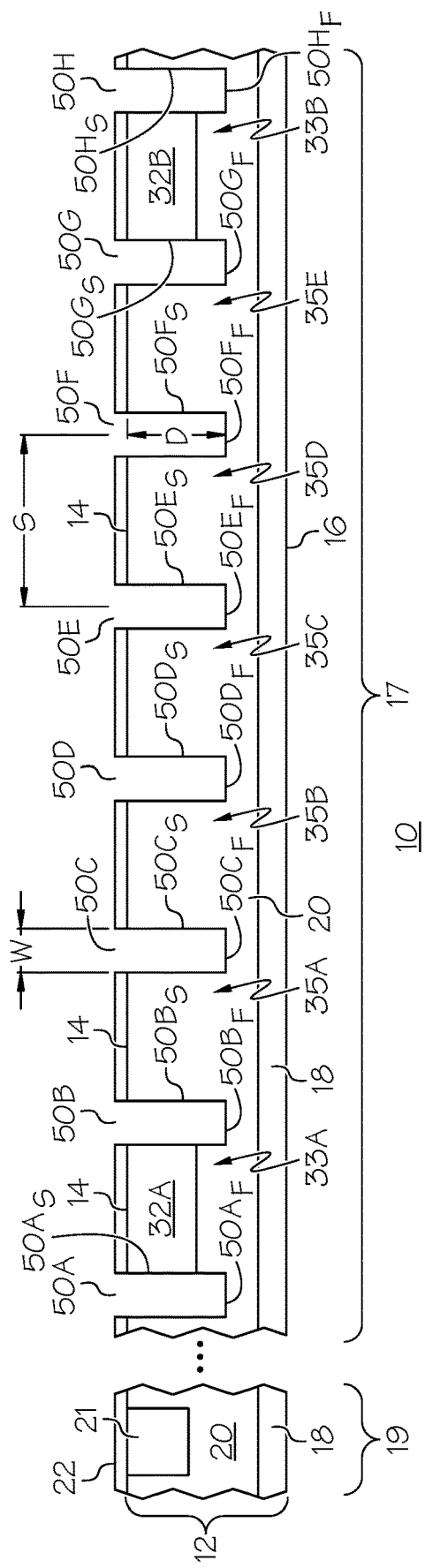
FIG. 3 is a cross-sectional view of the semiconductor component of FIG. 2 at a later stage of manufacture.

For simplicity and clarity of illustration, elements in the figures are not necessarily to scale, and the same reference characters in different figures denote the same elements. Additionally, descriptions and details of well-known steps and elements are omitted for simplicity of the description. As used herein current carrying electrode means an element of a device that carries current through the device such as a source or a drain of field effect transistor or an emitter or a collector of a bipolar transistor or a cathode or anode of a diode, and a control electrode means an element of the device that controls current flow through the device such as a gate of an MOS transistor or a base of a bipolar transistor. Although the devices are explained herein as certain n-channel or p-channel devices, or certain n-type or p-type doped regions, a person of ordinary skill in the art will appreciate that complementary devices are also possible in accordance with embodiments of the present invention. It will be appreciated by those skilled in the art that the words during, while, and when as used herein are not exact terms that mean an action takes place instantly upon an initiating action but that there may be some small but reasonable delay, such as a propagation delay, between the reaction that is initiated by the initial action and the initial action. The use of the words approximately, about, or substantially means that a value of an element has a parameter that is expected to be very close to a stated value or position. However, as is well known in the art there are always minor variances that prevent the values or positions from being exactly as stated. It is well established in the art that variances of up to about ten percent (10%) (and up to twenty percent (20%) for semiconductor doping concentrations) are regarded as reasonable variances from the ideal goal of being exactly as described.

DETAILED DESCRIPTION

Generally the present invention provides a Schottky device and a method for manufacturing the Schottky device, wherein the Schottky device comprises a semiconductor material of a first conductivity type and has first and second surfaces and a first concentration. A cavity extends from the first surface of the semiconductor material and has a floor and sidewalls, and a plurality of mesa structures extend from the floor of the cavity and have mesa surfaces. A first dopant region of a second conductivity type and a second concentration extends from the mesa surface of a first mesa structure into a first portion of the first mesa structure. A first contact is in contact with the first dopant region. In accordance with an embodiment, the first conductivity type is N-type conductivity and the second conductivity type is P-type conductivity. In accordance with another embodiment, the first conductivity type is P-type conductivity and the second conductivity type is N-type conductivity.

In accordance with another aspect, a Schottky device is provided that comprises a semiconductor material of a first conductivity type having first and second major surfaces. A plurality of trenches extend from the first major surface into the semiconductor material, wherein a first set of the plurality of trenches is configured in a geometric configuration. A dielectric material is formed in the plurality of trenches and an electrically conductive material is formed on the dielectric material in the plurality of trenches. A first dopant region of a second conductivity type is formed within the geometric configuration wherein the first dopant region is of a first concentration. A first contact is in contact with the first dopant region. The Schottky device includes conductivity modulation means that modulates conductivity in the first portion of the semiconductor material.

In accordance with another aspect, a method for manufacturing a Schottky device comprises providing a semiconductor material of a first conductivity type having first and second major surfaces and forming first, second, and third trenches in the semiconductor material, wherein a first portion of the semiconductor material is between the first and second trenches and a third portion of the semiconductor material is between the first and second trenches and a second portion of the semiconductor material is between the second and third trenches. A first dielectric material is formed in the first trench, a second dielectric material is formed in the second trench, and a third dielectric material is formed in the third trench, a first polysilicon is formed over the first dielectric material in the first trench, a second polysilicon is formed over the first dielectric material in the second trench, and a third polysilicon is formed over the third dielectric material in the third trench. A first dopant region of a second conductivity type is formed in the first portion of the semiconductor material, and a blanket doping is performed in the first portion of the semiconductor material and the second portion of the semiconductor material with an impurity material of the second conductivity type, where the second portion of the semiconductor material is between the second trench and the third trench to form a first multi-concentration doped region from the first portion of the semiconductor material. The impurity material in the second material that is between the second trench and the third trench, a silicide layer is formed from the first multi-concentration doped region that is between the first trench and the second trench, a second silicide layer is formed from the portion of the semiconductor material that is between the second trench and the third trench, and a third silicide layer is formed from the first polysilicon in the first trench. A first electrically conductive layer is formed over the first silicide layer, the second silicide layer, and the third silicide layer, the first electrically conductive layer has a first portion that contacts the first silicide layer, a second portion that contacts the second silicide layer, and a third portion that contacts the third silicide layer wherein the first silicide layer and the first portion of the first electrically conductive layer form a first multi-concentration contact portion that has electrical properties between a conventional Schottky contact and a conventional Ohmic contact without being a conventional Schottky contact or a conventional Ohmic contact, the second portion of the first electrically conductive layer and the second silicide layer form a Schottky contact, and the third portion of the electrically conductive layer form a first Ohmic contact portion.

Figure 1B:
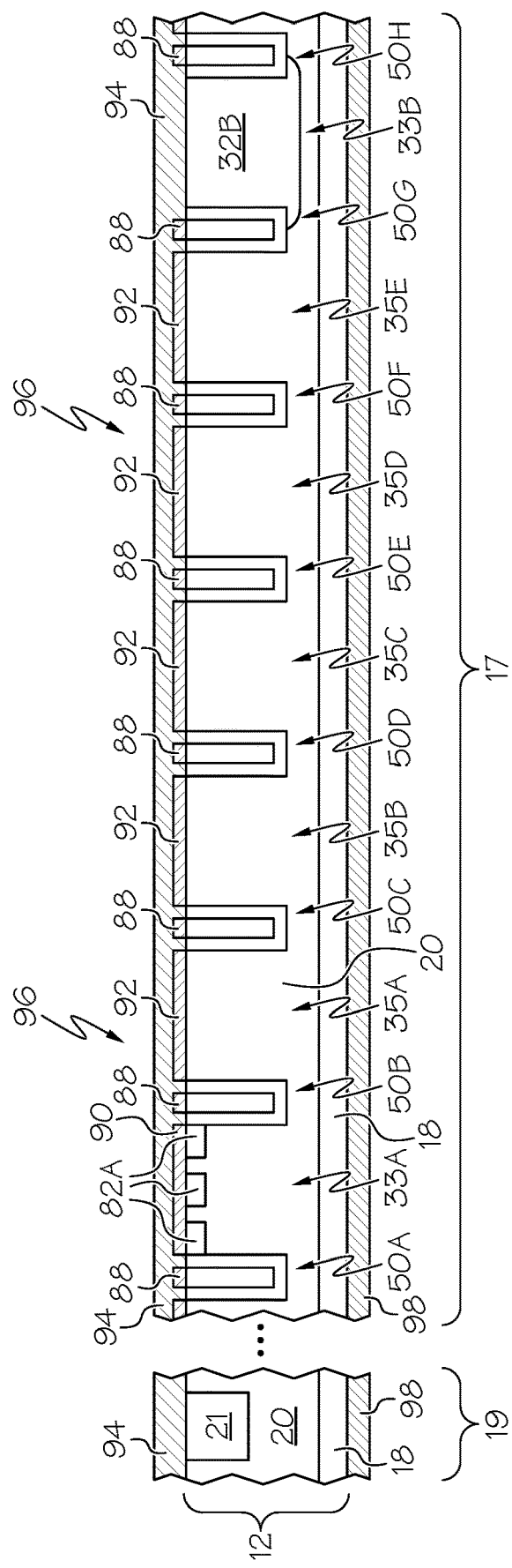
FIG. 1 is a cross-sectional view of a semiconductor component at an early stage of manufacture in accordance with an embodiment of the present invention.

FIG. 1 is a cross-sectional view of a portion of a semiconductor component 10 such as for example, a Schottky device, during manufacture in accordance with an embodiment of the present invention. What is shown in FIG. 1 is a semiconductor material 12 having opposing surfaces 14 and 16. Surface 14 is also referred to as a front or top surface and surface 16 is also referred to as a bottom or back surface. In accordance with this embodiment, semiconductor material 12 comprises an epitaxial layer 20 formed on a semiconductor substrate 18. Preferably, substrate 18 is silicon heavily doped with an N-type dopant or impurity material and epitaxial layer 20 is silicon lightly doped with an N-type dopant. In accordance with embodiments of the present invention, substrate 18 has a resistivity of less than about 6 milliOhm-centimeters (mΩ-cm) and epitaxial layer 20 has a thickness ranging about 8 micrometers (μm) to about 20 μm and a resistivity ranging from about 4 Ω-cm to about 12 Ω-cm. By way of example, substrate 18 has a resistivity of about 5.4 mΩ-cm, epitaxial layer 20 has a resistivity of about 5.9 Ω-cm and a thickness of about 13.5 μm. Substrate layer 18 provides a low resistance conduction path for current to flow in a Schottky device. It should be noted that a region or layer doped with an N-type dopant is said to be of an N-type conductivity or an N conductivity type and a region or layer doped with a P-type dopant is said to be of a P-type conductivity or a P conductivity type. Suitable N-type dopants include arsenic, antimony, phosphorus, or the like and suitable P-type dopants include boron, indium, or the like.

It should be appreciated that semiconductor material 12 includes an active region 17 and an edge termination region 19. An edge termination structure 21 may be formed in edge termination region 19. It should be noted that edge termination structure 21 has been included in block form for the sake of completeness and that additional processing steps may be performed to complete the formation of edge termination structure 21.

Still referring to FIG. 1, surface 14 is cleaned using, for example, a wet hydrofluoric (HF) acid etching process, then a layer of dielectric material 22 is formed on or from epitaxial layer 20. In accordance with an embodiment, the material of dielectric layer 22 is silicon dioxide having a thickness ranging from about 100 Angstroms (Å) to about 5,000 Å. By way of example, dielectric layer 22 is silicon dioxide formed using a dry oxidation process or a steam oxidation process at a temperature ranging from about 750 degrees Celsius (° C.) to about 1,050° C. An exemplary temperature for forming dielectric layer 22 is 900° C. Dielectric layer 22 may be formed by oxidation techniques, deposition techniques, etc. Other suitable materials for dielectric layer 22 include silicon nitride or the like.

A layer of photoresist is patterned over dielectric layer 22 to form a masking structure 24 having masking elements 26 and openings 28 that expose portions of dielectric layer 22. Masking structure 24 is also referred to as a mask, a screen mask, or an implant mask. Doped regions 32A and 32B of, for example, P-type conductivity may be formed in epitaxial layer 20 by implanting an impurity material such as boron or indium through openings 28, the exposed portions of dielectric layer 22, and into epitaxial layer 20. In accordance with embodiments in which the impurity material is boron, the boron may be implanted at a dose ranging from about $1 \times 10^{12}$ ions per centimeter squared (ions/cm$^2$) to about $1 \times 10^{14}$ ions/cm$^2$ and an implant energy ranging from about 50 kilo electron volts (keV) to about 450 keV. By way of example, the implant dose is about $8 \times 10^{12}$ ions/cm$^2$ and the implant energy is about 300 keV. Masking structure 24 is removed. The implant may be activated and diffused using a Rapid Thermal Anneal (RTA) performed in, for example, a nitrogen ambient at a temperature ranging from about 850° C. to about 1,100° C. for a time ranging from about 30 seconds to about 2 minutes. It should be noted the technique for forming doped regions 32A and 32B is not limited to an implantation technique. Alternatively, doped regions 32A and 32B may be formed by deposition and diffusion techniques.

Referring now to FIG. 2, a layer of photoresist is patterned over dielectric layer 22 to form a masking structure 36 having masking elements 38 and openings 40 that expose portions of dielectric layer 22. Masking structure 36 may be referred to as a mask or an etch mask.

Referring now to FIG. 3, trenches 50A, 50B, 50C, 50D, 50E, 50F, 50G, and 50H are formed in epitaxial layer 20 by removing the portions of dielectric layer 22 exposed by openings 40 and the portions of epitaxial layer 20 exposed by the removal of the portions of dielectric layer 22. For the sake of clarity, trenches 50A, 50B, 50C, 50D, 50E, 50F, 50G, and 50H may be referred to as trenches 50A-50H. More particularly, the exposed portions of dielectric layer 22 and the portions of epitaxial layer 20 that are below the exposed portions of dielectric layer 22 are removed. Dielectric layer 22 that has removed portions, i.e., the remaining portions of dielectric layer 22 may be referred to as a hardmask. Trench 50A has sidewalls $50A_S$ and a floor $50A_F$, trench 50B has sidewalls $50B_S$ and a floor $50B_F$, trench 50C has sidewalls $50C_S$ and a floor $50C_F$, trench 50D has sidewalls $50D_S$ and a floor $50D_F$, trench 50E has sidewalls $50E_S$ and a floor $50E_F$, trench 50F has sidewalls $50F_S$ and a floor $50F_F$, trench 50G has sidewalls $50G_S$ and a floor $50G_F$, and trench 50H has sidewalls $50H_S$ and a floor $50H_F$. By way of example, trenches 50A-50H may be formed using Reactive Ion Etching (RIE) etching with a fluorine and oxygen based chemistry, wherein the fluorine to oxygen ratio may be used to control the trench profile parameters such as the anisotropy of the trenches and the uniformity of the trench depth. Trenches 50A-50H may be etched to have a depth, D, ranging from about 0.7 µm to about 5 µm, a trench width, W, ranging from about 0.2 µm to about 3 µm, and a center-to-center spacing, S, ranging from about 0.75 µm to about 5 µm. By way of example, the trenches 50A-50H have a depth, D, of about 2.2 µm, a width, W, of about 0.8 µm, and a center-to-center spacing, S, of about 2.5 µm.

Although trenches with vertical sidewalls are preferred, this is not a limitation of the present invention. Alternatively trenches 50A-50H may have tapered profiles where the widths of trenches 50A-50H at their trench floors may be less than their widths near surface 14. In embodiments in which the trench sidewalls are substantially vertical and the trench floors are substantially parallel to surface 14, the sidewalls serve as vertical surfaces and the floors serve as horizontal surfaces. Trenches 50A-50H are shown as ending in epitaxial layer 20, however, this is not a limitation of the present invention. For example, trenches 50A-50H may end at substrate 18 or they may extend into substrate 18. In addition, the depths of trenches 50A-50H may be selected so that doped regions 32A and 32B extend a distance into epitaxial layer 20 from surface 14 that is at least 40 percent (%) of the trench depth. The etching technique and the number of trenches 50A-50H formed in epitaxial layer 20 are not limitations of the present invention.

Formation of trenches 50A-50H, leaves mesa structures 33A, 33B, 35A, 35B, 35C, 35D, and 35E that are formed from portions of semiconductor material 12, where each of mesa structures 33A, 33B, 35A, 35B, 35C, 35D, and 35E has a mesa surface. For the sake of clarity, mesa structures 35A, 35B, 35C, 35D, and 35E may be referred to as mesa structures 35A-35E. Mesa structure 33A is between and laterally bounded by trenches 50A and 50B and mesa structure 33B is between and laterally bounded by trenches 50G and 50H. Mesa structure 35A is between and laterally bounded by trenches 50B and 50C; mesa structure 35B is between an laterally bounded by trenches 50C and 50D; mesa structure 35C is between and laterally bounded by trenches 50D and 50E; mesa structure 35D is between and laterally bounded by trenches 50E and 50F; and mesa structure 35E is between and laterally bounded by trenches 50F and 50G. Thus, mesa structures 35A-35E are between or laterally positioned between mesa structures 33A and 33B.

It should be noted that doped region 32A is formed in mesa structure 33A and doped region 32B is formed in mesa structure 33B.

Figure 4:
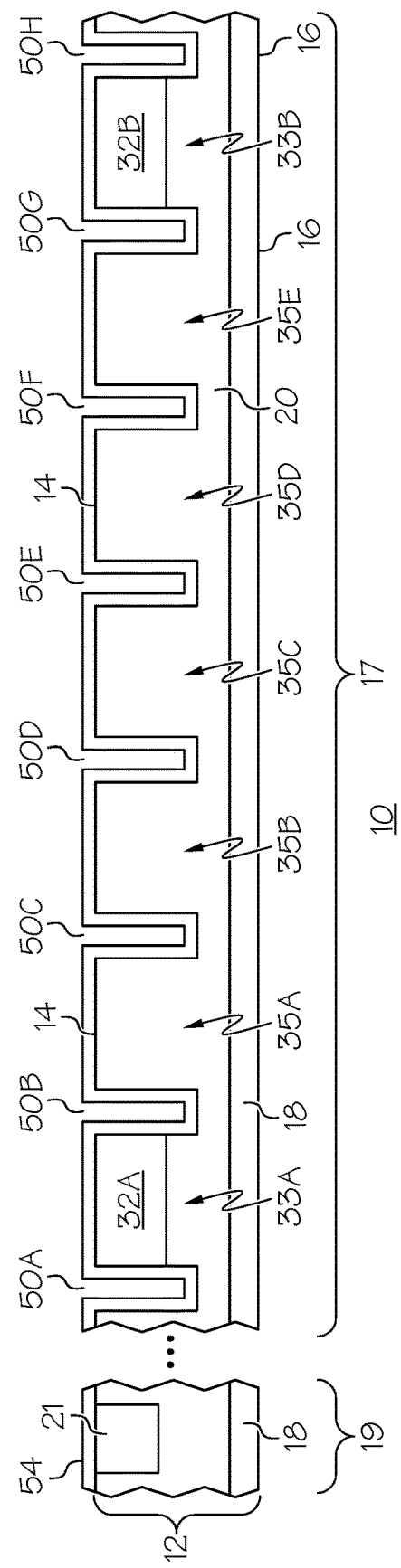
FIG. 4 is a cross-sectional view of the semiconductor component of FIG. 3 at a later stage of manufacture.

Referring now to FIG. 4, the remaining portions of dielectric layer 22 are removed to expose surface 14, sidewalls $50A_S$-$50H_S$, and floors $50A_F$-$50H_F$, which are then cleaned using a wet HF etching technique to remove any native oxide that may be present. A dielectric layer 54 is formed on surface 14, sidewalls $50A_S$-$50H_S$, and floors $50A_F$-$50H_F$. By way of example, dielectric layer 54 is formed by a wet oxidation technique at a temperature ranging from about 1,000° C. to about 1,400° C. and has a thickness ranging from about 1,000 Å to about 5,000 Å.

Referring now to FIG. 5, a layer of semiconductor material 60 is formed on the dielectric layer 54. In accordance with an embodiment, the material of semiconductor layer 60 is polysilicon doped with an N-type impurity material having a dopant concentration ranging from about $1 \times 10^{18}$ atoms/cm$^3$ to about $1 \times 10^{20}$ atoms/cm$^3$. By way of example, semiconductor layer 60 is doped with phosphorus having a dopant concentration of about $1 \times 10^{19}$ atoms/cm$^3$. It should be noted that the dopant or impurity material concentration of polysilicon layer 60 is not a limitation of the present invention.

Referring now to FIG. 6, polysilicon layer 60 and dielectric layer 54 are etched back using, for example, a plasma ion etcher with a fluorine chemistry. Etching dielectric layer 54 leaves a dielectric layer 54A on sidewalls $50A_S$ and floor $50A_F$; a dielectric layer 54B formed on sidewalls $50B_S$ and floor $50B_F$; a dielectric layer 54C formed on sidewalls $50C_S$ and floor $50C_F$; a dielectric layer 54D formed on sidewalls $50D_S$ and floor $50D_F$; a dielectric layer 54E formed on sidewalls $50E_S$ and floor $50E_F$; a dielectric layer 54F formed on sidewalls $50F_S$ and floor $50F_F$; a dielectric layer 54G formed on sidewalls $50G_S$ and floor $50G_F$; and a dielectric layer 54H formed on sidewalls $50H_S$ and floor $50H_F$. For the sake of clarity, dielectric layers 54A, 54B, 54C, 54D, 54E, 54F, 54G, and 54H may be referred to as dielectric layers 54A-54H.

Etching back polysilicon layer 60 leaves portions 64A, 64B, 64C, 64D, 64E, 64F, 64G, and 64H on dielectric layers 54A-54H in trenches 50A-50H, respectively. Portions 64A, 64B, 64C, 64D, 64E, 64F, 64G, and 64H may be referred to as polysilicon fill material, polysilicon plugs, or the like. It should be noted that polysilicon remaining in trenches 50A-50H may partially fill trenches 50A-50H or fully fill trenches 50A-50H. It should be further noted that an optional planarization step may be performed to planarize surface 14, the exposed portions of polysilicon fill material 64A-64H, and the exposed portions of dielectric layers 54A-54H. By way of example, the optional planarization step includes the use of an ion plasma tool with fluorine, chlorine, and oxygen chemistries. A layer of dielectric material 69 having a thickness ranging from about 1,000 Å to about 4,000 Å is formed on the exposed portions of surface 14 of epitaxial layer 20, the exposed portions of mesa structures 33A and 33B, the exposed portions of mesa structures 35A-35E, the exposed portions of polysilicon fill material 64A-64H, and the exposed portions of dielectric layers 54A-54H. Dielectric layer 69 may be an oxide grown using a dry oxidation process or a steam oxidation process. In accordance with embodiments in which dielectric layer 69 is oxide, it may be referred to as screen oxide.

Figure 7:
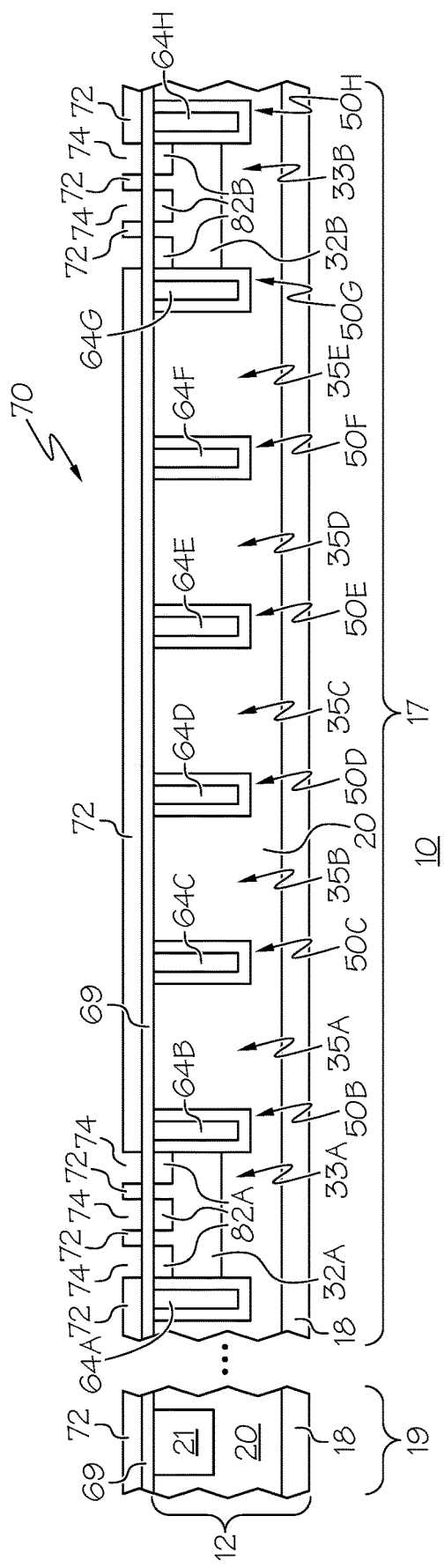
FIG. 7 is a cross-sectional view of the semiconductor component of FIG. 6 at a later stage of manufacture.

Referring now to FIG. 7, a layer of photoresist is patterned over screen oxide layer 69 to form a masking structure 70 having masking elements 72 and openings 74 that expose the portions of screen oxide layer 69 over doped regions 32A and 32B in mesa structures 33A and 33B, respectively. Masking structure 70 is also referred to as a mask, a screen mask, or an implant protect mask. Doped regions 32A and 32B may be doped with an impurity material of P-type conductivity by, for example, implanting an impurity material such as boron through openings 74 to form enhanced doped regions 82A and 82B in portions of doped regions 32A and 32B, respectively. For the sake of clarity, reference character 82A represents a plurality of doped regions formed within doped region 32A and reference character 82B represents a plurality of doped regions formed within doped region 32B. In the embodiment of FIG. 7, three doped regions 82A are formed within doped region 32A and three doped regions 82B are formed within doped region 32B. The number of doped regions formed within doped regions 32A and 32B is not a limitation of the present invention. Boron may be implanted at a dose ranging from about $1\times10^{12}$ ions per centimeter squared (ions/cm$^2$) to about $1\times10^{14}$ ions/cm$^2$, an implant energy ranging from about 50 kilo electron volts (keV) to about 300 keV, and an implant angle ranging from about 0 degrees to about 45 degrees. By way of example, the implant dose is about $1.5\times10^{13}$ ions/cm$^2$, the implant energy is about 100 keV, and the implant angle is about 7 degrees.

Thus, in accordance with an embodiment, doped regions 32A and 32B are formed in mesa structures 33A and 33B, respectively, and doped regions 82A and 82B are formed within doped regions 32A and 32B in mesa structures 33A and 33B, respectively. For example, doped regions 32A and 32B are formed within sub-portions of mesa structures 33A and 33B and doped regions 82A and 82B are formed within sub-portions of mesa structures 33A and 33B. Doped regions 32A and 32B extend from surface 14 into semiconductor material 12 a distance that is greater than the distance that doped regions 82A and 82B extend into semiconductor material 12, i.e., doped regions 82A and 82B extend from surface 14 into semiconductor material 12 a distance that is less than the distance that doped regions 32A and 32B extend into semiconductor material 12. Thus, doped regions 32A and 32B and 82A and 82B are formed in mesa structures 32A and 32B, respectively, such that mesa structures 33A and 33B have multi-concentration impurity profiles. The multi-concentration impurity profiles may be referred to as a multi-concentration impurity material profiles. In an embodiment, doped regions 82A and 82B are formed within the sub-portions of mesa structures 33A and 33B in which doped regions 32A and 32B are formed, respectively. Doped regions 82A and 82B may be referred to as fragmented doped regions or fragmented regions.

In accordance with another embodiment, the multi-concentration impurity profiles are stepped dopant profiles. It should be noted that some of doped regions 32A and 32B can be formed using, for example, an implant technique and other doped regions of doped regions 32A and 32B can be formed using a diffusion technique. Likewise, some of doped regions 82A and 82B can be formed using, for example an implant technique and other doped regions of doped regions 82A and 82B can be formed using a diffusion technique. Alternatively, the dopant concentrations of doped regions 32A and 32B may be the same or different from one another and the dopant concentrations of doped regions 82A and 82B may be the same or different from one another.

Masking structure 70 is removed and the implant may be activated and diffused using an RTA step performed in, for example, a nitrogen ambient at a temperature ranging from about 850° C. to about 1,100° C. for a time ranging from about 30 seconds to about 2 minutes. In accordance with an embodiment, the anneal temperature may be about 1,000° C. and the anneal time may be about 45 seconds. The technique for forming doped regions 82A and 82B is not limited to an implantation technique. Alternatively, enhanced doped regions 82A and 82B may be formed by deposition and diffusion techniques. Although enhanced doped regions are described as being formed after the formation of trenches 50A-50H, this is not a limitation of the present invention. For example, enhanced doped regions 82A and 82B may be formed before the formation of trenches 50A-50H or before or after formation of doped regions 32A and 32B.

Figure 8:
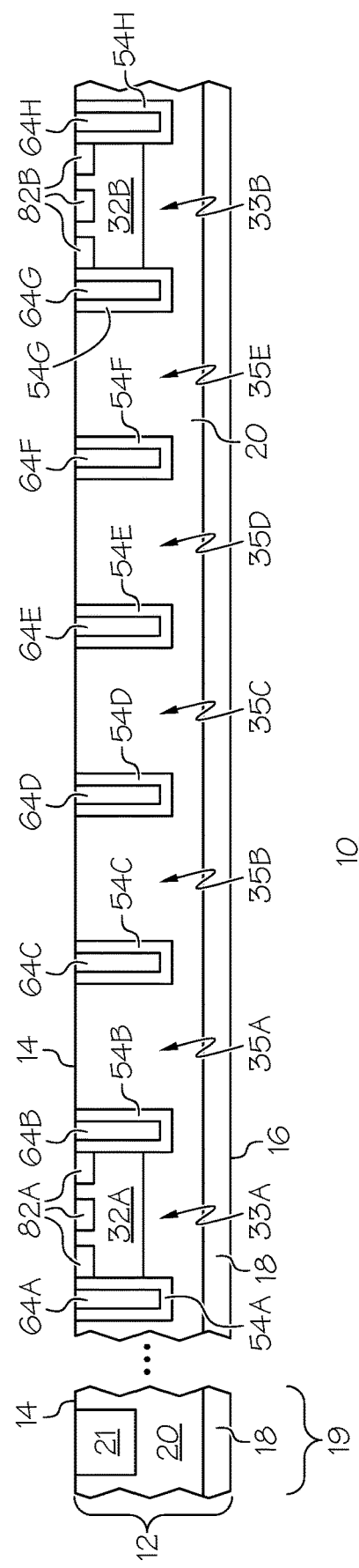
FIG. 8 is a cross-sectional view of the semiconductor component of FIG. 7 at a later stage of manufacture.

Referring now to FIG. 8, screen oxide layer 69 is removed to expose surface 14, the exposed portions of doped regions 32A and 32B, enhanced doped 82A and 82B, the exposed portions of polysilicon fill material 64A-64H, and the exposed portions of dielectric layers 54A-54H, which are cleaned using a wet HF etching technique to remove any native oxide that may be present.

Figure 9:
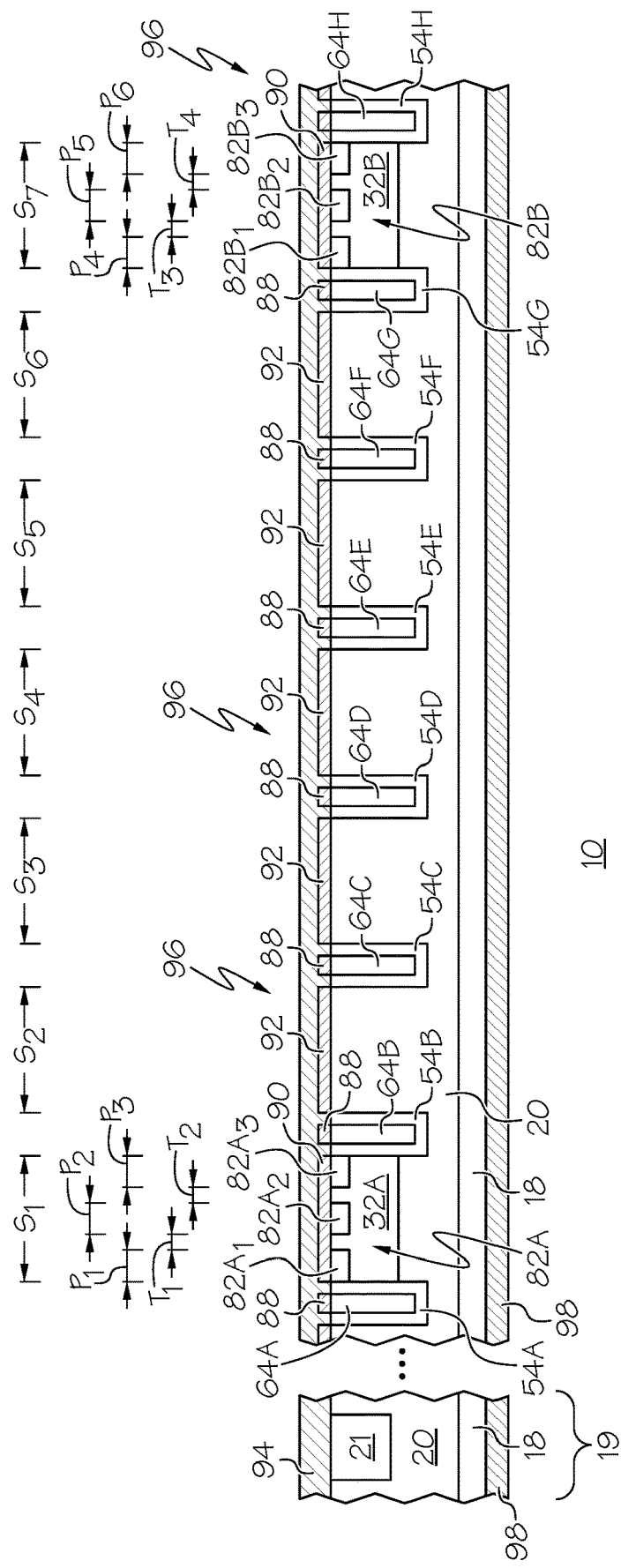
FIG. 9 is a cross-sectional view of the semiconductor component of FIG. 8 at a later stage of manufacture.

Referring now to FIG. 9, a barrier metal deposition process is performed in which a barrier metal is deposited on dielectric layers 54A-54H, polysilicon fill material 64A-64H, doped regions 32A and 32B, enhanced doped regions 82A and 82B, and portions of surface 14. It should be noted that forming a barrier metal in edge termination region 19 is optional and that for the sake of clarity a barrier metal is not shown as being formed in edge termination region 19. In accordance with an embodiment, the barrier metal includes a nickel platinum metal alloy having a thickness ranging from about 100 Å to about 2,000 Å. By way of example, the nickel platinum metal alloy has a thickness of about 700 Å. The nickel platinum metal alloy is treated to a rapid thermal anneal in a nitrogen ambient at a temperature ranging from about 300° C. to about 700° C. for a time ranging from about 15 seconds to about 120 seconds. The heat treatment causes the nickel platinum metal alloy to react with the silicon to form nickel platinum silicide in all regions in which the nickel platinum metal alloy is in contact with silicon or polysilicon. Thus, nickel platinum silicide layers 88 are formed from polysilicon fill material 64A-64H, nickel platinum silicide layers 90 are formed from doped regions 32A and 32B and enhanced doped regions 82A and 82B, and nickel platinum silicide layers 92 are formed from the exposed portions of surface 14, e.g., the exposed portions of epitaxial layer 20 of semiconductor material 12. Because a barrier metal is not shown as being formed in edge termination region 19, a silicide layer is also not shown as being formed in edge termination region 10. However, those skilled in the art will appreciate that a silicide layer may or may not be formed in edge termination region 19. The unreacted nickel platinum metal alloy is removed using for example a hot SPM strip. The hot SPM strip solution may be comprised of sulfuric acid and hydrogen peroxide. It should be noted that the barrier metal is not limited to nickel platinum alloys. Other suitable materials for the barrier metal layers include titanium nitride, titanium, tungsten, platinum, aluminum copper, or the like. In addition, the number of metal layers forming the barrier metal is not limited to a single metal layer, but may be comprised of one, two, three, or more metal layers.

A metal layer 94 is formed in contact with the barrier metal layer or layers. Suitable materials for metal layer 94 include aluminum, nickel, silver, or the like. Silicide layers 88, 90, and 92, the barrier metal layers, and metal layer 94 form an anode or anode contact 96 of Schottky device 10 and also may be referred to as a Schottky metallization system or a Schottky contact. A conductor 98 is formed in contact with surface 16 and serves as a cathode or cathode contact for Schottky device 10 and may be referred to as a cathode metallization system. It should be noted that metal layer 94 is shown as being formed in contact with epitaxial layer 20 and edge terminal structure 21 in edge termination region 19 because a silicide layer is not shown as being formed in this region. However, those skilled in the art will appreciate that metal layer 94 can be in contact with a silicide layer in edge terminal region 19 if a silicide had been formed in edge termination region 19. Suitable metallization systems for conductor 98 include a gold alloy, titanium-nickel-gold, titanium-nickel-silver, or the like. It should be noted that the metal of the portions of the metallization system in contact with mesa structures that include multi-concentration dopant profiles, i.e., mesa structures 33A and 33B may be different from the metal of the portions of the metallization system that contact mesa structures in which the multi-concentration dopant profiles are absent, e.g., mesa structures 35A-35E. Thus, silicide layers 88 in combination with portions of metal layer 94 form ohmic contact portions to the electrically conductive material 64A-64H in trenches 50A-50H, respectively, where electrically conductive material 64A-64H may be polysilicon fill material; silicide layers 90 in combination with portions of metal layer 94 form contacts to sets of doped region 32A and enhanced doped region 82A and to doped region 32B and enhanced doped region 82B that are between an ohmic contact and conventional Schottky contacts; and silicide layers 92 in combination with portions of metal layer 94 form conventional Schottky contacts to mesa structures 35A-35E. It should be noted that a contact formed by a barrier metal such as metal 92 and a lightly doped epitaxial layer, e.g., a dopant concentration of about $10^{15}/cm^3$, forms a conventional Schottky contact and a contact formed by a metal such as metal 88 and a highly doped semiconductor material, e.g., a dopant concentration of about $10^{19}/cm^3$, such as N-type semiconductor material 64 forms a conventional Ohmic contact.

Mesa structures 33A, 33B, and 35A-35E can have variable widths or distances $S_1$, $S_2$, $S_3$, $S_4$, $S_5$, $S_6$, and $S_7$ between adjacent trenches; enhanced doped regions 82A can have variable widths $P_1$, $P_2$, and $P_3$; and enhanced doped regions 82A can have variable spacing or distances $T_1$ and $T_2$ between them. By way of example, enhanced doped regions 82A may be comprised of three doped regions $82A_1$, $82A_2$, and $82A_3$, where doped region $82A_1$ has a width $P_1$, doped region $82A_2$ has a width $P_2$, doped region $82A_3$ has a width $P_3$, doped region $82A_1$ is spaced apart from doped region $82A_2$ by a distance $T_1$ and doped region $82A_2$ is spaced apart from doped region $82A_3$ by a distance $T_2$; enhanced doped regions 82B may be comprised of three doped regions $82B_1$, $82B_2$, and $82B_3$, where doped region $82B_1$ has a width $P_4$, doped region $82B_2$ has a width $P_5$, doped region $82B_3$ has a width $P_6$, doped region $82B_1$ is spaced apart from doped region $82B_2$ by a distance $T_3$ and doped region $82B_2$ is spaced apart from doped region $82B_3$ by a distance $T_4$. Collectively, doped regions $82A_1$, $82A_2$, and $82A_3$ are referred to as enhanced doped region 82A or fragmented doped region 82A; and doped region $82B_1$, doped region $82B_2$, and doped region $82B_3$ are referred to as enhanced doped region 82B or fragmented doped region 82B.

Figure 10:
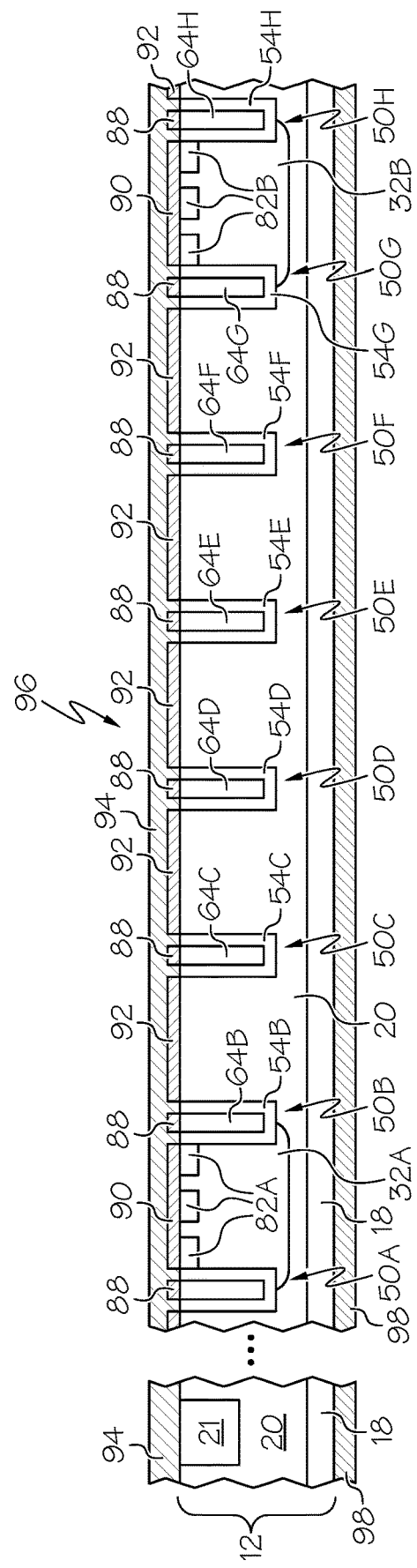
FIG. 10 is a cross-sectional view of a semiconductor component during manufacture in accordance with another embodiment of the present invention.

FIG. 10 is a cross-sectional view of a semiconductor component 100 in accordance with another embodiment of the present invention. What is shown in FIG. 10 is an embodiment in which doped regions 32A and 32B extend further into epitaxial layer 20 than trenches 50A-50H extend into epitaxial layer 20.

Figure 11:
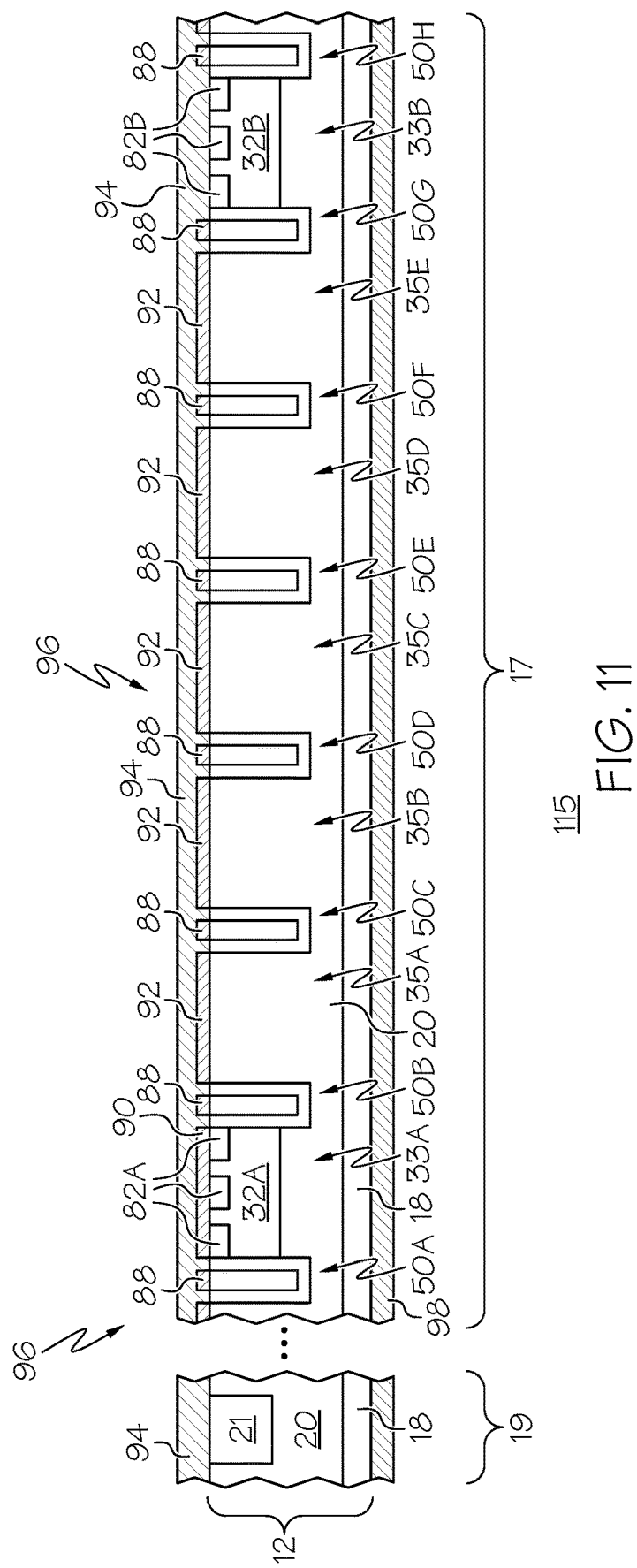
FIG. 11 is a cross-sectional view of a semiconductor component during manufacture in accordance with another embodiment of the present invention.

FIG. 11 is a cross-sectional view of a semiconductor component 115 in accordance with another embodiment of the present invention. By way of example, semiconductor component 115 is a Schottky device. Semiconductor component 115 is similar to semiconductor component 10 (shown in FIG. 9) except that silicide layer 90 between metal layer 94 and enhanced doped regions 82B is absent.

Figure 12:
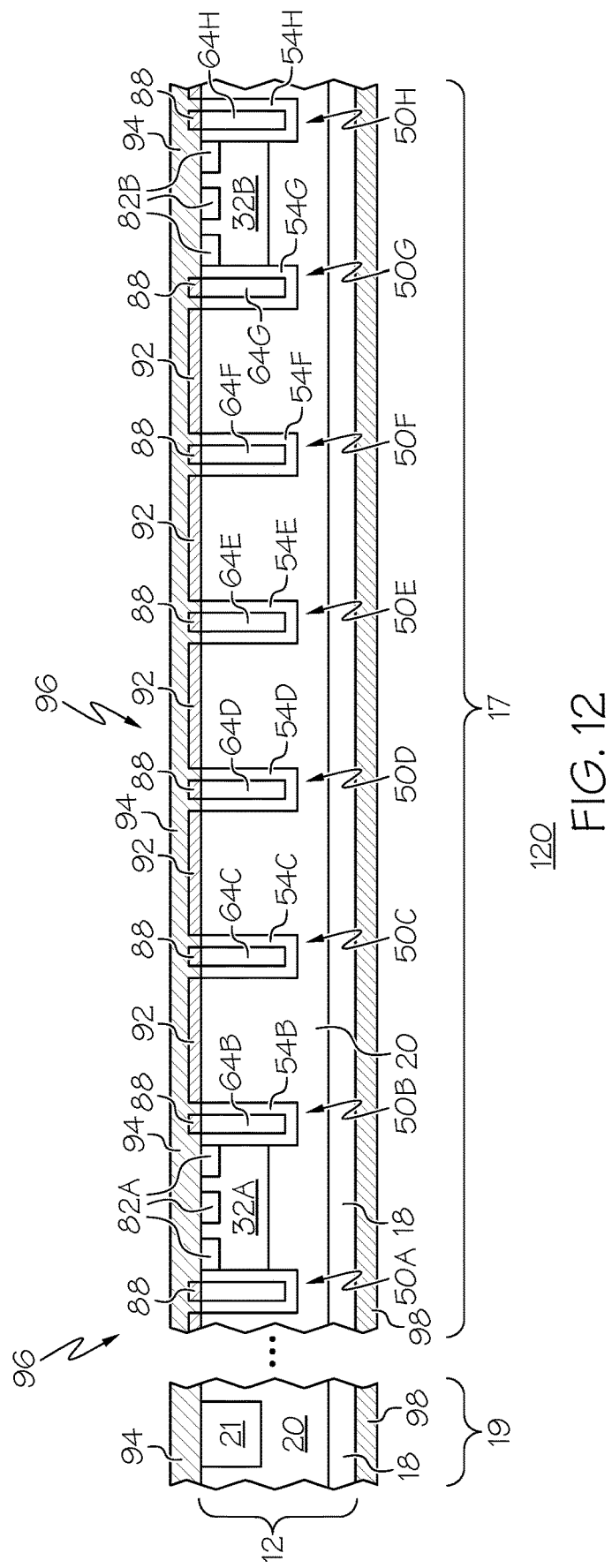
FIG. 12 is a cross-sectional view of a semiconductor component during manufacture in accordance with another embodiment of the present invention.

FIG. 12 is a cross-sectional view of a semiconductor component 120 in accordance with another embodiment of the present invention. By way of example, semiconductor component 120 is a Schottky device. Semiconductor component 120 is similar to semiconductor component 10 (shown in FIG. 9) except that silicide layer 90 between metal layer 94 and enhanced doped regions 82A is absent and silicide layer 90 between metal layer 94 and enhanced doped regions 82B is absent.

Figure 13:
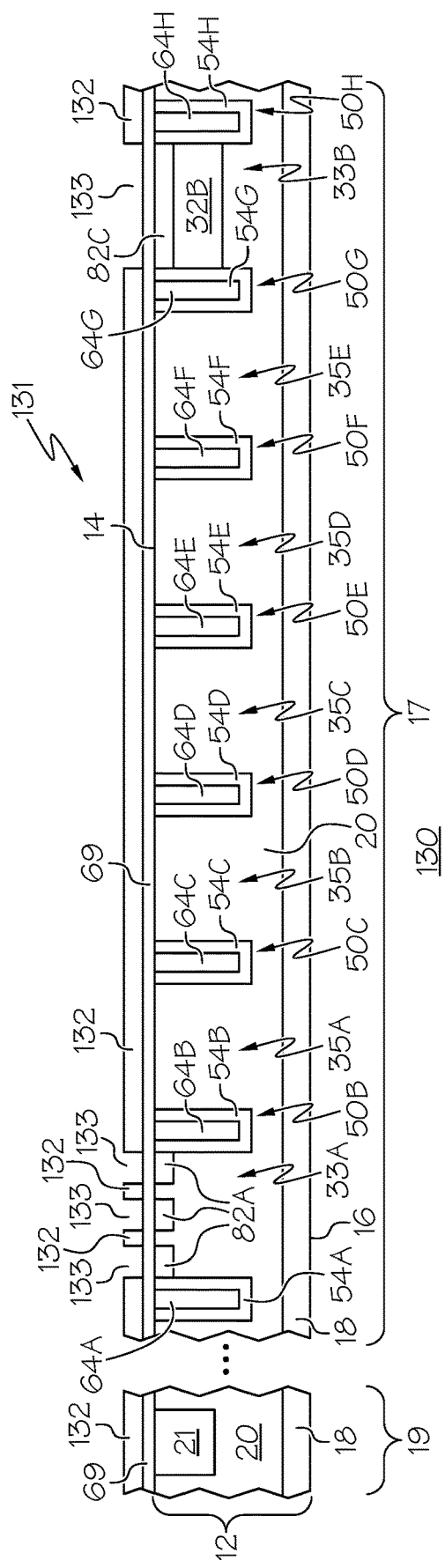
FIG. 13 is a cross-sectional view of a semiconductor component during manufacture in accordance with another embodiment of the present invention.

FIG. 13 is a cross-sectional view of a semiconductor component 130 in accordance with another embodiment of the present invention. The description of FIG. 13 continues from the description of FIG. 6 except that doped region 32A is absent from semiconductor component 130. A layer of photoresist is patterned over screen oxide layer 69 to form a masking structure 131 having masking elements 132 and openings 133 that expose the portions of screen oxide layer 69 over mesa structure 33A and doped region 32B in mesa structure 33B. It should be noted that a plurality of masking elements and openings are formed over mesa structure 33A and a single opening is formed over substantially all of mesa structure 33B. Masking structure 130 is also referred to as a mask, a screen mask, or an implant protect mask. Mesa structures 33A and 33B are doped with an impurity material of P-type conductivity by, for example, implanting an impurity material such as boron through openings 133 to form enhanced doped regions 82A and 82C in mesa structures 33A and 33B, respectively. It should be noted that enhanced doped region 82C is a single doped region within mesa structure 33B, whereas enhanced doped regions 82A are a plurality of doped regions within mesa structure 33A.

The impurity material may be boron that is implanted at a dose ranging from about $1\times10^{12}$ ions per centimeter squared (ions/cm²) to about $1\times10^{14}$ ions/cm², an implant energy ranging from about 50 kilo electron volts (keV) to about 300 keV, and an implant angle ranging from about 0 degrees to about 45 degrees. By way of example, the implant dose is about $1.5\times10^{13}$ ions/cm², the implant energy is about 100 keV, and the implant angle is about 7 degrees. Thus, in accordance with an embodiment, doped region 32B is formed in mesa structure 33B and doped regions 82A and 82C are formed within mesa structures 33A and 33B, respectively Enhanced doped regions 82A are formed within sub-portions of mesa structure 33A and enhanced doped region 82C is formed within a sub-portion of mesa structure 33B. Doped region 32B extends from surface 14 into semiconductor material 12 a distance that is greater than the distance that enhanced doped region 82C extends into semiconductor material 12, i.e., enhanced doped region 82C extends from surface 14 into semiconductor material 12 a distance that is less than the distance that doped region 32B extends into semiconductor material 12. Enhanced doped regions 82A are formed in mesa structure 32A to have a multi-concentration impurity profile and enhanced doped region 82C is formed in mesa structure 32B to have a multi-concentration impurity profile. The multi-concentration impurity profiles may be referred to as multi-concentration impurity material profiles. In accordance with another embodiment, the multi-concentration impurity profiles are stepped dopant profiles. The dopant concentrations of enhanced doped regions 82A and 82C may be the same or different from one another.

Masking structure 131 is removed and the implant may be activated and diffused using an RTA step performed in, for example, a nitrogen ambient at a temperature ranging from about 850° C. to about 1,100° C. for a time ranging from about 30 seconds to about 2 minutes. In accordance with an embodiment, the anneal temperature may be about 1,000° C. and the anneal time may be about 45 seconds. The technique for forming enhanced doped regions 82A and 82C is not limited to an implantation technique. Alternatively, enhanced doped regions 82A and 82C may be formed by deposition and diffusion techniques. Although enhanced doped regions 82A and 82C are described as being formed after the formation of trenches 50A-50H, this is not a limitation of the present invention. For example, enhanced doped regions 82A and 82C may be formed before the formation of trenches 50A-50H or before or after formation of doped region 32B.

Figure 14:
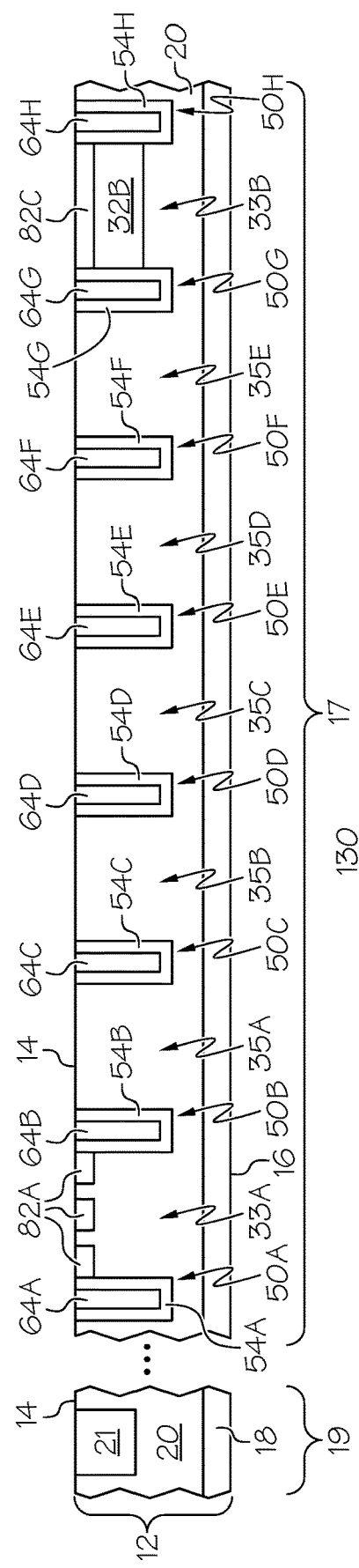
FIG. 14 is a cross-sectional view of the semiconductor component of FIG. 13 at a later stage of manufacture.

Referring now to FIG. 14, screen oxide layer 69 is removed to expose surface 14, enhanced doped regions 82A and 82C, the exposed portions of polysilicon fill material 64A-64H, and the exposed portions of dielectric layers 54A-54H, which are cleaned using a wet HF etching technique to remove any native oxide that may be present.

Figure 15:
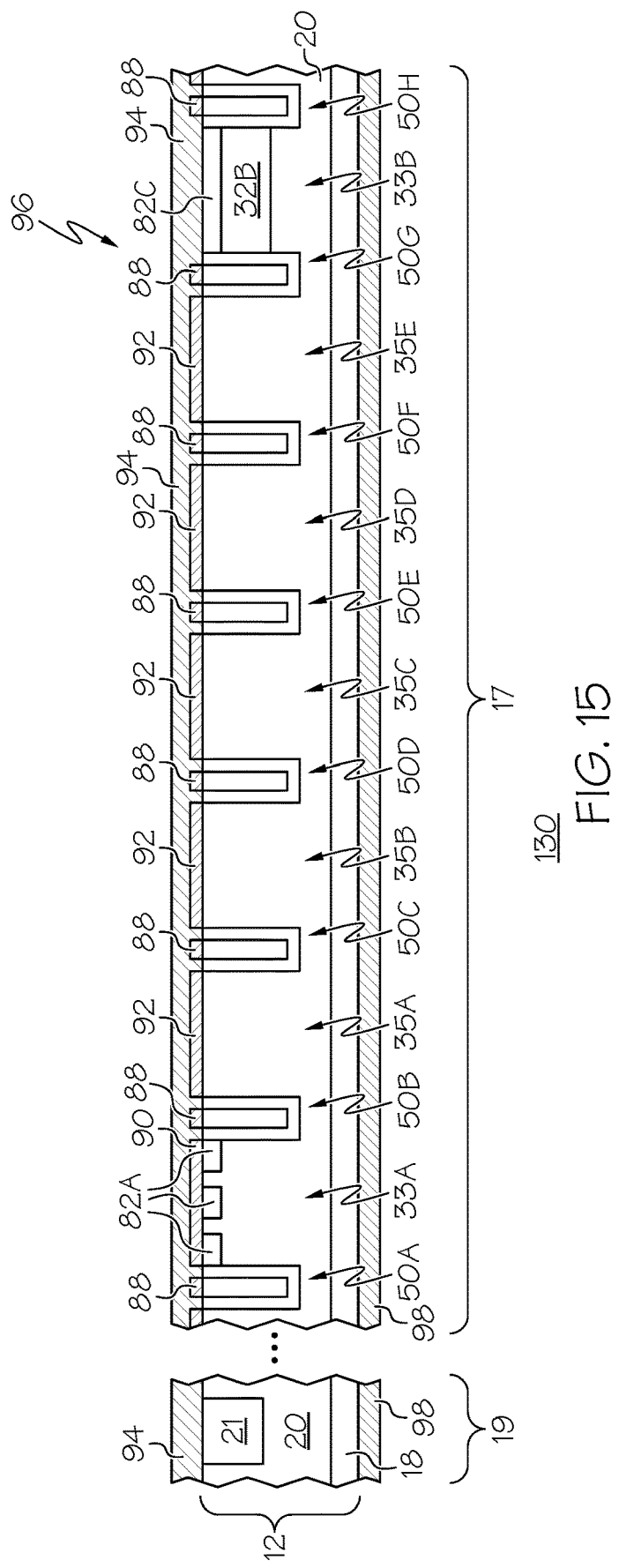
FIG. 15 is a cross-sectional view of the semiconductor component of FIG. 14 at a later stage of manufacture.

Referring now to FIG. 15, a barrier metal deposition process is performed in which a barrier metal is deposited on dielectric layers 54A-54H, polysilicon fill material 64A-64H, enhanced doped region 82A, and portions of surface 14 in at least mesa structures 35A-35E. As described above, forming a barrier metal is not shown as being formed in edge termination region 19. Likewise, metal layer 94 is shown as being formed in contact with epitaxial shown. Likewise, metal layer 94 is shown as being formed in contact with epitaxial layer 20 and edge terminal structure 21 in edge termination region 19 because a silicide layer is not shown as being formed in this region. However, those skilled in the art will appreciate that metal layer 94 can be in contact with a silicide layer in edge terminal region 19 if a silicide had been formed in edge termination region 19. In accordance with an embodiment, the barrier metal includes a nickel platinum metal alloy having a thickness ranging from about 100 Å to about 2,000 Å. By way of example, the nickel platinum metal alloy has a thickness of about 700 Å. The nickel platinum metal alloy is treated to a rapid thermal anneal in a nitrogen ambient at a temperature ranging from about 300° C. to about 700° C. for a time ranging from about 15 seconds to about 120 seconds. The heat treatment causes the nickel platinum metal alloy to react with the silicon to form nickel platinum silicide in all regions in which the nickel platinum metal alloy is in contact with silicon or polysilicon. Thus, nickel platinum silicide layers 88 are formed from polysilicon fill material 64A-64H in trenches 50A-50H, respectively, nickel platinum silicide layers 90 are formed from mesa structure 33A and enhanced doped region 82A, and nickel platinum silicide layers 92 are formed from the exposed portions of surface 14 in mesa structures 35A-35E. The unreacted nickel platinum metal alloy is removed using for example a hot SPM strip. The hot SPM strip solution may be comprised of sulfuric acid and hydrogen peroxide. It should be noted that the barrier metal is not limited to nickel platinum alloys. Other suitable materials for the barrier metal layers include titanium nitride, titanium, tungsten, platinum, aluminum copper alloys, or the like. In addition, the number of metal layers forming the barrier metal is not limited to a single metal layer, but may be comprised of one, two, three, or more metal layers.

A metal layer 94 is formed in contact with the barrier metal layer or layers. Suitable materials for metal layer 94 include aluminum, nickel, silver, or the like. Silicide layers 88, 90, and 92, the barrier metal layers, and metal layer 94 form an anode or anode contact 96 of Schottky device 130 and also may be referred to as a Schottky metallization system or a Schottky contact. A conductor 98 is formed in contact with surface 16 and serves as a cathode or cathode contact for Schottky device 130 and may be referred to as a cathode metallization system. Suitable metallization systems for conductor 98 include a gold alloy, titanium-nickel-gold, titanium-nickel-silver, or the like. It should be noted that the metal of the portions of the metallization system in contact with mesa structures 33A and 33B that include multi-concentration dopant profiles, i.e., mesa structures 33A and 33B may be different from the metal of the portions of the metallization system that contact mesa structures 33A and 33B in which the multi-concentration dopant profiles are absent, e.g., mesa structures 35A-35E. Thus, silicide layers 88 in combination with portions of metal layer 94 form ohmic contact portions to the electrically conductive material 64A-64H in trenches 50A-50H, respectively, where electrically conductive material 64A-64H may be polysilicon fill material; silicide layers 90 in combination with portions of metal layer 94 form a contact to enhanced doped regions 82A and mesa structure 33A and a contact to doped region 32B and enhanced doped region 82C that are between an ohmic contact and conventional Schottky contacts; and silicide layers 92 in combination with portions of metal layer 94 form conventional Schottky contacts to mesa structures 35A-35E. It should be noted that a contact formed by a barrier metal such as metal 92 and a lightly doped epitaxial layer, e.g., a dopant concentration of about $10^{15}/cm^3$, forms a conventional Schottky contact and a contact formed by a metal such as metal 88 and a highly doped semiconductor material, e.g., a dopant concentration of about $10^{19}/cm^3$, such as N-type semiconductor material 64 forms a conventional Ohmic contact.

Figure 16:
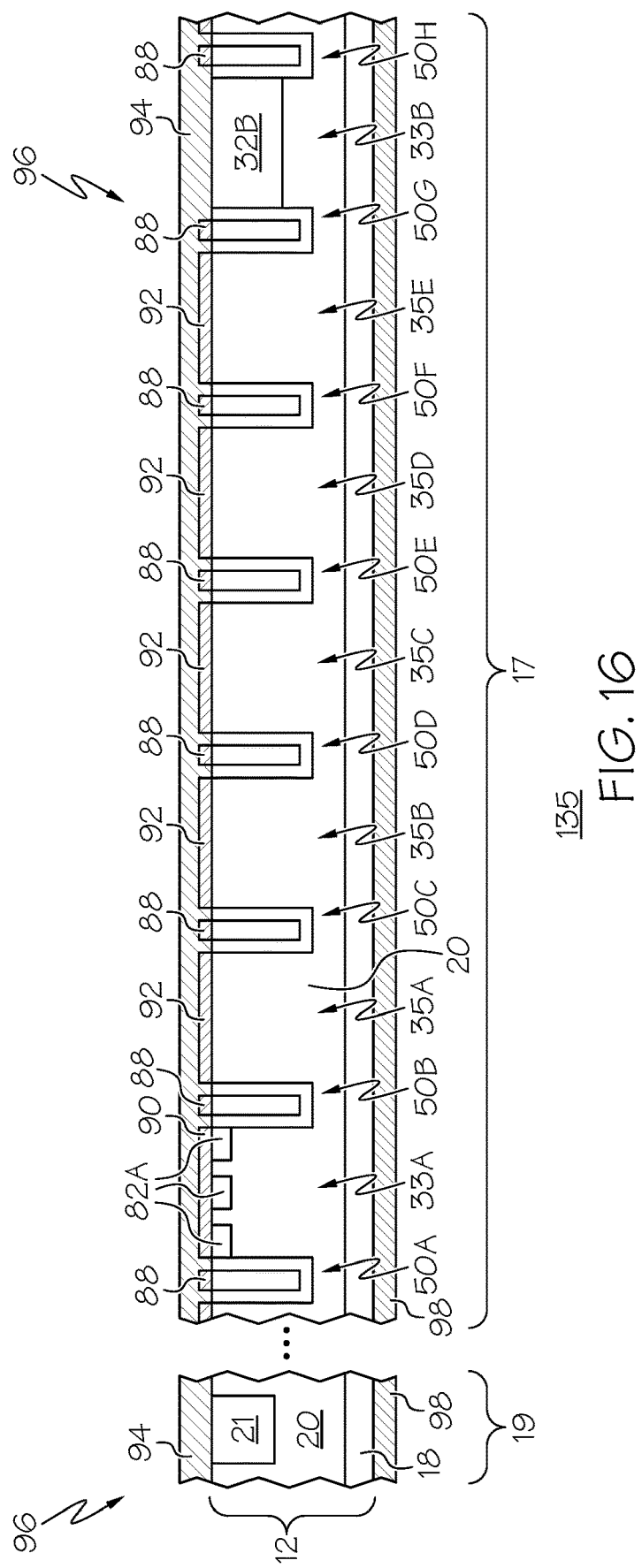
FIG. 16 is a cross-sectional view of a semiconductor component during manufacture in accordance with another embodiment of the present invention.

FIG. 16 is a cross-sectional view of a semiconductor component 135 in accordance with another embodiment of the present invention. By way of example, semiconductor component 135 is a Schottky device. Semiconductor component 135 is similar to semiconductor component 130 (shown in FIG. 15) except that enhanced doped region 82C is absent from semiconductor component 135.

Figure 17:
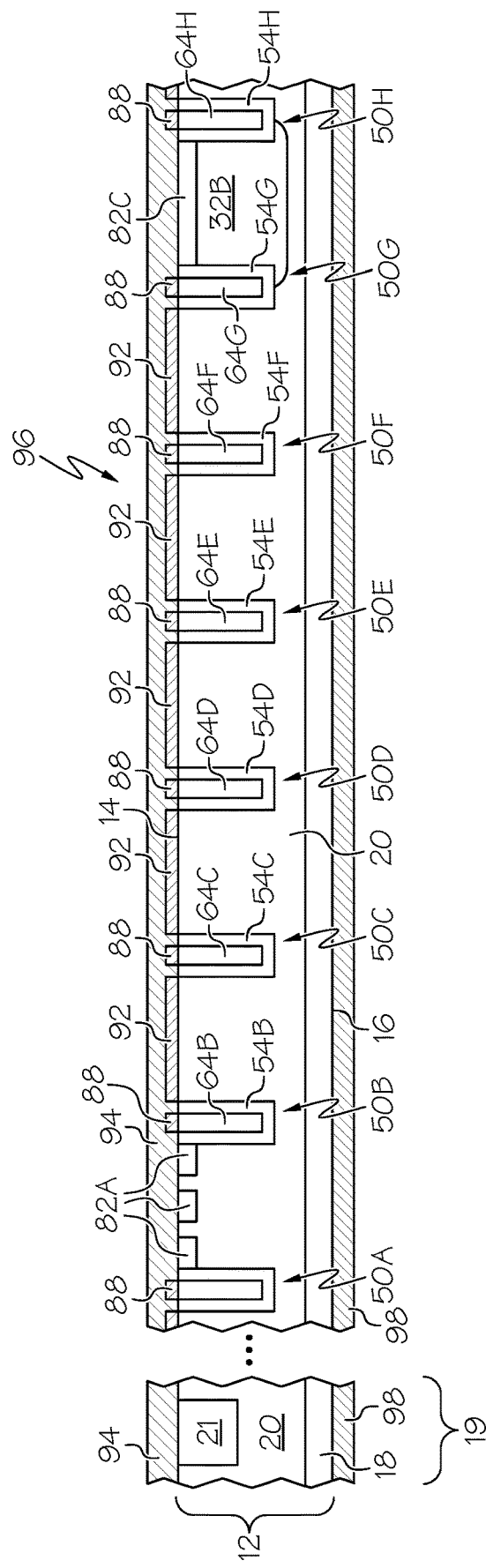
FIG. 17 is a cross-sectional view of a semiconductor component during manufacture in accordance with another embodiment of the present invention.

FIG. 17 is a cross-sectional view of a semiconductor component 140 in accordance with another embodiment of the present invention. Semiconductor component 140 is similar to semiconductor component 130 (shown in FIG. 15) except that doped region 32B extends further into epitaxial layer 20 than trenches 50A-50H extend into epitaxial layer 20 and silicide layer 90 is absent between metal layer 94 and mesa structure 33A.

FIG. 18 is a cross-sectional view of a semiconductor component 145 in accordance with another embodiment of the present invention. By way of example, semiconductor component 145 is a Schottky device. Semiconductor component 145 is similar to semiconductor component 135 (shown in FIG. 16) except that doped region 32B extends further into epitaxial layer 20 than trenches 50A-50H extend into epitaxial layer 20.

Figure 19:
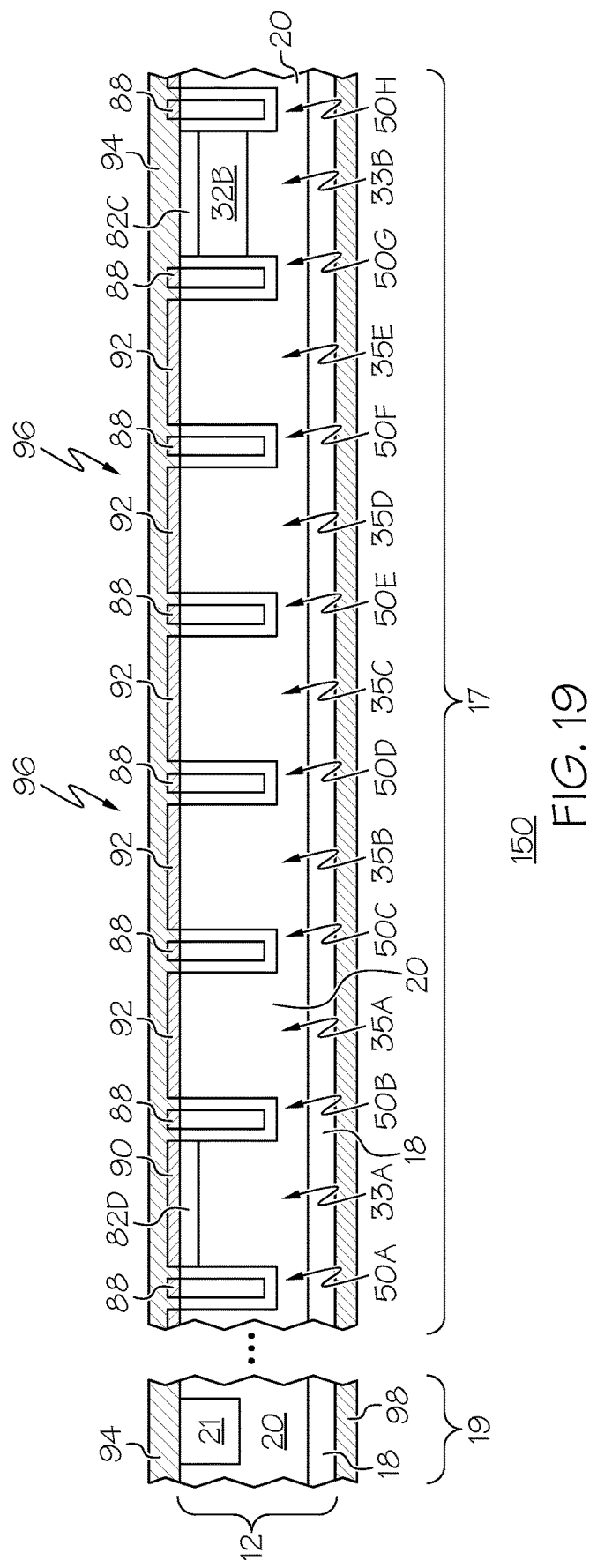
FIG. 19 is a cross-sectional view of a semiconductor component during manufacture in accordance with another embodiment of the present invention.

FIG. 19 is a cross-sectional view of a semiconductor component 150 in accordance with another embodiment of the present invention. By way of example, semiconductor component 150 is a Schottky device. Semiconductor component 150 is similar to semiconductor component 130 (shown in FIG. 15) except that enhanced doped regions 82A are replaced by a single enhanced doped region 82D. Single enhanced doped regions 82C and 82D may be formed using the same doping step. Trenches 50A-50H extend into further into epitaxial layer 20 than doped region 32B extends into epitaxial layer 20.

Figure 20:
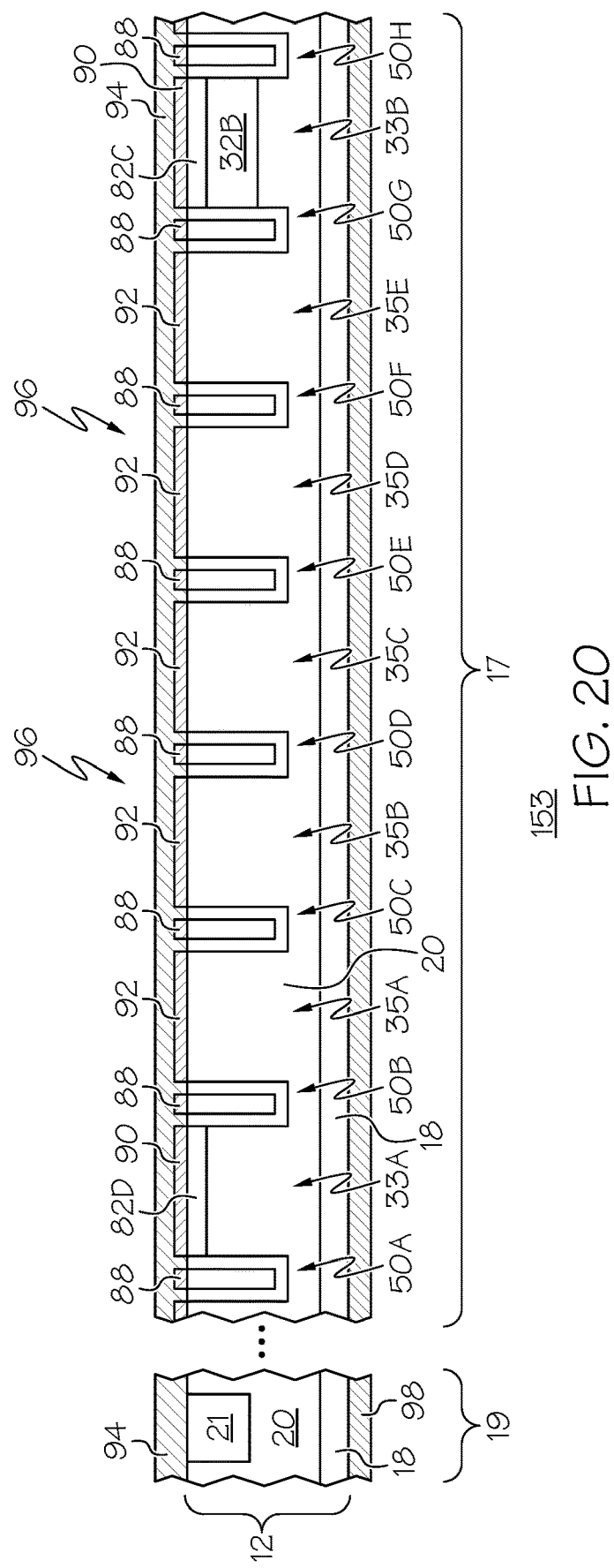
FIG. 20 is a cross-sectional view of a semiconductor component during manufacture in accordance with another embodiment of the present invention.

FIG. 20 is a cross-sectional view of a semiconductor component 153 in accordance with another embodiment of the present invention. By way of example, semiconductor component 153 is a Schottky device. Semiconductor component 153 is similar to semiconductor component 150 (shown in FIG. 19) except that silicide layers 90 are present between metal layer 94 and enhanced doped regions 82C and 82D. Trenches 50A-50H extend into further into epitaxial layer 20 than doped region 32B extends into epitaxial layer 20.

Figure 21:
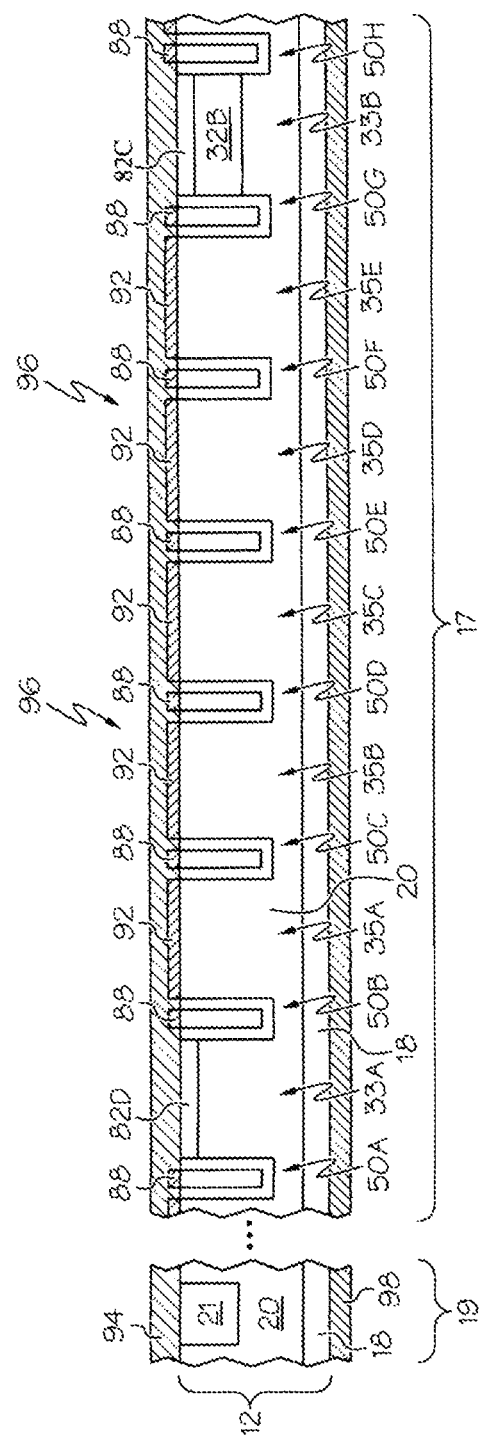
FIG. 21 is a cross-sectional view of a semiconductor component during manufacture in accordance with another embodiment of the present invention.

FIG. 21 is a cross-sectional view of a semiconductor component 155 in accordance with another embodiment of the present invention. By way of example, semiconductor component 155 is a Schottky device. Semiconductor component 155 is similar to semiconductor component 150 (shown in FIG. 19) except that silicide layer 90 between metal layer 94 and enhanced doped region 82D is absent.

Figure 22:
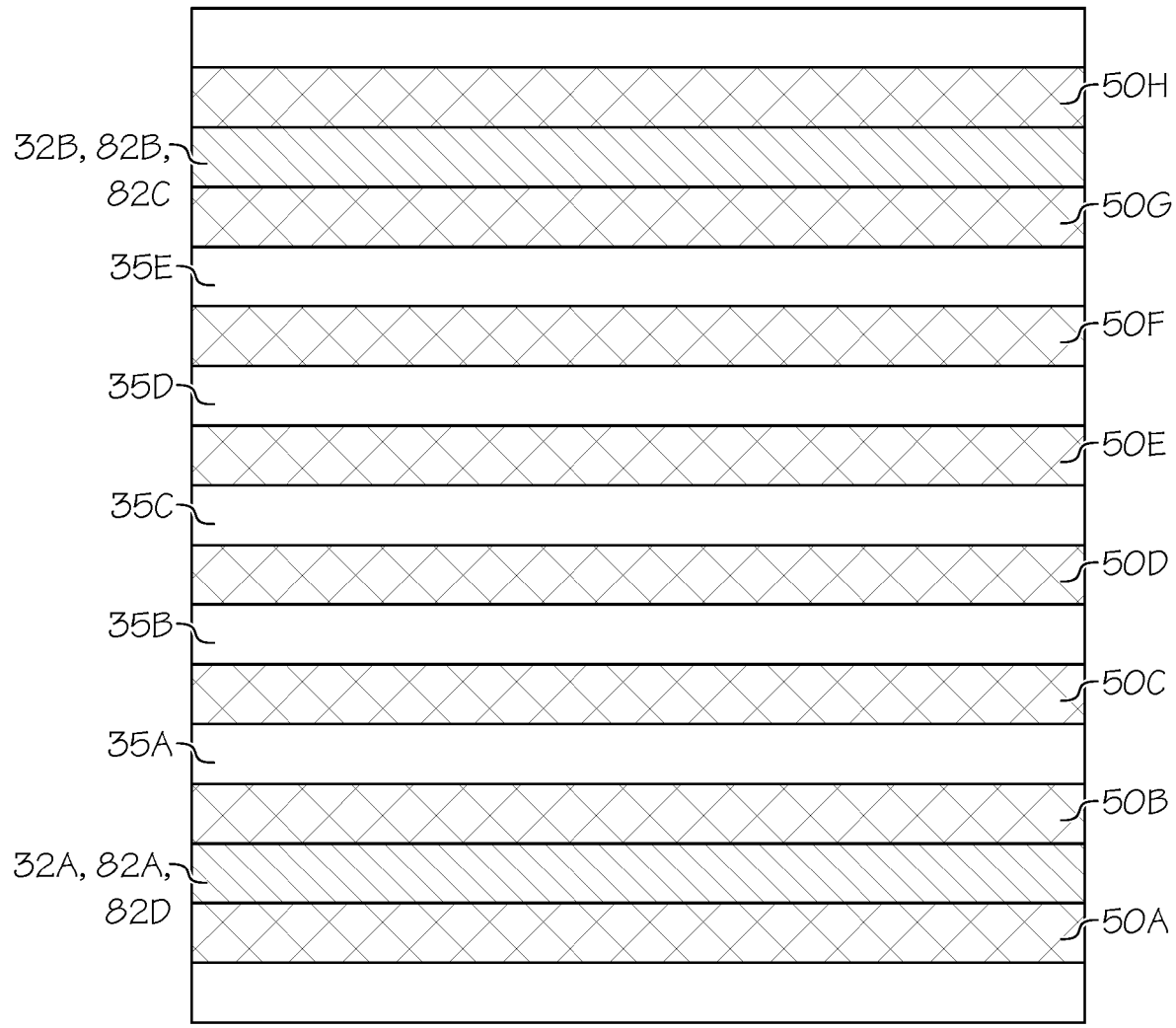
FIG. 22 is a top view of a layout of a semiconductor component in accordance with another embodiment of the present invention.

FIG. 22 is a top view of a semiconductor component illustrating the frequency of the PESD implants for a striped layout configuration. It should be noted that semiconductor components 10, 100, 115, 120, 130, 135, 140, 145, 150, 153, and 155 of FIGS. 1-21 illustrate embodiments in which p-type electrostatic discharge (PESD) implants have a frequency of 16.7% or 4:1 of the active region. The ratio refers to the number of trenches that do not touch any PESD implant layer in a repeating cell for the striped layout configuration. The frequency can be a ratio or a percentage of the active region in a repeating cell. Trenches 50C, 50D, 50E, and 50F do not touch any of the PESD implant layers 32A/82A, 32B/82B, or 32B/82C, or 82D. Thus, the PESD frequency is 16.7% or 4:1 of the active area.

Figure 23:
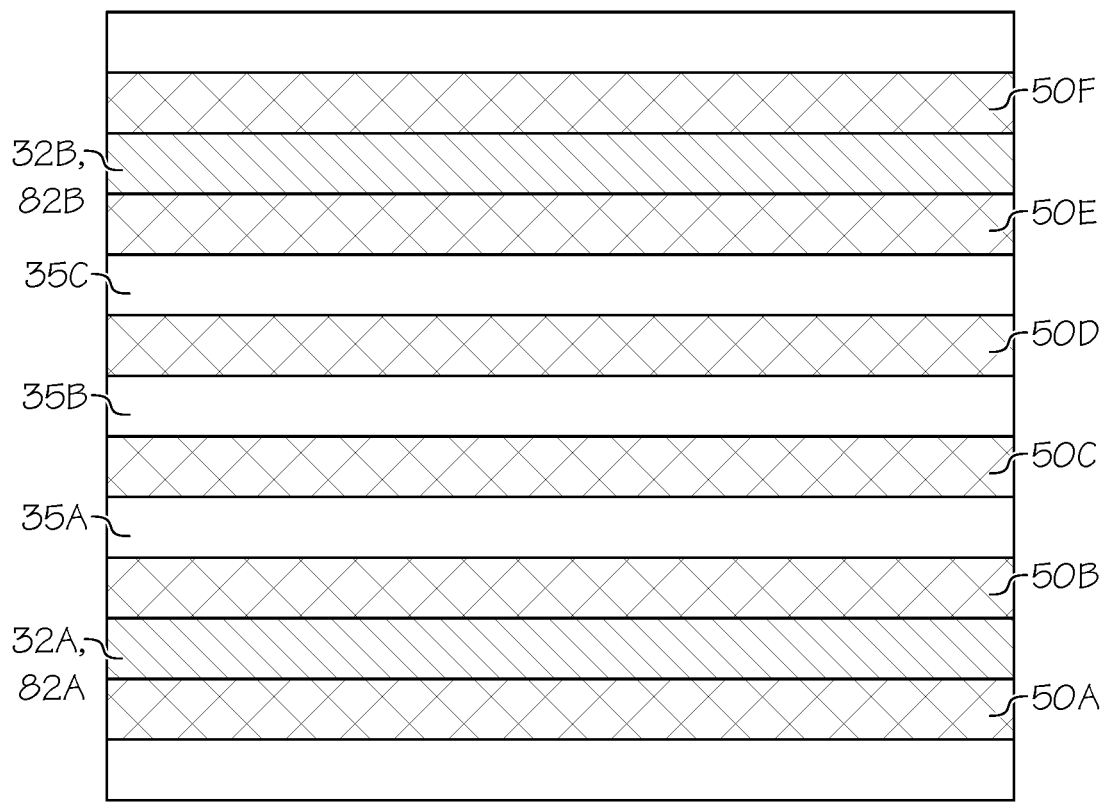
FIG. 23 is a top view of a layout of a semiconductor component in accordance with another embodiment of the present invention.

It should be further noted that the PESD implant frequency is not a limitation. FIG. 23 illustrates a top view of an embodiment in which the frequency is 25% or 2:1 of the active area and is included to further illustrate the PESD frequency for a striped layout configuration. As discussed with reference to FIG. 22, the ratio refers to the number of trenches that do not touch any PESD implant layer in a repeating cell. The frequency can be a ratio or a percentage of the active region in a repeating cell. FIG. 23 is a top view of a semiconductor component illustrating the frequency of the PESD implants of 25% or a ratio of 2:1. In the embodiment of FIG. 23, trenches 50C and 50D do not touch any of the PESD implant layers that form dopant layers 32A/82A, 32B/82B, or 32B/82C, or 82D. Thus, the PESD frequency is 25% or 2:1 of the active area. FIGS. 24-29 illustrate embodiments of a semiconductor component having a frequency of 25% for a striped layout configuration.

FIG. 24 is a cross-sectional view of a semiconductor component 200 in accordance with another embodiment of the present invention. Semiconductor component 200 differs from semiconductor component 10 of FIG. 9 in that semiconductor component 200 has a PESD frequency of 25% or 2:1. Thus, each repeating cell of semiconductor component 200 has six trenches (trenches 50A-50F) rather than the eight trenches (trenches 50A-50H) of semiconductor component 10. What is shown in FIG. 24 is an embodiment in which trenches 50A-50F extend further into epitaxial layer 20 than doped regions 32A and 32B extend into epitaxial layer 20.

FIG. 25 is a cross-sectional view of a semiconductor component 220 in accordance with another embodiment of the present invention. What is shown in FIG. 25 is an embodiment in which doped regions 32A and 32B extend further into epitaxial layer 20 than trenches 50A-50F extend into epitaxial layer 20. Semiconductor component 220 differs from semiconductor component 100 of FIG. 10 in that semiconductor component 220 has a PESD frequency of 25% or 2:1. Thus, each repeating cell of semiconductor component 220 has six trenches (trenches 50A-50F) rather than the eight trenches (trenches 50A-50H) of semiconductor component 100.

Figure 26:
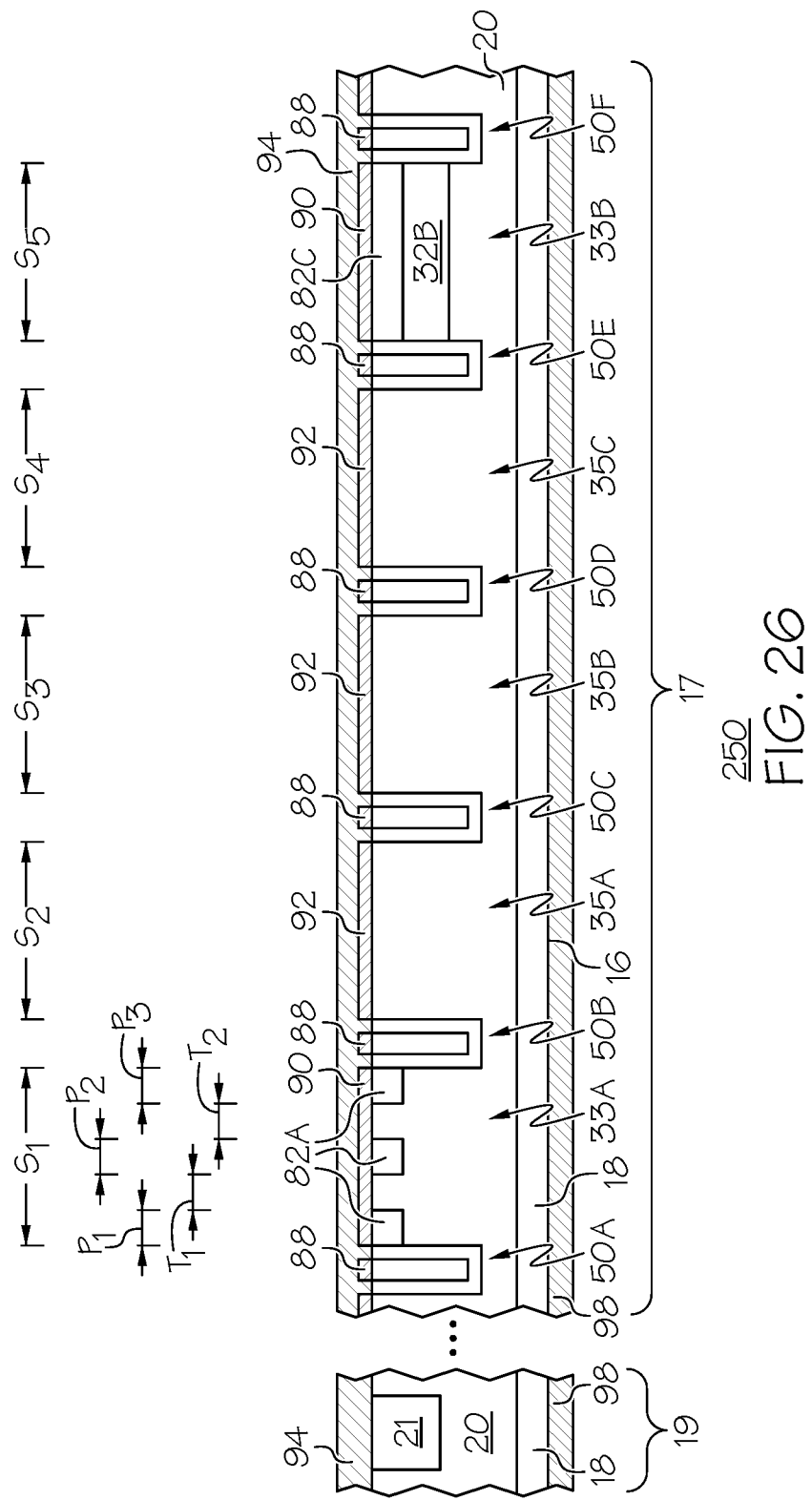
FIG. 26 is a cross-sectional view of a semiconductor component during manufacture in accordance with another embodiment of the present invention.

FIG. 26 is a cross-sectional view of a semiconductor component 250 in accordance with another embodiment of the present invention. Semiconductor component 250 differs from semiconductor component 130 of FIGS. 13-15 in that semiconductor component 250 has a PESD frequency of 25% or 2:1 and semiconductor component 250 has a silicide layer 90 between metal layer 94 and doped region 82C. Each repeating cell of semiconductor component 250 has six trenches (trenches 50A-50F) rather than the eight trenches (trenches 50A-50H) of semiconductor component 130. It should be noted that mesa structures 33A, 33B, and 35A-35F can have variable widths or distances $S_1$, $S_2$, $S_3$, $S_4$, and $S_5$ between adjacent trenches; enhanced doped regions 82A can have variable widths $P_1$, $P_2$, and $P_3$; and enhanced doped regions 82A can have variable spacing or distances $T_1$ and $T_2$ between them. By way of example, enhanced doped regions 82A may be comprised of three doped regions $82A_1$, $82A_2$, and $82A_3$, where doped region $82A_1$ has a width $P_1$, doped region $82A_2$ has a width $P_2$, doped region $82A_3$ has a width $P_3$, doped region $82A_1$ is spaced apart from doped region $82A_2$ by a distance $T_1$ and doped region $82A_2$ is spaced apart from doped region $82A_3$ by a distance $T_2$. Widths $S_1$, $S_2$, $S_3$, $S_4$, and $S_5$ may be equal or they may be different from each other; widths $P_1$, $P_2$, and $P_3$ may be equal or they may be different from each other; and distances $T_1$ and $T_2$ may be equal or they may be different from each other.

Figure 27:
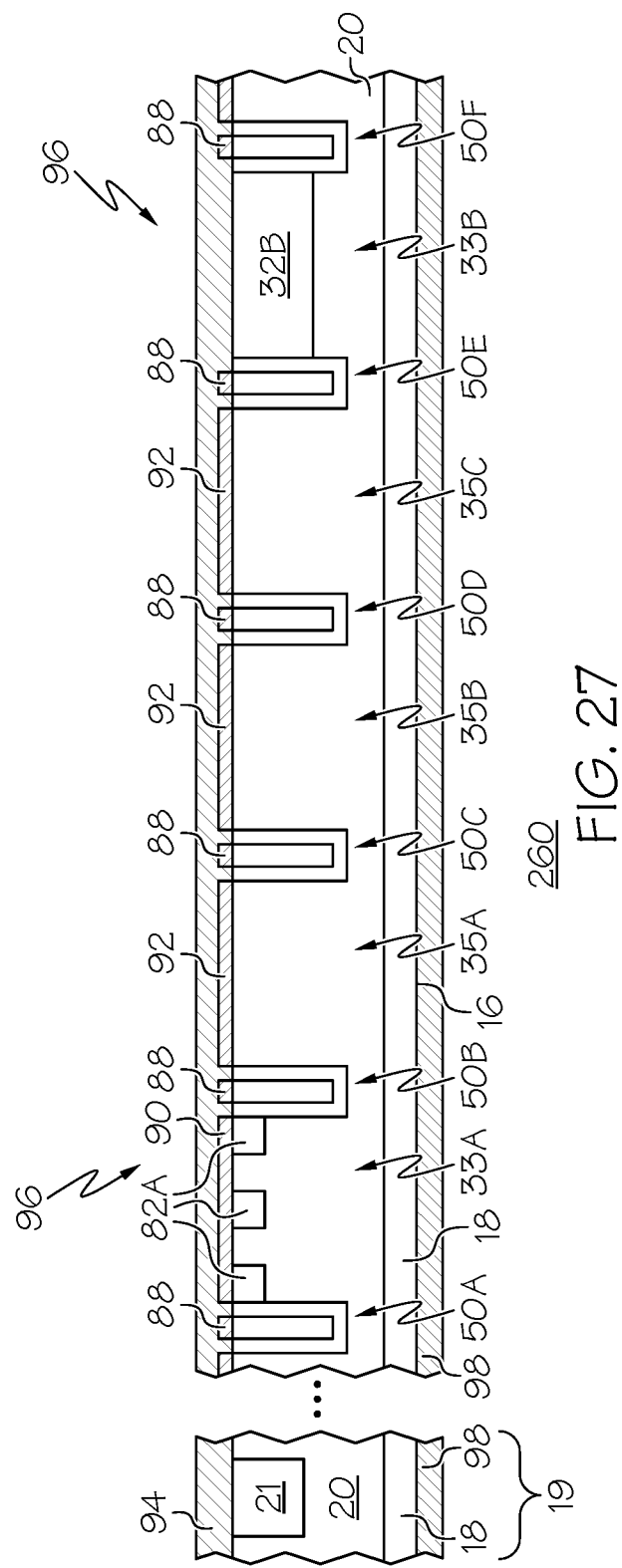
FIG. 27 is a cross-sectional view of a semiconductor component during manufacture in accordance with another embodiment of the present invention.

FIG. 27 is a cross-sectional view of a semiconductor component 260 in accordance with another embodiment of the present invention. Semiconductor component 260 differs from semiconductor component 250 of FIG. 26 in that semiconductor component 260 does not include enhanced doped region 82C and a silicide layer between metal layer 94 and doped region 32B of mesa structure 33B.

Figure 28:
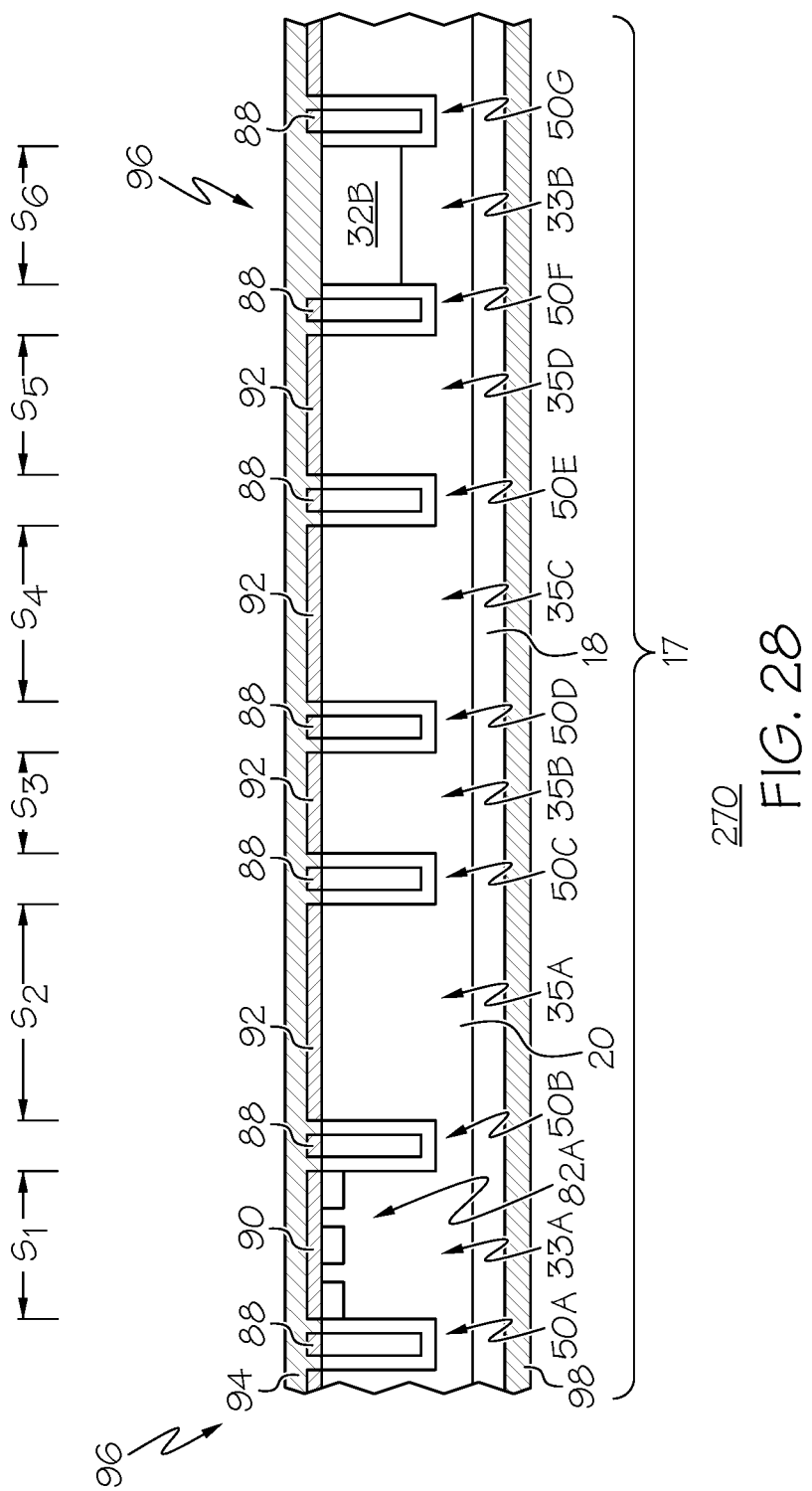
FIG. 28 is a cross-sectional view of a semiconductor component during manufacture in accordance with another embodiment of the present invention.

FIG. 28 is a cross-sectional view of a semiconductor component 270 in accordance with another embodiment of the present invention. Semiconductor component 270 differs from semiconductor component 135 of FIG. 16 in that the distance between the trenches can be different. Thus, each repeating cell of semiconductor component 270 has seven trenches (trenches 50A-50G) rather than the eight trenches (trenches 50A-50H) of semiconductor component 10. What is shown in FIG. 28 is an embodiment in which doped region 32A is absent from mesa structure 33A and trenches 50A-50G extend further into epitaxial layer 20 than doped region 32B extends into epitaxial layer 20. For the sake of clarity, edge termination structure 21 has not been included in block form in FIG. 28 but is typically present.

FIG. 28 further illustrates that spacings $S_1$, $S_2$, $S_3$, $S_4$, $S_5$, and $S_6$ may be different from each other.

Figure 29:
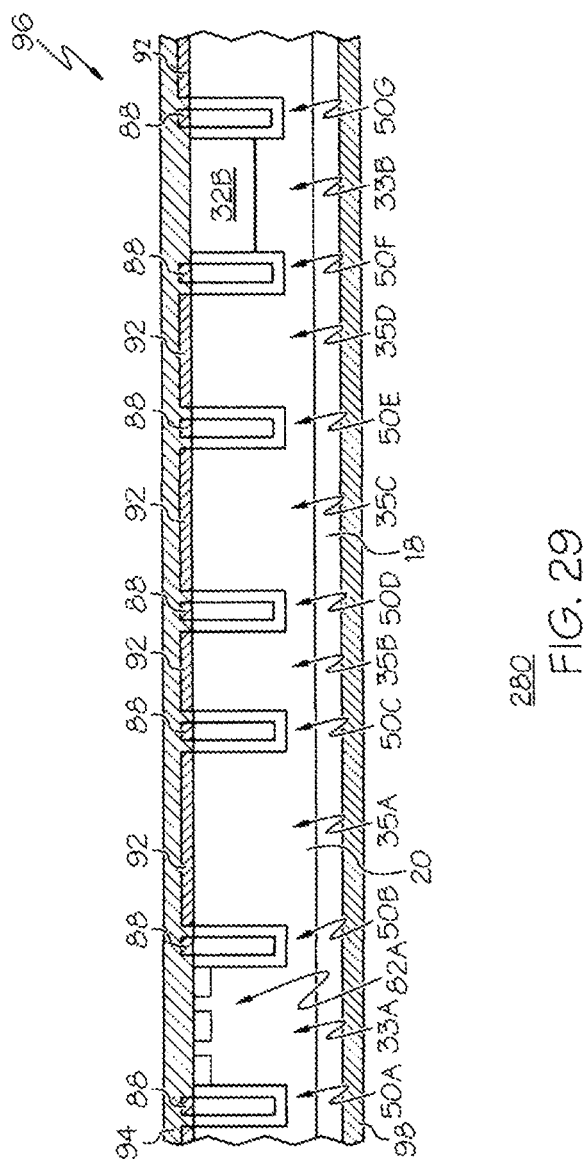
FIG. 29 is a cross-sectional view of a semiconductor component during manufacture in accordance with another embodiment of the present invention.

FIG. 29 is a cross-sectional view of a semiconductor component 280 in accordance with another embodiment of the present invention. Semiconductor component 280 differs from semiconductor component 270 of FIG. 28 in that a silicide layer is absent between metal layer 94 and enhanced doped region 82A in mesa structure 33A. For the sake of clarity, edge termination structure 21 has not been included in block form in FIG. 29 but is typically present.

Figure 30:
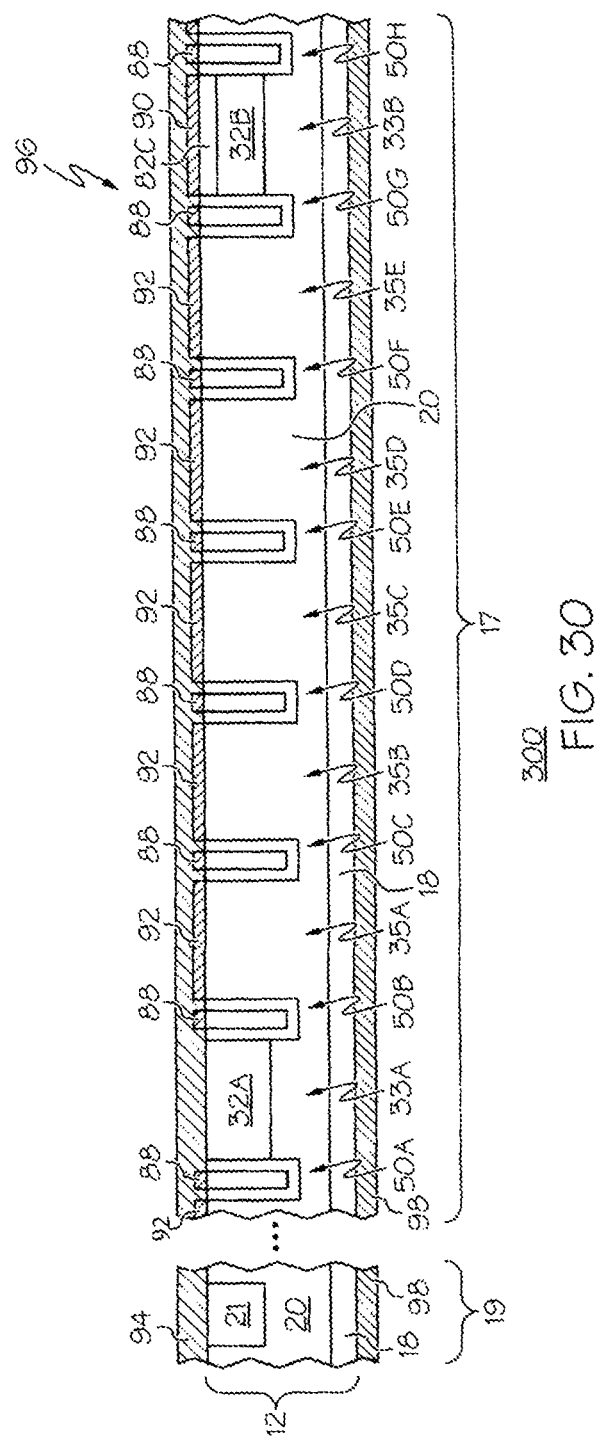
FIG. 30 is a cross-sectional view of a semiconductor component during manufacture in accordance with another embodiment of the present invention.

FIG. 30 is a cross-sectional view of a semiconductor component 300 in accordance with another embodiment of the present invention. Semiconductor component 300 differs from semiconductor component 150 of FIG. 19 in that enhanced doped region 82D is absent from mesa structure 33A of semiconductor component 300, doped region 32A is present in mesa structure 33A in semiconductor component 300, and there is a silicide layer 90 between metallic layer 94 and enhanced doped region 82C in mesa structure 33B.

Figure 31:
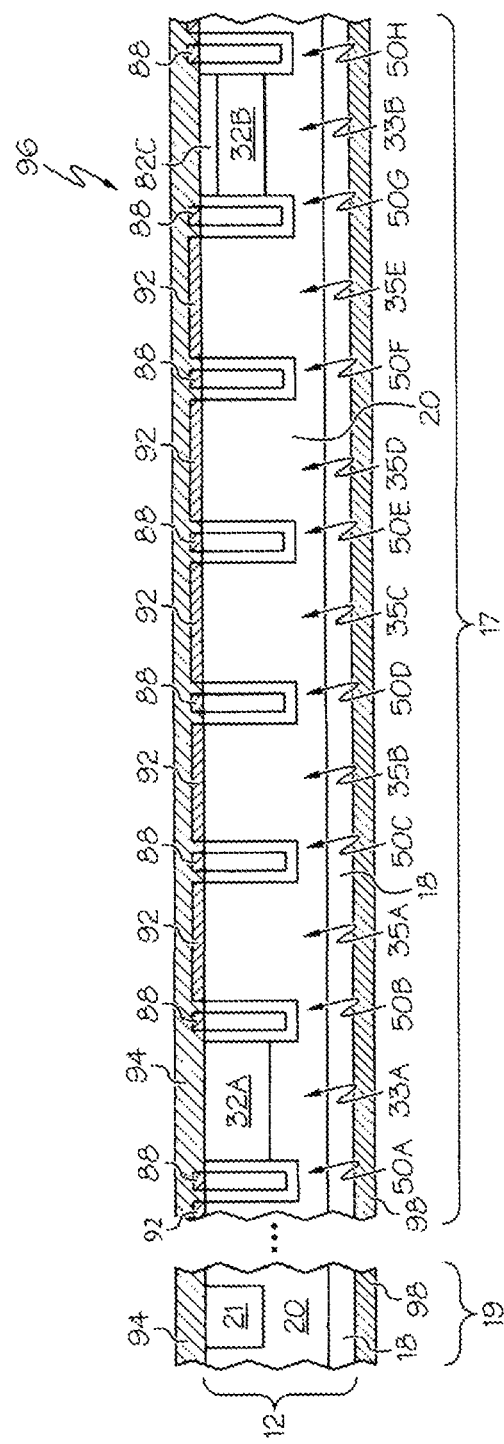
FIG. 31 is a cross-sectional view of a semiconductor component during manufacture in accordance with another embodiment of the present invention.

FIG. 31 is a cross-sectional view of a semiconductor component 310 in accordance with another embodiment of the present invention. Semiconductor component 310 differs from semiconductor component 300 of FIG. 30 in that a silicide layer 90 is absent between metallic layer 94 and enhanced doped region 82C in mesa structure 33B.

Figure 32:
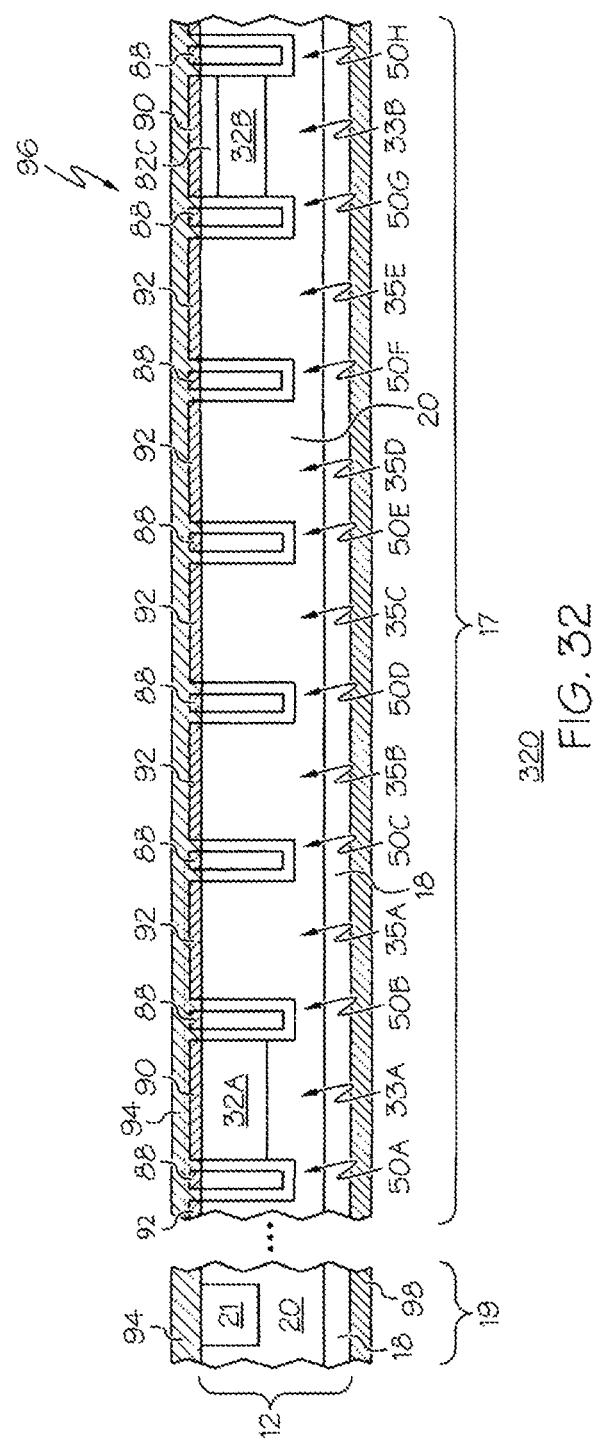
FIG. 32 is a cross-sectional view of a semiconductor component during manufacture in accordance with another embodiment of the present invention.

FIG. 32 is a cross-sectional view of a semiconductor component 320 in accordance with another embodiment of the present invention. Semiconductor component 320 differs from semiconductor component 300 of FIG. 30 in that a silicide layer 90 is present between metallic layer 94 and doped region 32A in mesa structure 33A.

Figure 33:
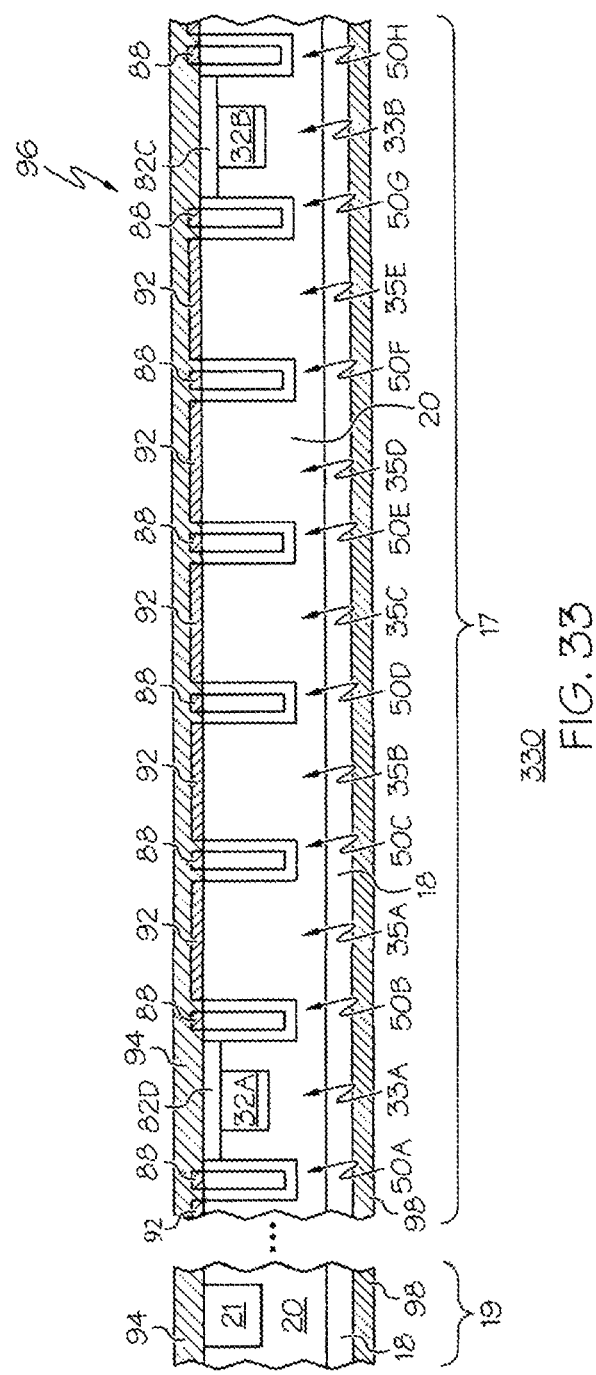
FIG. 33 is a cross-sectional view of a semiconductor component during manufacture in accordance with another embodiment of the present invention.

FIG. 33 is a cross-sectional view of a semiconductor component 330 in accordance with another embodiment of the present invention. Semiconductor component 330 is similar to semiconductor component 150 of FIG. 19 in having enhanced doped regions 82C and 82D, but differs from semiconductor component 150 of FIG. 19 in that doped regions 32A is present in FIG. 33 but does not extend across the entire width of mesa structure 33A and doped region 32B does not extend across the entire width of mesa structure 33B. Thus, doped region 32A has sidewalls that are spaced apart from trenches 50A and 50B and doped region 32B has sidewalls that are spaced apart from trenches 50G and 50H. Doped region 32A of semiconductor component 330 does not contact or touch the sidewalls of trenches 50A and 50B and doped region 32B does not contact or touch the sidewalls of trenches 50G and 50H. A silicide region or layer is absent between metal layer 94 and enhanced doped region 82D in mesa structure 33A and between metal layer 94 and enhanced doped region 82C in mesa structure 33B.

Figure 34:
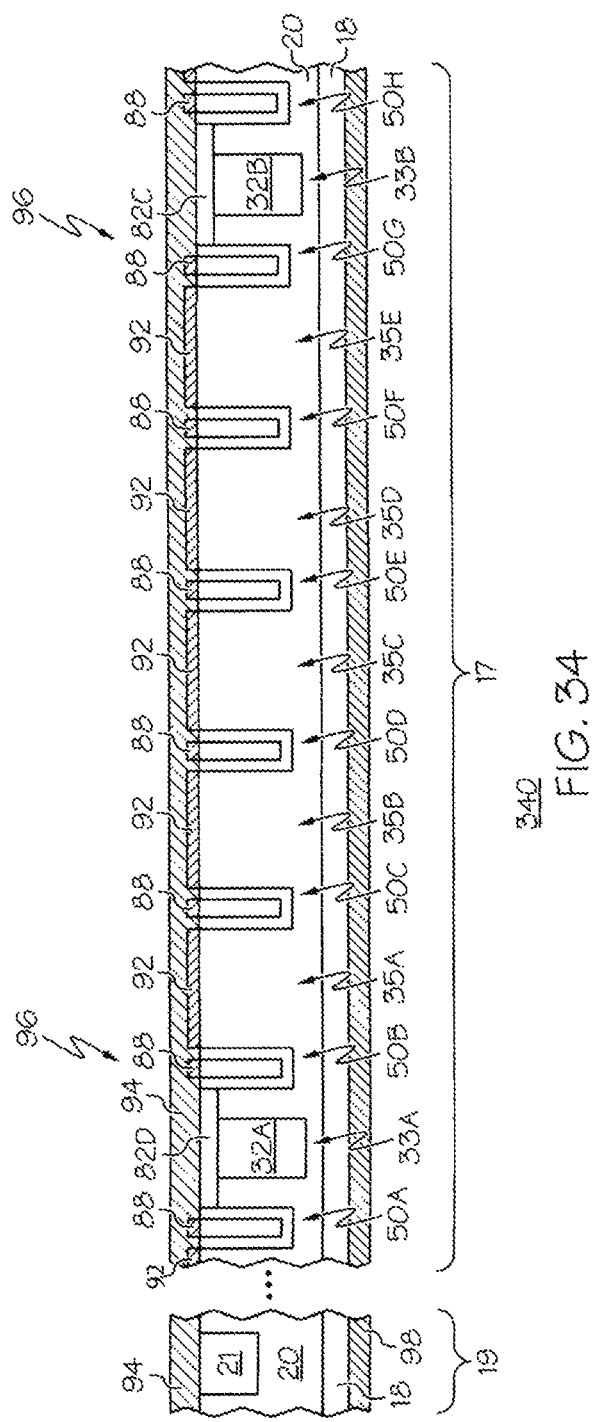
FIG. 34 is a cross-sectional view of a semiconductor component during manufacture in accordance with another embodiment of the present invention.

FIG. 34 is a cross-sectional view of a semiconductor component 340 in accordance with another embodiment of the present invention. Semiconductor component 340 differs from semiconductor component 330 of FIG. 33 in that doped regions 32A and 32B extend further into epitaxial layer 20 than trenches 50A-50H extend into epitaxial layer 20.

Figure 35:
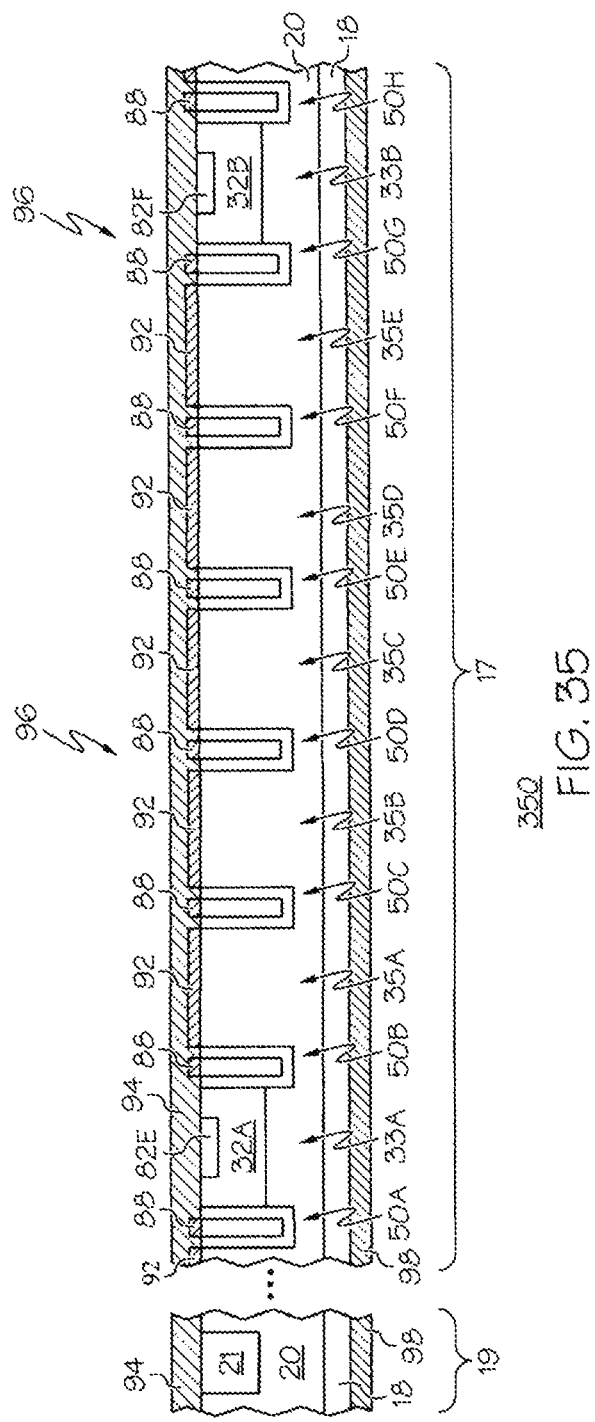
FIG. 35 is a cross-sectional view of a semiconductor component during manufacture in accordance with another embodiment of the present invention.

FIG. 35 is a cross-sectional view of a semiconductor component 350 in accordance with another embodiment of the present invention. Semiconductor component 350 is similar to semiconductor component 310 of FIG. 31 in that semiconductor components 350 and 310 have doped regions 32A and 32B and that silicide layers are absent between metal layer 94 and mesa structures 33A and 33B. Semiconductor component 350 has enhanced doped regions 82E and 82F that do not extend across the entire width of mesa structures 33A and 33B, respectively. Thus, enhanced doped region 82E has sidewalls that are spaced apart from trenches 50A and 50B and enhanced doped region 82F has sidewalls that are spaced apart from trenches 50G and 50H. Enhanced doped region 82E of semiconductor component 350 does not contact or touch the sidewalls of trenches 50A and 50B and enhanced doped region 82F does not contact or touch the sidewalls of trenches 50G and 50H.

Figure 36:
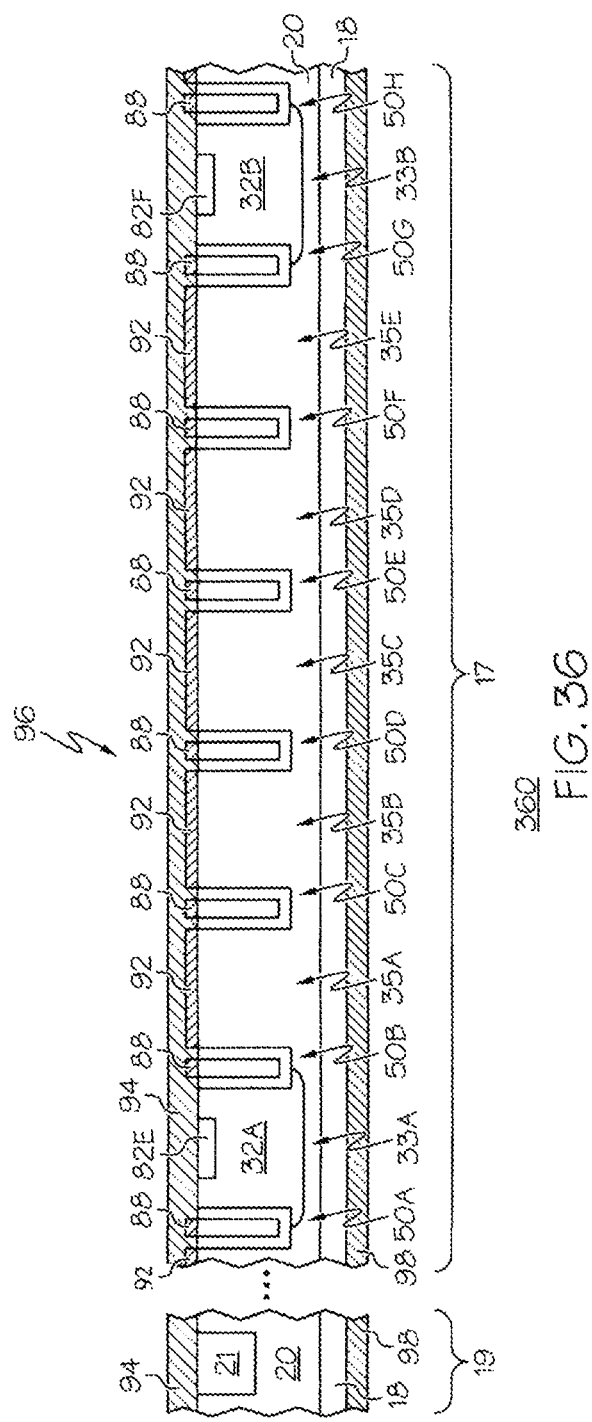
FIG. 36 is a cross-sectional view of a semiconductor component during manufacture in accordance with another embodiment of the present invention.

FIG. 36 is a cross-sectional view of a semiconductor component 360 in accordance with another embodiment of the present invention. Semiconductor component 360 differs from semiconductor component 350 of FIG. 35 in that doped regions 32A and 32B extend further into epitaxial layer 20 than trenches 50A-50H extend into epitaxial layer 20.

Figure 37:
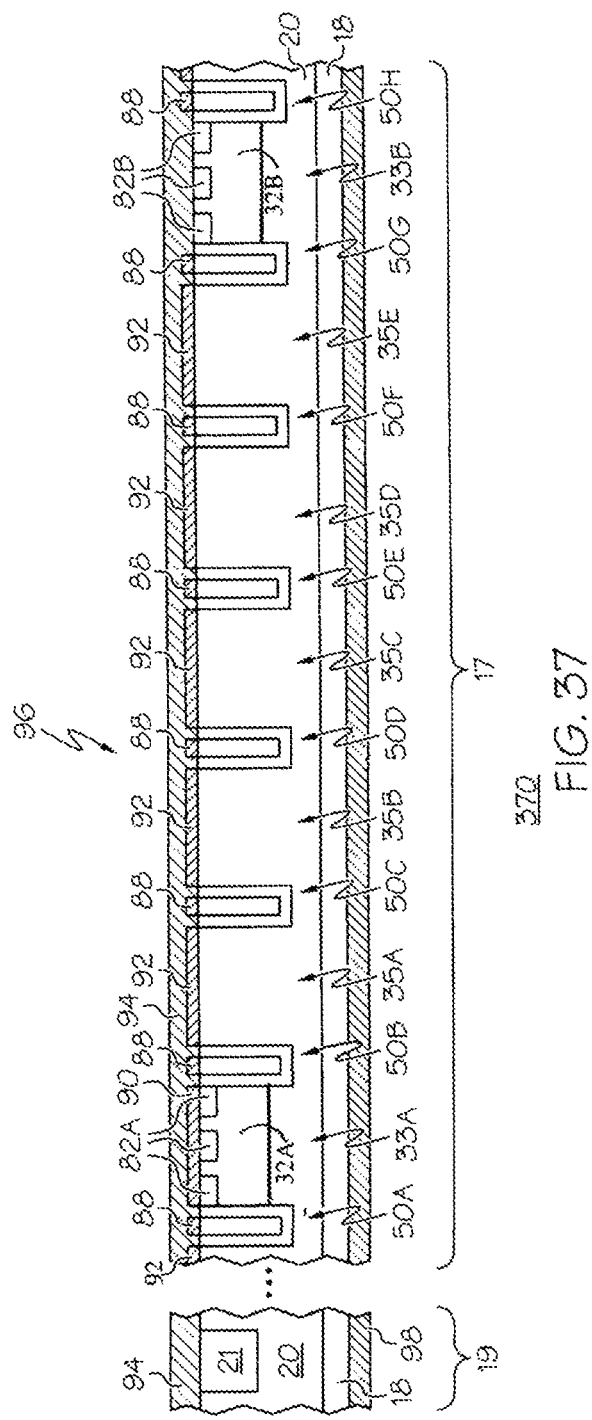
FIG. 37 is a cross-sectional view of a semiconductor component during manufacture in accordance with another embodiment of the present invention.

FIG. 37 is a cross-sectional view of a semiconductor component 370 in accordance with another embodiment of the present invention. Semiconductor component 370 differs from semiconductor component 350 of FIG. 35 in that enhanced doped regions 82E and 32F are replaced by fragmented enhanced doped regions 82A and 82B, respectively, and a silicide layer 90 is present between metal layer 94 and mesa structure 33A.

Figure 38:
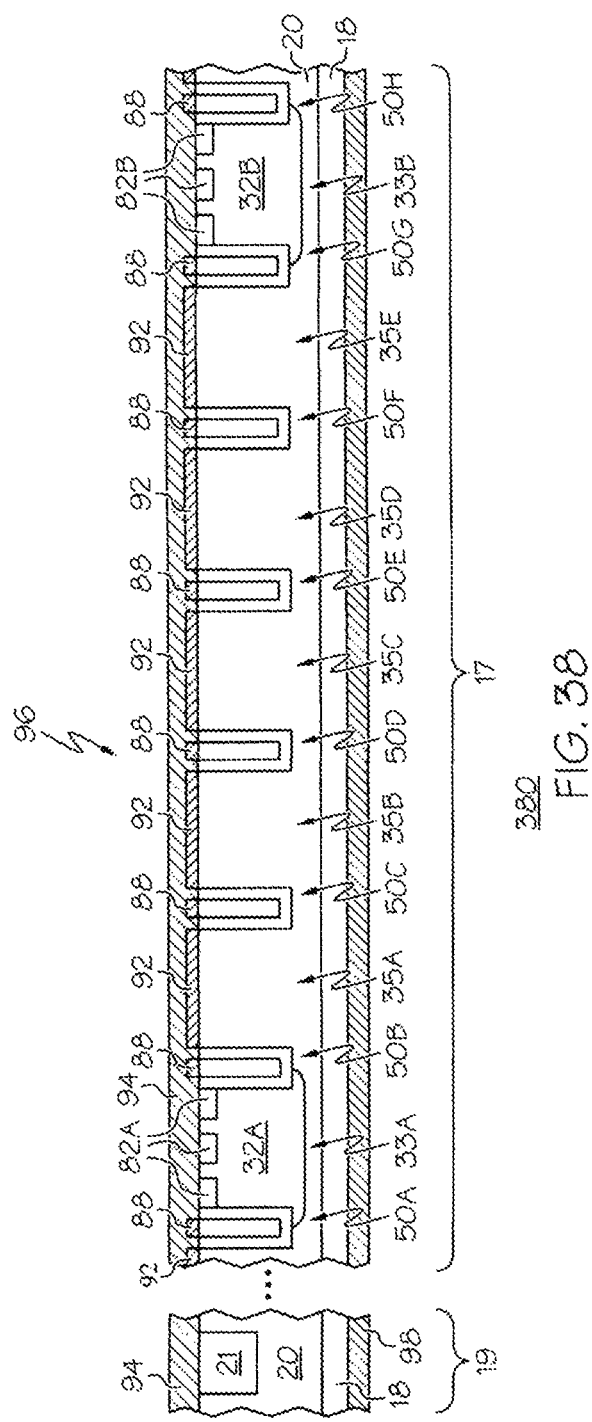
FIG. 38 is a cross-sectional view of a semiconductor component during manufacture in accordance with another embodiment of the present invention.

FIG. 38 is a cross-sectional view of a semiconductor component 380 in accordance with another embodiment of the present invention. Semiconductor component 380 differs from semiconductor component 370 of FIG. 37 in that doped regions 32A and 32B extend further into epitaxial layer 20 than trenches 50A-50H extend into epitaxial layer 20 and silicide layer 90 is absent from mesa structure 33A.

Figure 39:
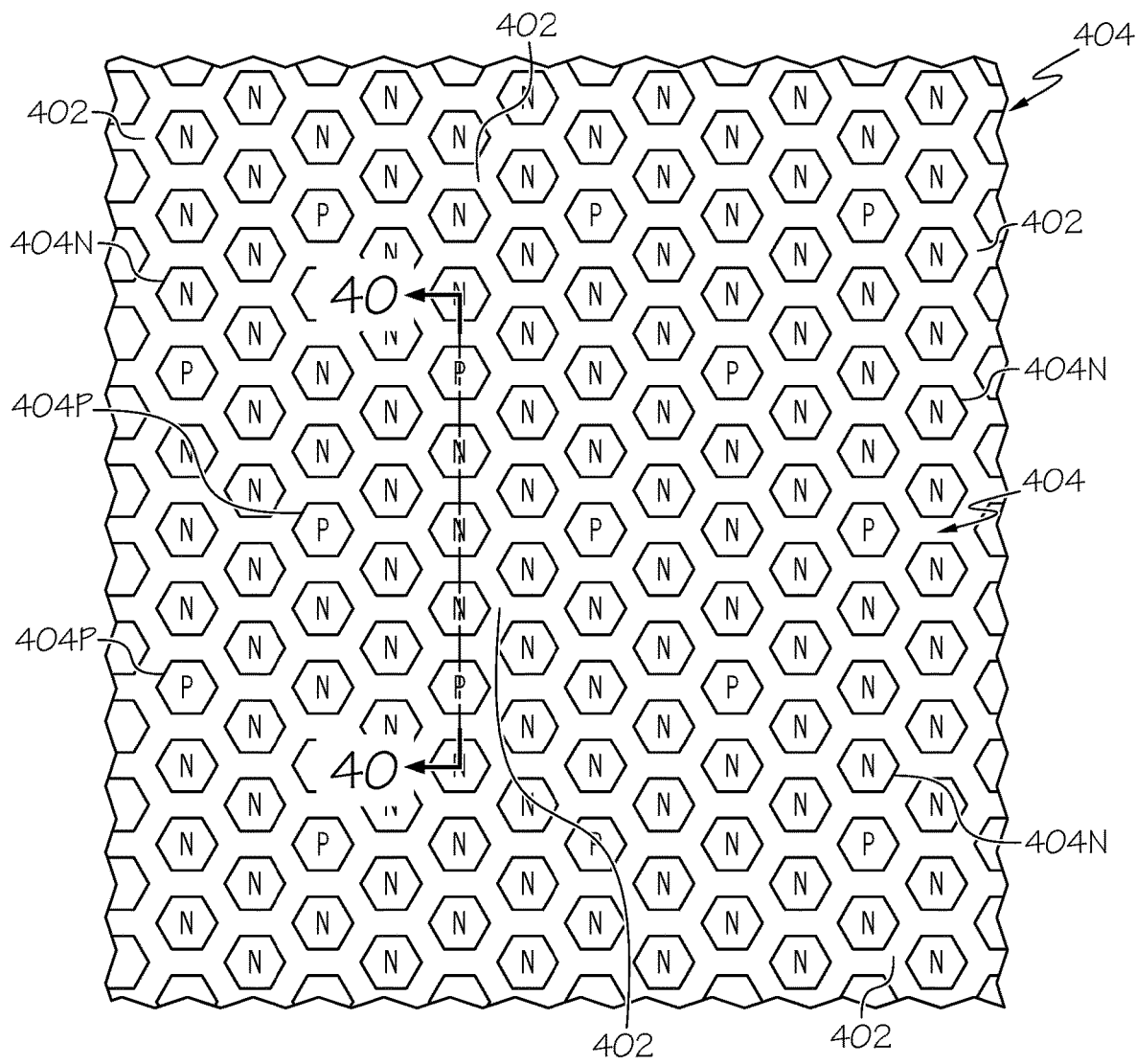
FIG. 39 is a top view of a layout of a semiconductor component in accordance with another embodiment of the present invention.

FIG. 39 is a top view of a semiconductor component 400 illustrating a hexagonal trench array 402 that defines a hexagonal array of mesa structures 404. For the sake of clarity, reference characters P and N have been appended to reference character 404 to identify mesa structures doped with a P-type impurity material (identified by reference character 404P) and mesa structures doped with an N-type impurity material (identified by reference character 404N). By way of example, mesa structures 404P have been implanted with an impurity material of P-type conductivity, which implants may be referred to as PESD implant structures or layers.

Figure 40:
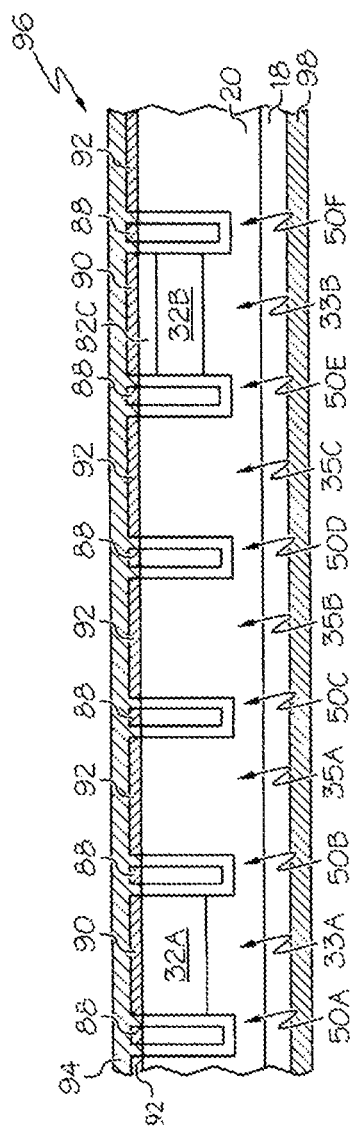
FIG. 40 is a cross-sectional view taken along section line 40-40 of FIG. 39 that illustrates an embodiment of the semiconductor component of FIG. 39.

FIG. 40 is a cross-sectional view of a semiconductor component 400A in accordance with an embodiment of the present invention. By way of example, FIG. 40 is a cross-sectional view taken along section line 40-40 of FIG. 39. Reference character A has been appended to reference character 400 to distinguish the embodiment of semiconductor component 400A from the embodiments of semiconductor components 400B, 400C, and 400D shown in FIGS. 41, 42, and 43, respectively. What is shown in FIG. 40 are trenches 50A, 50B, 50C, 50D, 50E, and 50F described with reference to FIG. 23, doped regions 32A and 32B formed in mesa structures 33A and 33B, respectively, and enhanced dopant region 82C. It should be noted that in the embodiment shown in FIG. 40, trenches 50A, 50B, 50C, 50D, 50E, and 50F may form trench portions of a hexagonal trench structure. The doping profile and silicide configuration of semiconductor component 400A is similar to that of semiconductor component 320 shown in FIG. 32.

Figure 41:
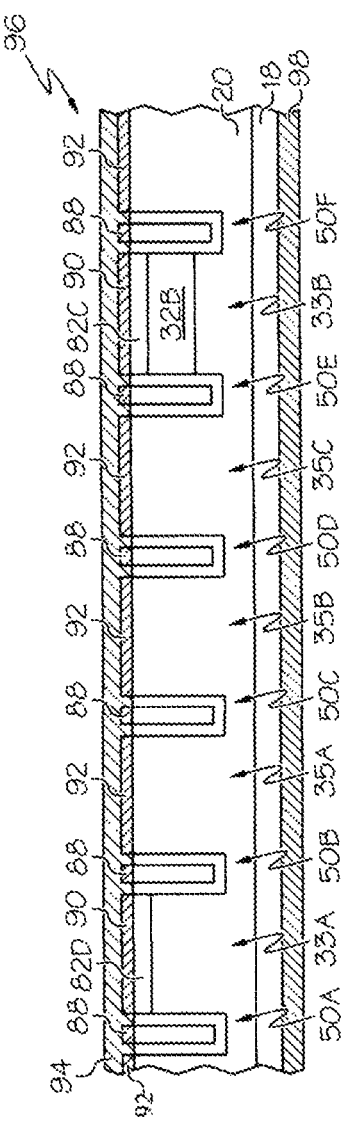
FIG. 41 is a cross-sectional view taken along section line 40-40 of FIG. 39 that illustrates another embodiment of the semiconductor component of FIG. 39.

FIG. 41 is a cross-sectional view of a semiconductor component 400B in accordance with another embodiment of the present invention. Reference character B has been appended to reference character 400 to distinguish the embodiment of semiconductor component 400B from the embodiments of semiconductor components 400A, 400C, and 400D shown in FIGS. 40, 42, and 43, respectively. What is shown in FIG. 41 are trenches 50A, 50B, 50C, 50D, 50E, and 50F described with reference to FIG. 23, doped region 32B formed in mesa structure 33B, and enhanced dopant regions 82C and 82D formed in mesa structures 33B and 33A, respectively. The doping profile and silicide configuration of semiconductor component 400B is similar to that of semiconductor component 153 shown in FIG. 20.

FIG. 42 is a cross-sectional view of a semiconductor component 400C in accordance with another embodiment of the present invention. Reference character C has been appended to reference character 400 to distinguish the embodiment of semiconductor component 400C from the embodiments of semiconductor components 400A, 400B, and 400D shown in FIGS. 40, 41, and 43, respectively. What is shown in FIG. 42 are trenches 50A, 50B, 50C, 50D, 50E, and 50F described with reference to FIG. 23, doped regions 32A and 32B formed in mesa structures 33A and 33B, respectively, and enhanced dopant region 82C formed in mesa structure 33B. The doping profile of semiconductor component 400C is similar to that of semiconductor component 400A shown in FIG. 40. Semiconductor component 400C differs from semiconductor component 400A in that silicide layers 90 are absent between metal layer 94 and mesa structures 33A and 33B.

FIG. 43 is a cross-sectional view of a semiconductor component 400D in accordance with another embodiment of the present invention. Reference character D has been appended to reference character 400 to distinguish the embodiment of semiconductor component 400D from the embodiments of semiconductor components 400A, 400B, and 400C shown in FIGS. 40, 41, and 42, respectively. What is shown in FIG. 43 are trenches 50A, 50B, 50C, 50D, 50E, and 50F described with reference to FIG. 23, doped region 32B formed in mesa structure 33B, and enhanced doped regions 82C and 82D formed in mesa structures 33B and 33A, respectively. The doping profile of semiconductor component 400D is similar to that of semiconductor component 400B shown in FIG. 41. Semiconductor component 400D differs from semiconductor component 400B in that silicide layers 90 are absent between metal layer 94 and mesa structures 33A and 33B.

Figure 44:
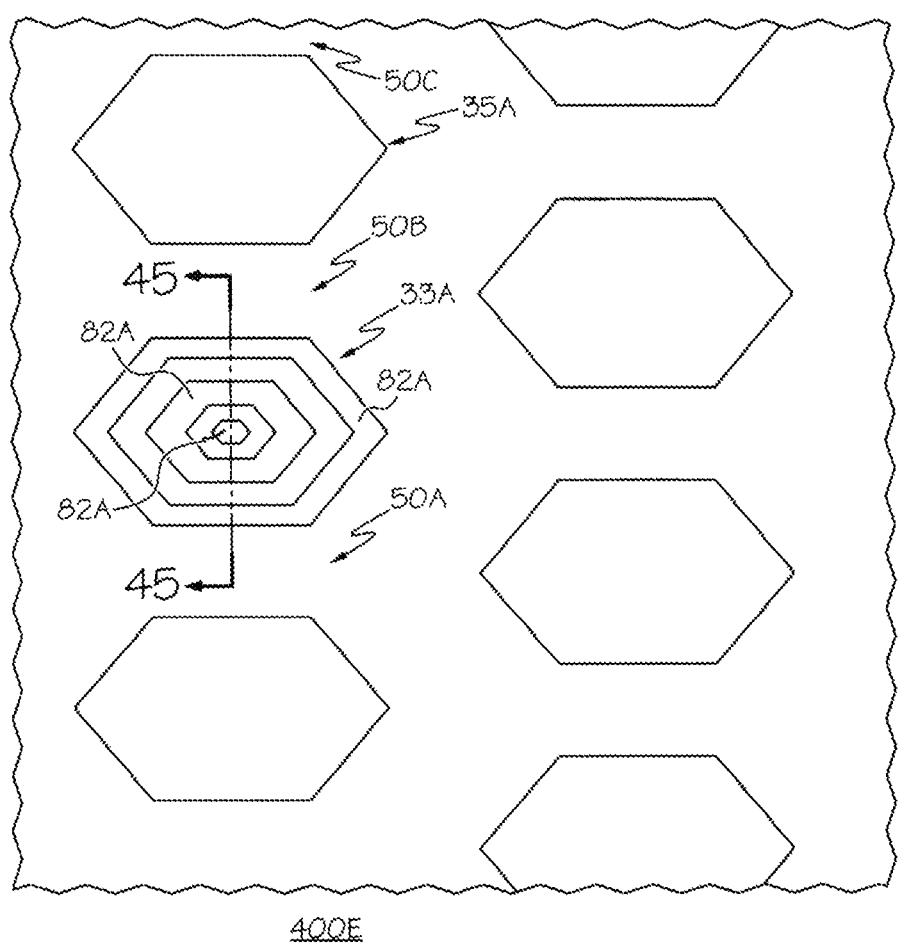
FIG. 44 is a top view of a layout of a semiconductor component in accordance with another embodiment of the present invention.

FIG. 44 is a top view of a semiconductor component 400E in accordance with another embodiment of the present invention. Reference character E has been appended to reference character 400 to distinguish the embodiment of semiconductor component 400E from the embodiments of semiconductor components 400A, 400B, 400C, and 400D shown in FIGS. 40, 41, 42, and 43, respectively. What is shown in FIG. 44 are filled trenches 50A, 50B, and 50C, mesa structure 33A, and enhanced doped regions 82A in mesa structure 33A. Semiconductor component 400E is further described with reference to FIG. 45.

Figure 45:
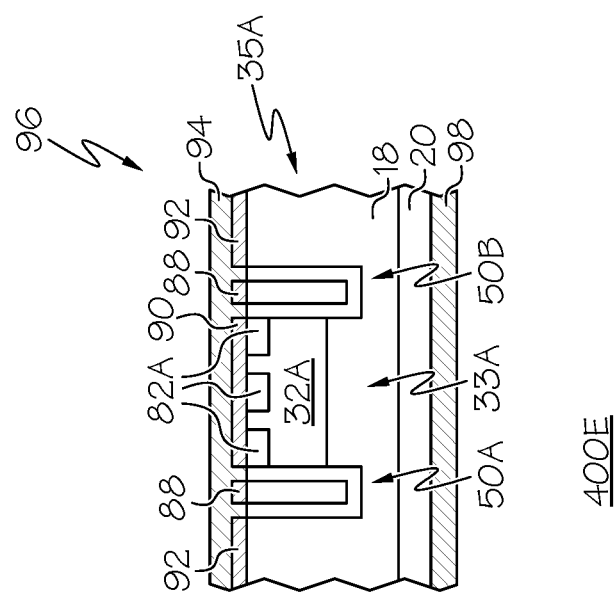
FIG. 45 is a cross-sectional view taken along section line 45-45 of FIG. 44 that illustrates an embodiment of the semiconductor component of FIG. 44.

FIG. 45 is a cross-sectional view of semiconductor component 400E taken along section line 45-45 of FIG. 44. What is shown in FIG. 45 are filled trenches 50A and 50B described with reference to FIG. 23, doped region 32A formed in mesa structures 33A, and enhanced doped regions 82A forming in mesa structures 33A. It should be noted that in the embodiment shown in FIG. 45, trenches 50A and 50B may form trench portions of a hexagonal trench structure. The doping profile of semiconductor component 400E is similar to that of semiconductor component 10 shown in FIG. 9. Semiconductor component 400E includes a silicide layer 90 between metal layer 94 and mesa structure 33A. However, in other embodiments silicide layer 90 may be absent.

Figure 46:
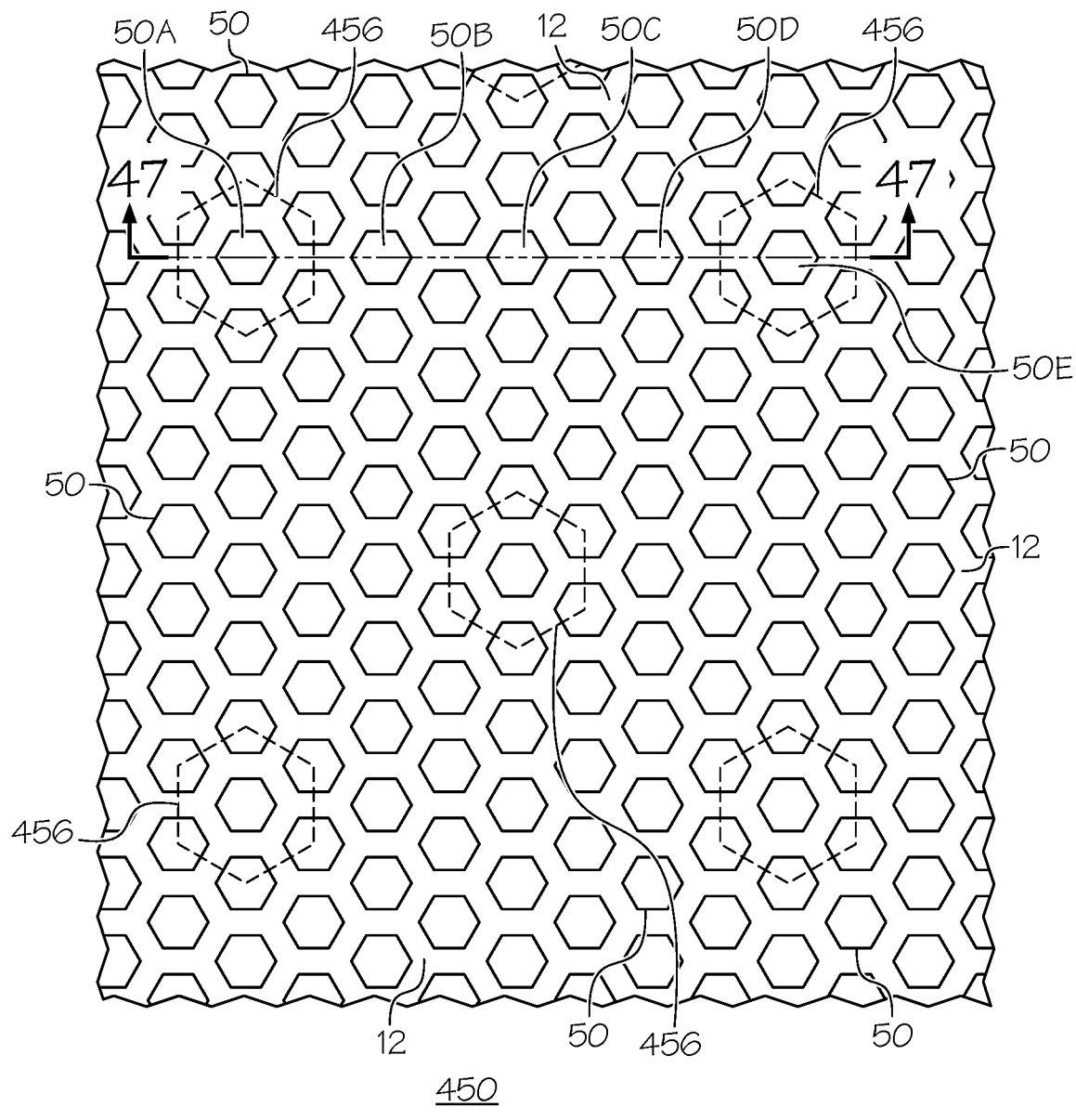
FIG. 46 is a top view of a layout of a semiconductor component in accordance with another embodiment of the present invention.

FIG. 46 is a top view of a semiconductor component 450 illustrating a trench array in a semiconductor material, such as, for example, semiconductor material 12 of FIG. 1. By way of example, the trench array is comprised of a plurality of trenches 50 having a hexagonal geometric configuration and the semiconductor material is of N-type conductivity. It should be noted that the geometric configuration is not limited to being a hexagon. For the sake of clarity, the trenches are identified by reference character 50. However, references characters A, B, C, D, and E have been appended to specific trenches to aid in the description of the cross-sectional view illustrated in FIG. 47. The geometric configuration can be an ellipse, a circle, a triangle, a quadrangle, a pentagon, a heptagon, an octagon, other geometric patterns, or the like. Portions of semiconductor material 12 (indicated by hexagons 456 shown by broken lines) are doped with an impurity material of, for example, P-type conductivity to form doped regions. By way of example, the doped regions are patterned in a hexagonal configuration. However, this is not a limitation and the doped regions can have other shapes such as, for example, circles, ellipses, triangles, quadrangles, pentagons, heptagons, octagons, other geometric patterns, or the like.

Figure 47:
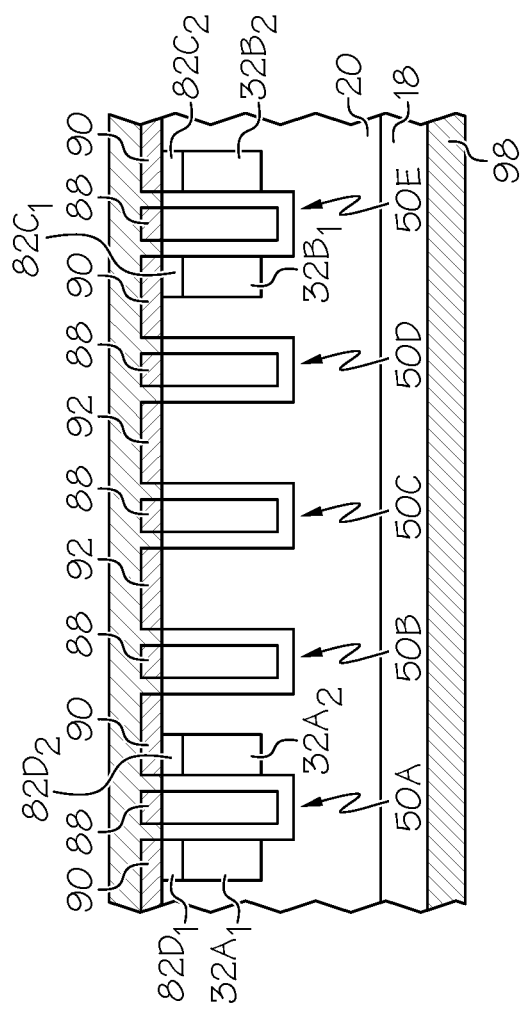
FIG. 47 is a cross-sectional view taken along section line 47-47 of FIG. 46 that illustrates an embodiment of the semiconductor component of FIG. 46.

FIG. 47 is a cross-sectional view of semiconductor component 450 taken along section line 47-47 of FIG. 46, but at a later stage of manufacture. What is shown in FIG. 47 are trenches 50A, 50B, 50C, 50D, and 50E formed in semiconductor material 12 described with reference to semiconductor component 10. The formation of semiconductor component 450 differs from that of semiconductor component 10 in that five trenches are shown in the description of semiconductor component 450 rather than eight trenches illustrated in FIGS. 1-9 and the positioning of the trenches with respect to doped regions 32A and 32B is shifted such that: trench 50A extends through doped region 32A and enhanced doped region 82D; doped region 32A and enhanced doped region 82D contact opposing sidewalls of trench 50A and are spaced apart from trench 50B; trench 50E extends through doped region 32B and enhanced doped region 82C; doped region 32B and enhanced doped region 82C contact opposing sidewalls of trench 50E and are spaced apart from an adjacent trench that is not shown. Doped region 32A is identified by reference characters $32A_1$ and $32A_2$ to distinguish the portions of the doped region adjacent opposing sidewalls of trench 50A; doped region 32B is identified by reference characters $32B_1$ and $32B_2$ to distinguish the portions of the doped region adjacent opposing sidewalls of trench 50E; enhanced doped region 82D is identified by reference characters $82D_1$ and $82D_2$ to distinguish the portions of the enhanced doped region adjacent opposing sidewalls of trench 50A; and enhanced doped region 82C is identified by reference characters $82C_1$ and $82C_2$ to distinguish the portions of the enhanced doped region adjacent opposing sidewalls of trench 50E. The doping profile of semiconductor component 450 may be similar to that of semiconductor component 400A shown in FIG. 40. It should be noted that the doping profile of semiconductor component 450 is not a limitation of the present invention and the silicidation configuration of the mesa structures is not a limitation of the present invention. Semiconductor component 450 may have other doping profiles or silicidation configurations such as, for example, the semiconductor component doping profiles and silicidation configurations described above.

It should be appreciated that the top view of semiconductor component 400 of FIG. 39 and the top view of semiconductor component 450 of FIG. 46 in a sense are inverted configurations of each other. The layout of FIG. 39 illustrates a top view of a semiconductor material in which the hexagonally shaped structures are pedestals or mesa structures formed by etching or removing portions of semiconductor material adjacent the mesa structures. For example, masking elements may be formed over semiconductor material 12, wherein the masking elements are hexagonally shaped. Openings are adjacent the masking elements exposing portions of semiconductor material 12 in which trenches are to be formed. The exposed portions of the semiconductor material are removed using, for example, a reactive ion etch to form trenches having sidewalls and a floor, and leaving pedestal structures or mesa structures from which doped regions 404N and 404P described with reference to FIG. 39 are formed. The pedestals or mesa structures have sidewalls and pedestal surfaces and mesa surfaces. The masking elements are removed. Dielectric material is formed adjacent the mesa structures and on the portions of the floor of the cavity from which mesa structures are absent. An electrically conductive material is formed on the dielectric material that is adjacent the mesa structures and on the floor of the cavity. The electrically conductive material can be doped polysilicon, metal, or the like.

In the layout of FIG. 46, on the other hand, rather than forming pedestals or mesa structures from semiconductor material 12, geometrically shaped trenches are formed in semiconductor material 12. Thus, rather than the hexagonally shaped structures being pedestals like in FIG. 39, the hexagonally shaped structures are trenches in FIG. 46. The hexagonally shaped trenches have a floor and sidewalls. It should be understood that the geometrically shaped structures of FIG. 39 and FIG. 46 are not limited to being hexagons but could be circles, ellipses, triangles, quadrangles, pentagons, other polygons, or the like. A dielectric material is formed along sidewalls and a floor of the trenches and an electrically conductive material is formed on the dielectric material in the trenches. The electrically conductive material can be doped polysilicon, metal, or the like.

Figure 48:
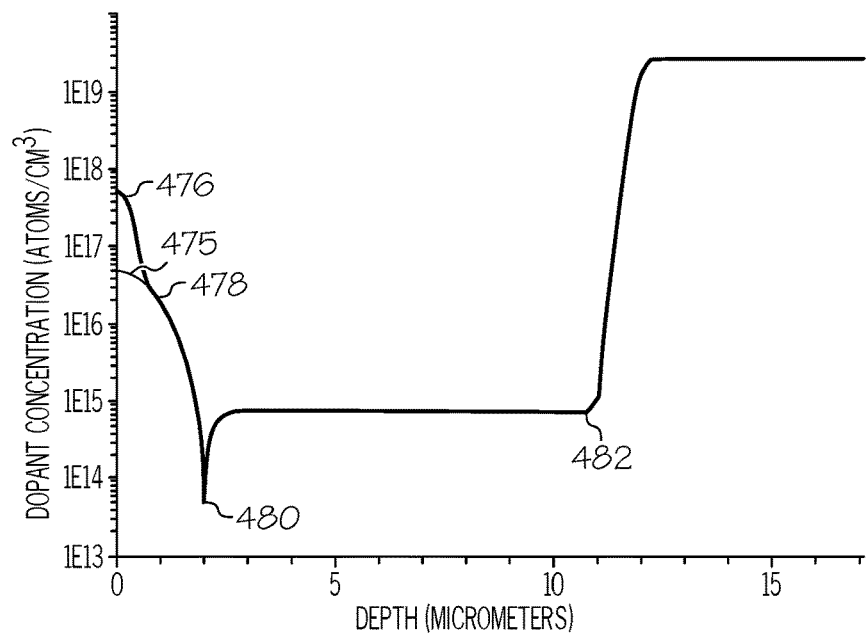
FIG. 48 is an impurity profile in accordance with an embodiment of the present invention.

FIG. 48 illustrates dopant profiles of impurity material in regions of semiconductor material 12 between adjacent trenches. More particularly, the dopant profiles are an example of an embodiment of the dopant concentration in doped regions such as doped regions 32A and 32B and enhanced doped regions 82A-82D versus dopant depth or distance from surface 14 into semiconductor material 12. In accordance with embodiments of the present invention, the concentration of P-type impurity materials, i.e., the dopant concentration, at or near surface 14 has been increased such that a surface concentration of the P-type impurity materials or P-type dopants is about $5.5 \times 10^{17}$ atoms/cm$^3$. It should be noted that surface 14 is indicated as being at a depth of zero micrometers. For the sake of illustration, reference character 475 illustrates the surface concentration of P-type impurity materials after formation of doped regions 32A and 32B. Reference character 476 illustrates the surface concentration of P-type impurity materials after the formation of enhanced doped regions 82A-82D. Reference character 478 illustrates the concentration of P-type impurity material at the depth at which enhanced doped regions 82A-82D end and reference character 480 illustrates the depth at which doped regions 32A and 32B end, i.e., the P-N junction formed between doped regions 32A and 32B and semiconductor material 12. The impurity material concentration between the depths indicated by reference characters 480 and 482 represent the impurity material concentration of epitaxial layer 20 and the impurity material concentration indicated by the depths to the right of reference character 482 indicate the impurity material concentration of semiconductor substrate 18. It should be noted that the impurity material concentrations of epitaxial layer 20 is substantially constant and the impurity material concentration of semiconductor substrate 18 is substantially constant, wherein the impurity material concentration of substrate 18 is greater than that of epitaxial layer 20.

Figure 49:
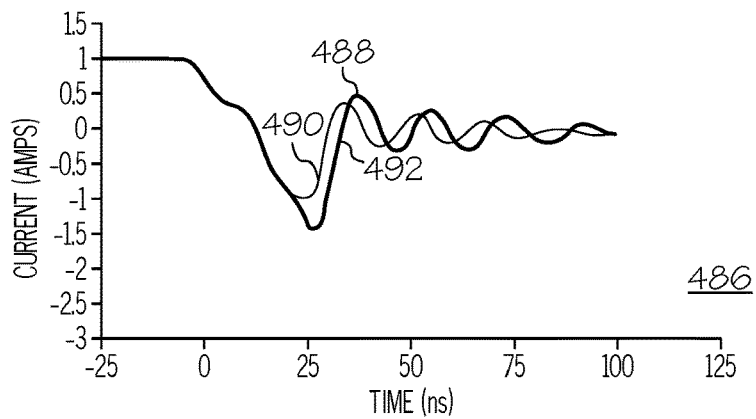
FIG. 49 is a plot of current versus time for a semiconductor component configured in accordance with an embodiment of the present invention.

FIG. 49 is a switching performance plot 486 illustrating the switching current versus time for Schottky devices in accordance with embodiments of the present invention. What is shown in FIG. 49 is the switching characteristics of a Schottky device that is switched off to a reverse voltage, VR, of 30 volts, a forward current, IF, of 1 Amp, and current change, di/dt, of 100 Amps per microsecond. Trace 488 indicates the switching performance of a typical Schottky device. It should be noted that the current decreases to about −1.5 Amps at about 26 nanoseconds. Traces 490 and 492 indicate that the current decreases to about −1 Amp at about 25 nanoseconds. From these plots it can be determined that increasing the concentration of impurity material in the mesa structures improves the forward voltage drop, VF, of a Schottky device, while leaving the reverse recovery charge substantially unaffected. Those skilled in the art would not expect that increasing the concentration of impurity material in the mesa structures would reduce the forward voltage VF of the Schottky device at a cost of increasing the switching speed. However, traces 490 and 492 demonstrate that the reduction in the forward voltage VF that occurs by increasing the concentration of the impurity material in accordance with embodiments of the present invention produces the unexpected result of insignificantly affecting the switching speed. It should be noted that trace 492 may substantially overlap trace 488 such that they appear as a single trace.

Figure 50:
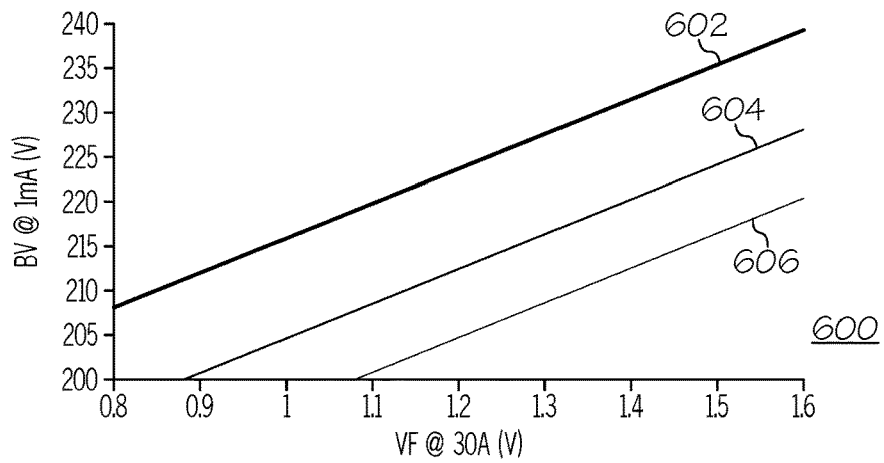
FIG. 50 is a plot of breakdown voltage versus forward voltage for a semiconductor component configured in accordance with an embodiment of the present invention.

FIG. 50 is a plot 600 of breakdown voltage versus the forward voltage for Schottky devices manufactured in accordance with embodiments of the present invention. Trace 602 illustrates the breakdown voltage versus the forward voltage for Schottky devices manufactured in accordance with embodiments of the present invention. Trace 604 indicates the breakdown voltage versus the forward voltage for Schottky devices in which the mesa structures have received a single doping with impurity materials. Trace 606 illustrates the breakdown voltage versus the forward voltage for prior art Schottky devices. Plot 600 illustrates that the breakdown voltage of a Schottky device at a particular forward voltage is greater for Schottky devices manufactured in accordance with embodiments of the present invention.

FIG. 51 is a cross-sectional view of a semiconductor component 620 in accordance with another embodiment of the present invention. The description of semiconductor component 620 and its manufacture continues from FIG. 6. A blanket implant of an impurity material into semiconductor material 12 is performed and trenches 50A-50H to form dopant regions 82D, 82C, $82_1$, $82_2$, $82_3$, $82_4$, and $82_5$ in mesa structures 33A, 33B, 35A, 35B, 35C, 35D, and 35E, respectively. Mesa structures 33A, 33B, 35A, 35B, 35C, 35D, and 35E may be doped with an impurity material of P-type conductivity by, for example, implanting boron in semiconductor material 12. The boron may be implanted at a dose ranging from about $1 \times 10^{12}$ ions per centimeter squared (ions/cm$^2$) to about $1 \times 10^{14}$ ions/cm$^2$, an implant energy ranging from about 50 kilo electron volts (keV) to about 300 keV, and an implant angle ranging from about 0 degrees to about 45 degrees. By way of example, the implant dose is about $1.5 \times 10^{13}$ ions/cm$^2$, the implant energy is about 100 keV, and the implant angle is about 7 degrees.

Doped regions 32A and 32B extend from surface 14 into semiconductor material 12 a distance that is greater than the distance that doped regions 82C, 82D, $82_1$, $82_2$, $82_3$, $82_4$, and $82_5$ extend into semiconductor material 12. Thus, doped regions 32A and 82D are formed in mesa structure 33A and doped regions 32B and 82C are formed in mesa structure 33B such that mesa structures 33A and 33B have multi-concentration impurity profiles. The multi-concentration impurity profiles may be referred to as multi-concentration impurity material profiles. In an embodiment, doped regions 82D and 82C are formed within the sub-portions of mesa structures 33A and 33B in which doped regions 32A and 32B are formed, respectively.

In accordance with another embodiment, the multi-concentration impurity profiles are stepped dopant profiles. It should be noted that some of doped regions 32A and 32B can be formed using, for example an implant technique and other doped regions of doped regions 32A and 32B can be formed using a diffusion technique. Likewise, some of doped regions 82D and 82C can be formed using, for example an implant technique and other doped regions of doped regions 82D and 82C can be formed using a diffusion technique. Alternatively, the dopant concentrations of doped regions 32A and 32B may be the same or different from one another and the dopant concentrations of doped regions 82D and 82C may be the same or different from one another.

The implant may be activated and diffused using an RTA step performed in, for example, a nitrogen ambient at a temperature ranging from about 850° C. to about 1,100° C. for a time ranging from about 30 seconds to about 2 minutes. In accordance with an embodiment, the anneal temperature may be about 1,000° C. and the anneal time may be about 45 seconds. The technique for forming enhanced doped regions 82C and 82D and doped regions $82_1$, $82_2$, $82_3$, $82_4$, and $82_5$ is not limited to an implantation technique. Alternatively, enhanced doped regions 82C and 82D and doped regions $82_1$, $82_2$, $82_3$, $82_4$, and $82_5$ may be formed by deposition and diffusion techniques. Although doped regions are described as being formed after the formation of trenches 50A-50H, this is not a limitation of the present invention. For example, enhanced doped regions 82C and 82D and doped regions $82_1$, $82_2$, $82_3$, $82_4$, and $82_5$ may be formed before the formation of trenches 50A-50H or before or after formation of doped regions 32A and 32B.

Referring now to FIG. 52, screen oxide layer 69 is removed to expose surface 14, portions of enhanced doped regions 82C and 82D and doped regions $82_1$, $82_2$, $82_3$, $82_4$, and $82_5$, and portions of polysilicon fill material 64A-64H. The exposed portions of doped regions 32A and 32B, enhanced doped regions 82C and 82D and doped regions $82_1$, $82_2$, $82_3$, $82_4$, and $82_5$, the exposed portions of polysilicon fill material 64A-64H, and the exposed portions of dielectric layers 54A-54H are cleaned using a wet HF etching technique to remove any native oxide that may be present.

A layer of photoresist is patterned over mesa structures 33A, 33B, and 35A-35E to form a masking structure 625 having masking elements 624 and openings 626 that expose doped regions $82_1$, $82_2$, $82_3$, $82_4$, and $82_5$. Masking structure 625 may be referred to as a mask or an etch mask.

Referring now to FIG. 53, doped regions $82_1$, $82_2$, $82_3$, $82_4$, and $82_5$ are removed using, for example, a Reactive Ion Etch (RIE), forming openings 628. Masking elements 624 are removed.

Referring now to FIG. 54, a barrier metal deposition process is performed in which a barrier metal is deposited on dielectric layers 54A-54H, polysilicon fill material 64A-64H, doped regions 32A and 32B, enhanced doped regions 82C and 82D, and portions of surface 14. In accordance with an embodiment, the barrier metal includes a nickel platinum metal alloy having a thickness ranging from about 100 Å to about 2,000 Å. By way of example, the nickel platinum metal alloy has a thickness of about 700 Å. The nickel platinum metal alloy is treated to a rapid thermal anneal in a nitrogen ambient at a temperature ranging from about 300° C. to about 700° C. for a time ranging from about 15 seconds to about 120 seconds. The heat treatment causes the nickel platinum metal alloy to react with the silicon to form nickel platinum silicide in all regions in which the nickel platinum metal alloy is in contact with silicon or polysilicon. Thus, nickel platinum silicide layers 88 are formed from polysilicon fill material 50A-50H, nickel platinum silicide layers 90 are formed from enhanced doped regions 82C and 82D, and nickel platinum silicide layers 92 are formed from the exposed portions of semiconductor material 12. The unreacted nickel platinum metal alloy is removed using for example a hot SPM strip. The hot SPM strip solution may be comprised of sulfuric acid and hydrogen peroxide. It should be noted that the barrier metal is not limited to nickel platinum alloys. Other suitable materials for the barrier metal layers include titanium nitride, titanium, tungsten, platinum, aluminum copper, or the like. In addition, the number of metal layers forming the barrier metal is not limited to a single metal layer, but may be comprised of one, two, three, or more metal layers.

A metal layer 94 is formed in contact with the barrier metal layer or layers. Suitable materials for metal layer 94 include aluminum, nickel, silver, or the like. Silicide layers 88, 90, and 92, the barrier metal layers, and metal layer 94 form an anode or anode contact 96 of Schottky device 620 and also may be referred to as a Schottky metallization system or a Schottky contact. A conductor 98 is formed in contact with surface 16 and serves as a cathode or cathode contact for Schottky device 10 and may be referred to as a cathode metallization system. Suitable metallization systems for conductor 98 include a gold alloy, titanium-nickel-gold, titanium-nickel-silver, or the like. It should be noted that the metal of the portions of the metallization system in contact with mesa structures that include multi-concentration dopant profiles, i.e., mesa structures 33A and 33B may be different from the metal of the portions of the metallization system that contact mesa structures in which the multi-concentration dopant profiles are absent, e.g., mesa structures 35A-35E. Thus, silicide layers 88 in combination with portions of metal layer 94 form ohmic contact portions to the electrically conductive material 64A-64H in trenches 50A-50H, respectively, where electrically conductive material 64A-64H may be polysilicon fill material; silicide layers 90 in combination with portions of metal layer 94 form contacts to sets of doped region 32A and enhanced doped region 82D and to doped region 32B and enhanced doped region 82C that are between an ohmic contact and conventional Schottky contacts; and silicide layers 92 in combination with portions of metal layer 94 form conventional Schottky contacts to mesa structures 35A-35E. It should be noted that a contact formed by a barrier metal such as metal 92 and a lightly doped epitaxial layer, e.g., having a dopant concentration of about $10^{15}/cm^3$, forms a conventional Schottky contact and a contact formed by a metal such as metal 88 and a highly doped semiconductor material, e.g., having a dopant concentration of about $10^{19}/cm^3$, such as N-type semiconductor material 64 forms a conventional Ohmic contact.

FIG. 55 is a cross-sectional view of a semiconductor component 650 in accordance with another embodiment of the present invention. The description of semiconductor component 650 and its manufacture continues from FIG. 6. A blanket implant of an impurity material into semiconductor material 12 is performed and trenches 50A-50H to form dopant regions 82C, 82D, $82_1$, $82_2$, $82_3$, $82_4$, and $82_5$ in mesa structures 33B, 33A, 35A, 35B, 35C, 35D, and 35E, respectively. Mesa structures 33A, 33B, 35A, 35B, 35C, 35D, and 35E may be doped with an impurity material of P-type conductivity by, for example, implanting boron in semiconductor material 12. The boron may be implanted at a dose ranging from about $1\times10^{12}$ ions/cm$^2$ to about $1\times10^{14}$ ions/cm$^2$, an implant energy ranging from about 50 kilo electron volts (keV) to about 300 keV, and an implant angle ranging from about 0 degrees to about 45 degrees. By way of example, the implant dose is about $1.5\times10^{13}$ ions/cm$^2$, the implant energy is about 100 keV, and the implant angle is about 7 degrees.

Doped regions 32A and 32B extend from surface 14 into semiconductor material 12 a distance that is greater than the distance that doped regions 82C, 82D, $82_1$, $82_2$, $82_3$, $82_4$, and $82_5$ extend into in mesa structures 33B, 33C, 35A, 35B, 35C, 35D, and 35E, respectively, extend into semiconductor material 12. Thus, doped regions 32A and 82D are formed in mesa structure 33A and doped regions 32B and 82C are formed in mesa structure 33B, such that mesa structures 33A and 33B have multi-concentration impurity profiles. The multi-concentration impurity profiles may be referred to as multi-concentration impurity material profiles. In an embodiment, doped regions 82D and 82C are formed within the sub-portions of mesa structures 33A and 33B in which doped regions 32A and 32B are formed, respectively.

In accordance with another embodiment, the multi-concentration impurity profiles are stepped dopant profiles. It should be noted that some of doped regions 32A and 32B can be formed using, for example, an implant technique and other doped regions of doped regions 32A and 32B can be formed using a diffusion technique. Likewise, some of doped regions 82C and 82D can be formed using, for example an implant technique and other doped regions of doped regions 82C and 82D can be formed using a diffusion technique. The dopant concentrations of doped regions 32A and 32B may be the same or different from one another and the dopant concentrations of doped regions 82D and 82C may be the same or different from one another.

The implant may be activated and diffused using an RTA step performed in, for example, a nitrogen ambient at a temperature ranging from about 850° C. to about 1,100° C. for a time ranging from about 30 seconds to about 2 minutes. In accordance with an embodiment, the anneal temperature may be about 1,000° C. and the anneal time may be about 45 seconds. The technique for forming dopant regions 82C, 82D, $82_1$, $82_2$, $82_3$, $82_4$, and $82_5$ is not limited to an implantation technique. Alternatively, enhanced doped regions 82C, 82D, $82_1$, $82_2$, $82_3$, $82_4$, and $82_5$ may be formed by deposition and diffusion techniques. Although doped regions 82C, 82D, $82_1$, $82_2$, $82_3$, $82_4$, and $82_5$ are described as being formed after the formation of trenches 50A-50H, this is not a limitation of the present invention. For example, doped regions 82C, 82D, $82_1$, $82_2$, $82_3$, $82_4$, and $82_5$ may be formed before the formation of trenches 50A-50H or before or after formation of doped regions 32A and 32B.

Still referring to FIG. 55, screen oxide layer 69 is removed to expose surface 14, the exposed portions of doped regions 32A and 32B, enhanced doped regions 82C and 82D, doped regions $82_1$, $82_2$, $82_3$, $82_4$, and $82_5$, the exposed portions of polysilicon fill material 64A-64H, and the exposed portions of dielectric layers 54A-54H, which are cleaned using a wet HF etching technique to remove any native oxide that may be present.

A layer of photoresist is patterned over mesa structures 33A, 33B, and 35A-35F to form a masking structure 653 having masking elements 652 and openings 654 that expose doped regions $82_1$, $82_2$, $82_3$, $82_4$, and $82_5$. Masking structure 653 may be referred to as a mask or an etch mask.

Referring now to FIG. 56, centrals portions of doped regions $82_1$, $82_2$, $82_3$, $82_4$, and $82_5$ are removed using, a Reactive Ion Etch (RIE) forming openings 656, and leaving portions of doped region $82_1$ along trenches 50B and 50C, portions of doped region $82_2$ along trenches 50C and 50D, portions of doped region $82_3$ along trenches 50D and 50E, portions of doped region $82_4$ along trenches 50E and 50F, and portions of doped region $82_5$ along trenches 50F and 50G. Openings 656 expose portions of semiconductor material 12 in mesa structures 35A-35E. Masking elements 652 are removed.

Figure 57:
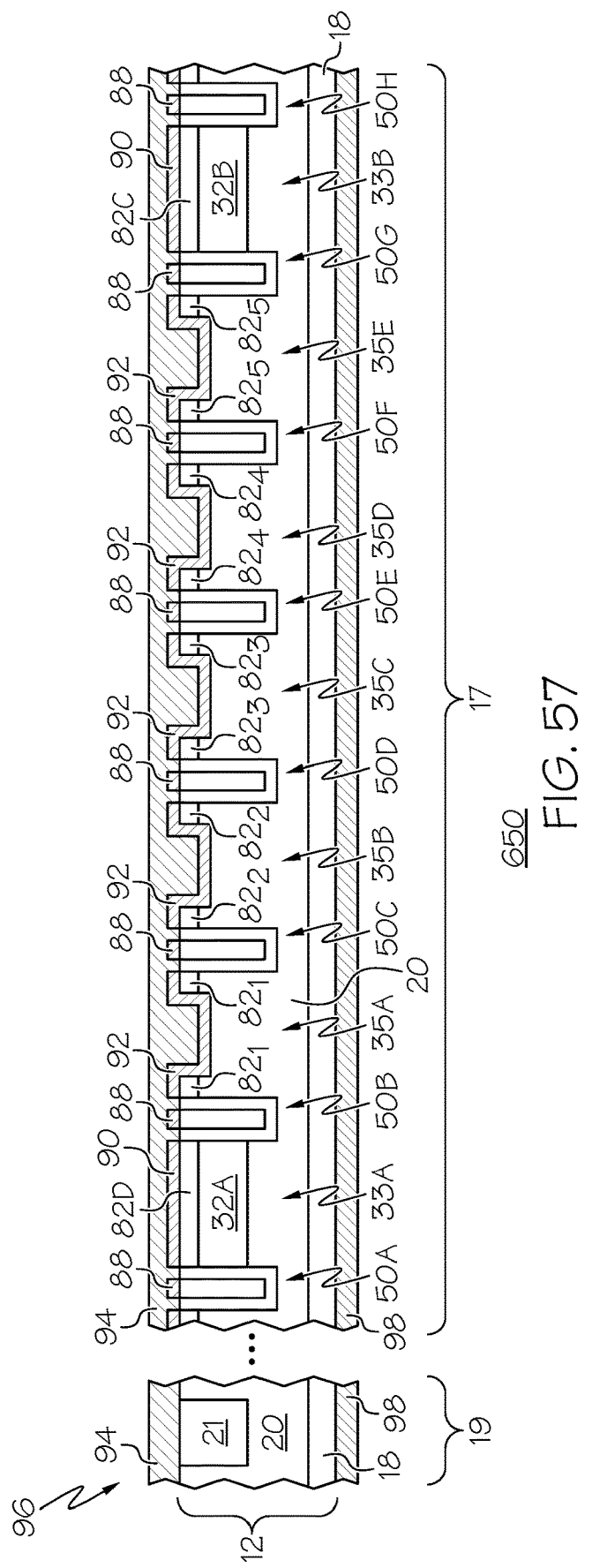
FIG. 57 is a cross-sectional view of the semiconductor component of FIG. 56 at a later stage of manufacture.

Referring now to FIG. 57, a barrier metal deposition process is performed in which a barrier metal is deposited on dielectric layers 54A-54H, polysilicon fill material 64A-64H, doped regions 32A and 32B, the portions of doped region $82_1$ along trenches 50B and 50C, the portions of doped region $82_2$ along trenches 50C and 50D, the portions of doped region $82_3$ along trenches 50D and 50E, the portions of doped region $82_4$ along trenches 50E and 50F, and the portions of doped region $82_5$ along trenches 50F and 50G, and the exposed portions of semiconductor material 12. In accordance with an embodiment, the barrier metal includes a nickel platinum metal alloy having a thickness ranging from about 100 Å to about 2,000 Å. By way of example, the nickel platinum metal alloy has a thickness of about 700 Å. The nickel platinum metal alloy is treated to a rapid thermal anneal in a nitrogen ambient at a temperature ranging from about 300° C. to about 700° C. for a time ranging from about 15 seconds to about 120 seconds. The heat treatment causes the nickel platinum metal alloy to react with the silicon to form nickel platinum silicide in all regions in which the nickel platinum metal alloy is in contact with silicon or polysilicon. Thus, nickel platinum silicide layers 88 are formed from polysilicon fill material 50A-50H, nickel platinum silicide layers 90 are formed from enhanced doped regions 82D and 82C, and nickel platinum silicide layers 92 are formed from the exposed portions of semiconductor material 12 and doped regions $82_1$, $82_2$, $82_3$, $82_4$, and $82_5$. The unreacted nickel platinum metal alloy is removed using for example a hot SPM strip. The hot SPM strip solution may be comprised of sulfuric acid and hydrogen peroxide. It should be noted that the barrier metal is not limited to nickel platinum alloys. Other suitable materials for the barrier metal layers include titanium nitride, titanium, tungsten, platinum, aluminum copper, or the like. In addition, the number of metal layers forming the barrier metal is not limited to a single metal layer, but may be comprised of one, two, three, or more metal layers.

A metal layer 94 is formed in contact with the barrier metal layer or layers. Suitable materials for metal layer 94 include aluminum, nickel, silver, or the like. Silicide layers 88, 90, and 92, the barrier metal layers, and metal layer 94 form an anode or anode contact 96 of Schottky device 650 and also may be referred to as a Schottky metallization system or a Schottky contact. A conductor 98 is formed in contact with surface 16 and serves as a cathode or cathode contact for Schottky device 650 and may be referred to as a cathode metallization system. Suitable metallization systems for conductor 98 include a gold alloy, titanium-nickel-gold, titanium-nickel-silver, or the like. It should be noted that the metal of the portions of the metallization system in contact with mesa structures that include multi-concentration dopant profiles, i.e., mesa structures 33A and 33B may be different than the metal of the portions of the metallization system that contact mesa structures in which the multi-concentration dopant profiles are absent, e.g., mesa structures 35A-35E. Thus, silicide layers 88 in combination with portions of metal layer 94 form ohmic contact portions to the electrically conductive material 64A-64H in trenches 50A-50H, respectively, where electrically conductive material 64A-64H may be polysilicon fill material; silicide layers 90 in combination with portions of metal layer 94 form contacts to sets of doped region 32A and enhanced doped region 82A and to doped region 32B and enhanced doped region 82B that are between an ohmic contact and conventional Schottky contacts; and silicide layers 92 in combination with portions of metal layer 94 form conventional Schottky contacts to mesa structures 35A-35E. It should be noted that a contact formed by a barrier metal such as metal 92 and a lightly doped epitaxial layer, e.g., a dopant concentration of about $10^{15}/cm^3$, forms a conventional Schottky contact and a contact formed by a metal such as metal 88 and a highly doped semiconductor material, e.g., a dopant concentration of about $10^{19}/cm^3$, such as N-type semiconductor material 64 forms a conventional Ohmic contact.

By now it should be appreciated that a semiconductor component such as, for example a Schottky device and methods for manufacturing the semiconductor component have been provided. Manufacturing Schottky devices in accordance with embodiments of the present invention lowers the forward voltage, lowers the leakage current that results from a pinch-off action of the trench-MOS regions, and increases the breakdown voltage of the Schottky devices. The electrical characteristics can be further optimized by forming the doped regions having the multi-concentration impurity profiles, i.e., that include doped regions 32A and 32B and doped regions 82A-82D, in one or more mesa structures. For example, a doped region, such as for example a set of doped regions 32A and 82A may be formed in a mesa structure. Alternatively, a set of doped regions such as, for example, doped regions 32A and 82A may be formed in a mesa structure, a set of doped regions such as, for example, doped regions 32B and 82B may be formed in another mesa structure, and yet another a set of doped regions such as, for example, doped regions 32B and 82C may be formed in yet another mesa structure, etc. The number of mesa structures having doped regions with multi-concentration impurity material profiles is not a limitation of the present invention, i.e., there may be one, two, three, or more mesa structures that have doped regions with multi-concentration impurity material profiles.

Formation of doped regions such doped regions 32A and 32B and enhanced doped regions such as regions 82A-82D reduce the forward voltage, VF, of a Schottky device because they inject minority carriers during high current levels and modulate the conductivity of the epitaxial layer. The amount of conductivity modulation and the amount of improvement in the forward voltage can be controlled by the dose and frequency of mesa structures having the doped regions, i.e., doped regions 32A, 32G and 82A-82D. Another advantage is that the breakdown voltage of the Schottky devices can be improved with minimal impact on the forward voltage and vice versa.

Although certain preferred embodiments and methods have been disclosed herein, it will be apparent from the foregoing disclosure to those skilled in the art that variations and modifications of such embodiments and methods may be made without departing from the spirit and scope of the invention. For example, epitaxial layer 20 may be of P-type conductivity and doped regions 32A, 32B, and 82A-82D may be of N-type conductivity. It is intended that the invention shall be limited only to the extent required by the appended claims and the rules and principles of applicable law.

What is claimed is:

1. A Schottky device having a first contact and a second contact, wherein the first contact includes a first contact type, a second contact type, and a third contact type, the Schottky device comprising:
   a semiconductor material of a first conductivity type having first and second surfaces and a first concentration;
   a first trench extending from the first surface into a first portion of the semiconductor material and having a sidewall and a floor;
   a second trench extending from the first surface into a second portion of the semiconductor material and having a sidewall and a floor;
   a first dielectric material in the first trench and a second dielectric material in the second trench;
   a first polysilicon material on the first dielectric material and a second polysilicon material on the second dielectric material;
   a first mesa structure between the first trench and the second trench, the first mesa structure having a sidewall and a mesa surface;
   a first doped region of a second conductivity type and a second concentration extending from the mesa surface of the first mesa structure into the first mesa structure;
   a first plurality of doped regions of the second conductivity type extending from the mesa surface of the first mesa structure into portions of the first doped region, wherein the first doped region and the first plurality of doped regions of the second conductivity type cooperate to form a first multi-concentration doped region; and
   the first contact in contact with the first multi-concentration doped region to form the first contact type, the first and second polysilicon material to form the second contact type, and a portion of the semiconductor material adjacent the first trench to form the third contact type.

2. The Schottky device of claim 1, wherein the first mesa structure has a geometric shape.

3. The Schottky device of claim 2, wherein the geometric shape is a hexagon.

4. The Schottky device of claim 1, further including a second mesa structure, a third mesa structure, a fourth mesa structure, and a fifth mesa structure, wherein the second mesa structure, the third mesa structure, and the fourth mesa structure are between the first mesa structure and the fifth mesa structure.

5. The Schottky device of claim 4, further including a second doped region of the second conductivity type and a third concentration extending from the mesa surface of the fifth mesa structure into a first portion of the fifth mesa structure.

6. The Schottky device of claim 5, further including a second plurality of doped regions of the second conductivity type extending from the mesa surface of the fifth mesa structure into portions of the second doped region of the second conductivity type, wherein the second doped region and the second plurality of doped regions of the second conductivity type cooperate to form a second multi-concentration doped region.

7. The Schottky device of claim 5, wherein the first doped region extends into the semiconductor material to a depth that is less than a depth of the floor of the first trench in the first mesa structure.

8. The Schottky device of claim 1, further including a second mesa structure, wherein the first contact is in electrical contact with the second mesa structure.

9. The Schottky device of claim 1, further including a first silicide layer on the first multi-concentration doped region and an electrically conductive material on the the first silicide layer.

10. A Schottky device that includes a first contact that includes a plurality of types of contacts, comprising:
    a semiconductor material of a first conductivity type having first and second surfaces and a first concentration;
    a plurality of trenches extending from the first surface into the semiconductor material, wherein a first set of the plurality of trenches is configured in a geometric configuration;
    a dielectric material in the plurality of trenches;
    an electrically conductive material on the dielectric material in the plurality of trenches;
    a first doped region of a second conductivity type in a portion of the semiconductor material between a first trench and a second trench of the plurality of trenches, the first doped region of a second concentration;
    a first plurality of doped regions of the second conductivity type extending from first surface of the semiconductor material into portions of the first doped region of the second conductivity type, wherein the first doped region and the first plurality of doped regions cooperate to form a first multi-concentration doped region; and
    the first contact in contact with the first multi-concentration doped region, the semiconductor material, and the electrically conductive material on the dielectric material of the plurality of trenches.

11. The Schottky device of claim 10, wherein the geometric configuration is a hexagon.

12. The Schottky device of claim 10, wherein the plurality of trenches includes a central trench within the geometric configuration, the central trench having a floor and sidewalls, the dielectric material over the floor and sidewalls, and the electrically conductive material over the dielectric material, wherein the second trench is substantially spaced apart from the central trench by a first distance.

13. The Schottky device of claim 12, further including a second doped region of the second conductivity type and a third concentration in a portion of the semiconductor material between a third trench and a fourth trench of the plurality of trenches, the third trench substantially spaced apart from the central trench by a second distance that is the same as the first distance.

14. The Schottky device of claim 10, further including a second plurality of trenches configured in the geometric configuration and a second doped region of the second conductivity type within the geometric configuration of the second plurality of trenches.

15. A semiconductor component having a first contact that includes a Schottky contact portion, an Ohmic contact portion, and multi-concentration contact portion, comprising:
    a semiconductor material of a first conductivity type having first and second major surfaces;
    a plurality of trenches in the first major surface of the semiconductor material, wherein a first portion of the semiconductor material is between a first trench and a second trench and a second portion of the semiconductor material is between a third trench and a fourth trench of the plurality of trenches;
    a first dielectric material in the first trench of the plurality of trenches, a second dielectric material in the second trench of the plurality of trenches, a third dielectric material in the third trench of the plurality of trenches, and a fourth dielectric material in the fourth trench of the plurality of trenches;
    a first polysilicon material over the first dielectric material in the first trench of the plurality of trenches, a second polysilicon material over the second dielectric material in the second trench of the plurality of trenches, a third polysilicon material over the third dielectric material in the third trench of the plurality of trenches, and a fourth polysilicon material over the fourth dielectric material in the fourth trench of the plurality of trenches;
    a first doped region of a second conductivity type in the first portion of the semiconductor material;
    a first plurality of doped regions of the second conductivity type extending from the first major surface of the semiconductor material into portions of the first doped region, wherein the first plurality of doped regions of the second conductivity type and the first doped region cooperate to form a first multi-concentration doped region; and
    the first contact in contact, wherein the Schottky contact portion of the first contact is in contact with at least a portion of the semiconductor material adjacent the second trench, the Ohmic contact portion of the first contact is in contact with at least the first polysilicon material of the first trench, and the first multi-concentration contact portion of the first contact is in contact with first doped region and the first plurality of doped regions between the first and second trenches of the plurality of trenches.

16. The semiconductor component of claim 15, further including:
    a second doped region of a second conductivity type in the second portion of the semiconductor material; and
    a second plurality of doped regions of the second conductivity type extending from the first major surface of the semiconductor material into portions of the second doped region, wherein the second plurality of doped regions of the second conductivity type and the second doped region cooperate to form a second multi-concentration doped region.

17. The semiconductor component of claim 15, wherein the first contact comprises:
    a silicide formed from the semiconductor material, the first multi-concentration doped region, and at least the first polysilicon material of the first trench;
    and a metal disposed on the silicide.

18. The semiconductor component of claim 15, wherein the first contact comprises metal disposed on the semiconductor material, the first multi-concentration doped region, and at least the first polysilicon material of the first trench.

19. The semiconductor component of claim 15, further including a fifth trench formed in the semiconductor material, wherein the fifth trench is between the second trench and the third trench of the plurality of trenches, wherein a first distance between the fifth trench and the second trench of the plurality of trenches is substantially equal to a second distance, the second distance between the fifth trench and the third trench of the plurality of trenches.

20. The semiconductor component of claim 15, further including a second doped region of a second conductivity type in the second portion of the semiconductor.

* * * * *